(12) United States Patent
Park et al.

(10) Patent No.: US 12,545,696 B2
(45) Date of Patent: Feb. 10, 2026

(54) ORGANIC METAL COMPOUND, ORGANIC LIGHT EMITTING DIODE AND ORGANIC LIGHT EMITTING DEVICE HAVING THE COMPOUND

(71) Applicants: LG DISPLAY CO., LTD., Seoul (KR); ROHM AND HAAS ELECTRONIC MATERIALS KOREA LTD., Chungcheongnam-do (KR)

(72) Inventors: Hee-Jun Park, Paju-si (KR); Ku-Sun Choung, Paju-si (KR); Yoo-Jeong Jeong, Paju-si (KR); Sung-Jin Park, Paju-si (KR); Jae-Min Moon, Paju-si (KR); Hee-Ryong Kang, Hwaseong-si (KR); Kyoung-Jin Park, Hwaseong-si (KR); Hyun Kim, Hwaseong-si (KR); Ga-Won Lee, Hwaseong-si (KR); Seung-Hyun Yoon, Hwaseong-si (KR)

(73) Assignees: LG DISPLAY CO., LTD., Seoul (KR); DUPONT SPECIALTY MATERIALS KOREA LTD., Chungcheongnam-Do (KR)

( * ) Notice: Subject to any disclaimer, the term of this patent is extended or adjusted under 35 U.S.C. 154(b) by 770 days.

(21) Appl. No.: 17/532,787

(22) Filed: Nov. 22, 2021

(65) Prior Publication Data
US 2022/0209140 A1    Jun. 30, 2022

(30) Foreign Application Priority Data
Dec. 17, 2020    (KR) .................... 10-2020-0177156

(51) Int. Cl.
C07F 15/00    (2006.01)
C09K 11/06    (2006.01)
(Continued)

(52) U.S. Cl.
CPC .......... C07F 15/0033 (2013.01); C09K 11/06 (2013.01); H10K 85/342 (2023.02);
(Continued)

(58) Field of Classification Search
CPC .............. H10K 85/342; C07F 15/0033; C09K 2211/1044; C09K 2211/1059; C09K 2211/185
See application file for complete search history.

(56) References Cited

U.S. PATENT DOCUMENTS

| 2018/0166647 A1* | 6/2018 | Shin ................. H10K 50/16 |
| 2019/0233451 A1 | 8/2019 | Ji et al. |
| 2022/0069237 A1 | 3/2022 | Kwon et al. |

FOREIGN PATENT DOCUMENTS

| CN | 110790796 A | 2/2020 |
| CN | 114106051 A | 3/2022 |

(Continued)

OTHER PUBLICATIONS

Extended European Search Report dated Apr. 29, 2022, issued in corresponding European Patent Application No. 21206887.8.
(Continued)

*Primary Examiner* — Jenna N Chandhok
(74) *Attorney, Agent, or Firm* — Morgan, Lewis & Bockius LLP

(57) ABSTRACT

The present disclosure relates to an organic metal compound having the following structure of Formula 1, an organic light emitting diode (OLED) and an organic light emitting device that includes the organic metal compound. The OLED and the organic light emitting device including the organic metal compound can improve their luminous efficiency, luminous color purity and lifespan.

$Ir(L_A)_m(L_B)_n$    [Formula 1]

6 Claims, 6 Drawing Sheets

(51) Int. Cl.
    *H10K 50/11*           (2023.01)
    *H10K 50/19*           (2023.01)
    *H10K 59/12*           (2023.01)
    *H10K 85/30*           (2023.01)
    *H10K 101/10*         (2023.01)

(52) U.S. Cl.
    CPC .. *C07B 2200/05* (2013.01); *C09K 2211/1044* (2013.01); *C09K 2211/1059* (2013.01); *C09K 2211/185* (2013.01); *H10K 50/11* (2023.02); *H10K 50/19* (2023.02); *H10K 59/12* (2023.02); *H10K 2101/10* (2023.02)

(56)     References Cited

FOREIGN PATENT DOCUMENTS

| | | |
|---|---|---|
| EP | 3569605 A1 | 11/2019 |
| KR | 10-2019-0091415 A | 8/2019 |
| KR | 10-2022-0028945 A | 3/2022 |

OTHER PUBLICATIONS

Partial Translation First Office Action Report dated Nov. 13, 2023, issued in China Patent Application No. 202111485168.2 Note: CN110790796 and EP3569605 cited therein is already of record.
Office Action dated Aug. 25, 2025 issued in corresponding Korean Patent Application No. 10-2020-0177156.

\* cited by examiner

ORGANIC METAL COMPOUND, ORGANIC LIGHT EMITTING DIODE AND ORGANIC LIGHT EMITTING DEVICE HAVING THE COMPOUND

CROSS-REFERENCE TO RELATED APPLICATIONS

This application claims the priority benefit under 35 U.S.C. § 119 (a) of Korean Patent Application No. 10-2020-0177156, filed in the Republic of Korea on Dec. 17, 2020, which is expressly incorporated hereby in its entirety into the present application.

BACKGROUND

Technical Field

The present disclosure relates to an organic metal compound, and more specifically, to an organic metal compound having excellent luminous efficiency and luminous lifespan, an organic light emitting diode and an organic light emitting device including the organic metal compound.

Discussion of the Related Art

An organic light emitting diode (OLED) among a flat display device used widely has come into the spotlight as a display device replacing rapidly a liquid crystal display device (LCD). The OLED can be formed as a thin organic film less than 2000 Å and can implement unidirectional or bidirectional images by electrode configurations. Also, the OLED can be formed even on a flexible transparent substrate such as a plastic substrate so that a flexible or a foldable display device can be realized with ease using the OLED. In addition, the OLED can be driven at a lower voltage and the OLED has excellent high color purity compared to the LCD.

Since fluorescent material uses only singlet exciton energy in the luminous process, the related art fluorescent material shows low luminous efficiency. On the contrary, phosphorescent material can show high luminous efficiency since it uses triplet exciton energy as well as singlet exciton energy in the luminous process. However, metal complex, representative phosphorescent material, has short luminous lifespan for commercial use. Therefore, there remains a need to develop a new compound that can enhance luminous efficiency and luminous lifespan.

SUMMARY

Accordingly, embodiments of the present disclosure are directed to an organic light emitting device that substantially obviates one or more of the problems due to the limitations and disadvantages of the related art.

An aspect of the present disclosure is to provide an organic metal compound having excellent luminous efficiency and luminous lifespan, an organic light emitting diode and an organic light emitting device including the compound.

Additional features and aspects will be set forth in the description that follows, and in part will be apparent from the description, or can be learned by practice of the inventive concepts provided herein. Other features and aspects of the inventive concept can be realized and attained by the structure particularly pointed out in the written description, or derivable therefrom, and the claims hereof as well as the appended drawings.

To achieve these and other aspects of the inventive concepts, as embodied and broadly described, in one aspect, the present disclosure provides an organic metal compound having the following structure of Formula 1:

$$Ir(L_A)_m(L_B)_n \qquad \text{[Formula 1]}$$

wherein $L_A$ has the following structure of Formula 2; $L_B$ is an auxiliary ligand having the following structure of Formula 3; m is an integer of 1 to 3 and n is an integer of 0 to 2, wherein m+n is 3;

[Formula 2]

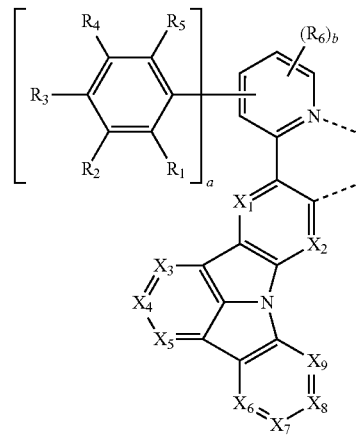

wherein, in Formula 2,
each of $X_1$ and $X_2$ is independently $CR_7$ or N;
each of $X_3$ to $X_5$ is independently $CR_8$ or N and at least one of $X_3$ to $X_5$ is $CR_8$;
each of $X_6$ to $X_9$ is independently is $CR_9$ or N and at least one of $X_6$ to $X_9$ is $CR_9$;
each of $R_1$ to $R_9$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, optionally,
two adjacent elements among $R_1$ to $R_5$, and/or
two adjacent carbons to which $R_6$ is attached when b is an integer 2 or more, and/or
two adjacent carbons to which $R_8$ is attached, and/or
two adjacent carbons to which $R_9$ is attached
form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;
a is an integer of 0 to 2;
b is an integer of 0 to 4; and
a+b is no more than 4;

[Formula 3]

In another aspect, the present disclosure provides an organic light emitting diode comprises a first electrode; a second electrode facing the first electrode; and an emissive layer disposed between the first and second electrodes and including at least one emitting material layer, wherein the at least one emitting material layer includes the organic metal compound.

As an example, the organic metal compound may be comprised as dopant in the at least one emitting material layer.

The emissive layer may have single emitting part or multiple emitting parts to form a tandem structure.

In still another aspect, the present disclosure provides an organic light emitting device, for example, an organic light emitting display device or an organic light emitting illumination device, comprises a substrate and the organic light emitting diode over the substrate.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Figure 1:
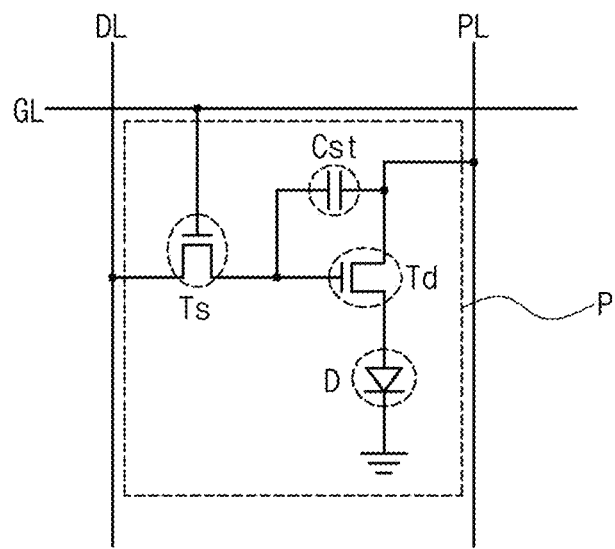
FIG. 1 is a schematic circuit diagram illustrating an organic light emitting display device in accordance with the present disclosure.

Reference will now be made in detail to aspects of the disclosure, examples of which are illustrated in the accompanying drawings.

[Organic Metal Compound]

Luminous material in an organic light emitting diode should have excellent luminous efficiency and luminous lifespan. An organic metal compound in accordance with the present disclosure has a rigid chemical conformation so that it has excellent luminous efficiency and luminous lifespan. The organic metal compound of the present disclosure may have the following structure of Formula 1:

$$Ir(L_A)_m(L_B)_n \quad \text{[Formula 1]}$$

wherein $L_A$ has the following structure of Formula 2; $L_B$ is an auxiliary ligand having the following structure of Formula 3; m is an integer of 1 to 3 and n is an integer of 0 to 2, wherein m+n is 3;

[Formula 2]

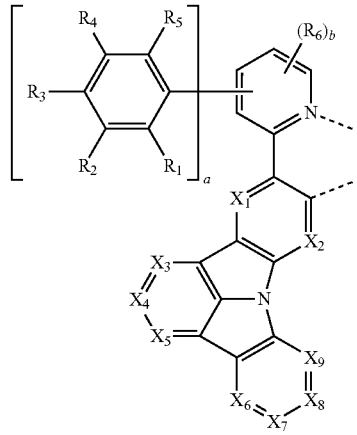

Wherein, in Formula 2, each of $X_1$ and $X_2$ is independently $CR_7$ or N;

each of $X_3$ to $X_5$ is independently $CR_8$ or N and at least one of $X_3$ to $X_5$ is $CR_8$;

each of $X_6$ to $X_9$ is independently is $CR_9$ or N and at least one of $X_6$ to $X_9$ is $CR_9$;

each of $R_1$ to $R_5$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, optionally, two adjacent elements among $R_1$ to $R_5$, and/or two adjacent carbons to which $R_6$ is attached when b is an integer 2 or more, and/or $X_3$ and $X_4$ or $X_4$ and $X_5$, and/or $X_6$ and $X_7$, or $X_7$ and $X_8$, or $X_8$ and $X_9$ form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

a is an integer of 0 to 2;

b is an integer of 0 to 4; and a+b is no more than 4,

[Formula 3]

As used herein, the term "unsubstituted" means that hydrogen is linked, and in this case, hydrogen comprises protium, deuterium and tritium.

As used herein, substituent in the term "substituted" comprises, but is not limited to, unsubstituted or deuterium or halogen-substituted $C_1$-$C_{20}$ alkyl, unsubstituted or deuterium or halogen-substituted $C_1$-$C_{20}$ alkoxy, halogen, cyano, —$CF_3$, a hydroxyl group, a carboxylic group, a carbonyl group, an amino group, a $C_1$-$C_{10}$ alkyl amino group, a $C_6$-$C_{30}$ aryl amino group, a $C_3$-$C_{30}$ hetero aryl amino group, a $C_6$-$C_{30}$ aryl group, a $C_3$-$C_{30}$ hetero aryl group, a nitro group, a hydrazyl group, a sulfonate group, a $C_1$-$C_{20}$ alkyl silyl group, a $C_6$-$C_{30}$ aryl silyl group and a $C_3$-$C_{30}$ hetero aryl silyl group.

As used herein, the term "alkyl" refers to a branched or unbranched saturated hydrocarbon group of 1 to 20 carbon atoms, such as methyl, ethyl, 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, and the like.

As used herein, the term "alkenyl" is a hydrocarbon group of 2 to 20 carbon atoms containing at least one carbon-carbon double bond. The alkenyl group can be substituted with one or more substituents.

As used herein, the term "alicyclic" or "cycloalkyl" refers to non-aromatic carbon-based ring composed of at least three carbon atoms. Examples of alicyclic groups include, but are not limited to, cyclopropyl, cyclobutyl, cyclopentyl, cyclohexyl, norbornyl, and the like. The alicyclic group can be substituted with one or more substituents.

As used herein, the term "alkoxy" refers to an branched or unbranched alkyl bonded through an ether linkage represented by the formula —O(-alkyl) where alkyl is defined herein. Examples of alkoxy include methoxy, ethoxy, n-propoxy, isopropoxy, butoxy, and tert-butoxy, and the like.

As used herein, the term "alkyl amino" refers to a group represented by the formula —NH(-alkyl) or —N(-alkyl)$_2$ where alkyl is defined herein. Examples of alkyl amino represented by the formula —NH(-alkyl) include, but not limited to, methylamino group, ethylamino group, propylamino group, isopropylamino group, butylamino group, isobutylamino group, (sec-butyl)amino group, (tert-butyl) amino group, pentylamino group, isopentylamino group, (tert-pentyl)amino group, hexylamino group, and the like. Examples of alkyl amino represented by the formula —N(-alkyl)$_2$ include, but not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl) amino group, dihexylamino group, N-ethyl-N-methylamino group, N-methyl-N-propylamino group, N ethyl-N-propylamino group and the like.

As used herein, the term "aromatic" or "aryl" is well known in the art. The term includes monocyclic rings linked covalently or fused-ring polycyclic groups. An aromatic group can be unsubstituted or substituted. Examples of aromatic or aryl include phenyl, 1-naphthyl, 2-naphthyl, 4-biphenyl, anthracenyl, and phenanthracenyl and the like. Substituents for each of the above noted aryl ring systems are acceptable substituents are defined herein.

As used herein, the term "alkyl silyl group" refers to any linear or branched, saturated or unsaturated acyclic or acyclic alkyl, and the alkyl has 1 to 20 carbon atoms. Examples of the alkyl silyl group include a trimethylsilyl group, a trimethylsilyl group, a t-butyldimethylsilyl group, a vinyldimethylsilyl group, a propyldimethylsilyl group, a triphenylsilyl group, a diphenylsilyl group, and a phenylsilyl group.

As used herein, the term "halogen" refers to fluorine, chlorine, bromine or iodine atom.

As used herein, the term "hetero" in such as "hetero alkyl", "hetero alkenyl", "a hetero alicyclic group", "a hetero aromatic group", "a hetero cycloalkylene group", "a hetero arylene group", "a hetero aryl alkylene group", "a hetero aryl oxylene group", "a hetero cycloalkyl group", "a hetero aryl group", "a hetero aryl alkyl group", "a hetero aryloxyl group", "a hetero aryl amino group" means that at least one carbon atom, for example 1-5 carbons atoms, constituting an aliphatic chain, an alicyclic group or ring or an aromatic group or ring is substituted with at least one hetero atom selected from the group consisting of N, O, S, P and combination thereof.

As used herein, the term "hetero aromatic" or "hetero aryl" refers to a heterocycles including hetero atoms selected from N, O and S in a ring where the ring system is an aromatic ring. The term includes monocyclic rings linked covalently or fused-ring polycyclic groups. A hetero aromatic group can be unsubstituted or substituted. Examples of hetero aromatic or hetero aryl include pyridyl, pyrrolyl, pyrazinyl, pyrimidinyl, thienyl (alternatively referred to as thiophenyl), thiazolyl, furanyl, imidazolyl, pyrazolyl, triazolyl, tetrazolyl, oxazolyl, oxadiazolyl, thiazolyl, and thiadiazolyl.

As used herein, the term "hetero aryl oxy" refers to a group represented by the formula —O-(hetero aryl) where hetero aryl is defined herein.

In one exemplary aspect, when each of $R_1$ to $R_9$ in Formula 2 is independently a $C_6$-$C_{30}$ aromatic group, each of $R_1$ to $R_9$ is independently may be, but is not limited to, a $C_6$-$C_{30}$ aryl group, a $C_7$-$C_{30}$ aryl alkyl group, a $C_6$-$C_{30}$ aryl oxy group and a $C_6$-$C_{30}$ aryl amino group. As an example, when each of $R_1$ to $R_9$ is independently a $C_6$-$C_{30}$ aryl group, each of $R_1$ to $R_9$ may independently comprise, but is not limited to, an unfused or fused aryl group such as phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl and spiro-fluorenyl. The unfused or fused aryl group may be substituted or unsubstituted. In some embodiments, adjacent two among $R_1$ to $R_5$ or adjacent two among $R_7$ to $R_9$ form unfused or fused aryl group may be substituted or unsubstituted.

Alternatively, when each of $R_1$ to $R_9$ in Formula 2 is independently a $C_3$-$C_{30}$ aromatic group, each of $R_1$ to $R_9$ is independently may be, but is not limited to, a $C_3$-$C_{30}$ hetero aryl group, a $C_4$-$C_{30}$ hetero aryl alkyl group, a $C_3$-$C_{30}$ hetero aryl oxy group and a $C_3$-$C_{30}$ hetero aryl amino group. As an example, when each of $R_1$ to $R_9$ is independently a $C_3$-$C_{30}$ hetero aryl group, each of $R_1$ to $R_9$ may independently comprise, but is not limited to, an unfused or fused hetero aryl group such as pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthalzinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, pteridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thioazinyl, thiophenyl, benzo-thiophenyl, dibenzo-thiophenyl, difuro-pyrazinyl, benzo-furo-dibenzo-furanyl, benzothieno-benzo-thiophenyl, benzothieno-dibenzo-thiophenyl, benzothieno-benzo-furanyl, benzothieno-dibenzo-furanyl, xanthene-linked spiro acridinyl, dihydroacridinyl substituted with at least one $C_1$-$C_{10}$ alkyl and N-substituted spiro fluorenyl. The unfused or fused aryl group may be substituted or unsubstituted.

As an example, each of the aromatic group or the hetero aromatic group of $R_1$ to $R_9$ may consist of one to three aromatic or hetero aromatic rings. When the number of the aromatic or hetero aromatic rings of $R_1$ to $R_9$ becomes more than four, conjugated structure among the within the whole molecule becomes too long, thus, the organic metal compound may have too narrow energy bandgap. For example, each of the aryl group or the hetero aryl group of $R_1$ to $R_9$ may comprise independently, but is not limited to, phenyl, biphenyl, naphthyl, anthracenyl, pyrrolyl, triazinyl, imidazolyl, pyrazolyl, pyridinyl, pyrazinyl, pyrimidinyl, pyridazinyl, furanyl, benzo-furanyl, dibenzo-furanyl, thiophenyl, benzo-thiophenyl, dibenzo-thiophenyl, carbazolyl, acridinyl, carbolinyl, phenazinyl, phenoxazinyl and/or phenothiazinyl.

In one exemplary aspect, each of the alkyl, the hetero alkyl, the alkenyl, the hetero alkenyl, the alkoxy, the alkyl amino, the alkyl silyl, the alicyclic group, the hetero alicyclic group, the aromatic group and the hetero aromatic group of $R_1$ to $R_9$ may be independently unsubstituted or substituted with at least one of halogen, $C_1$-$C_{10}$ alkyl, a $C_4$-$C_{20}$ alicyclic group, a $C_3$-$C_{20}$ hetero alicyclic group, a $C_6$-$C_{20}$ aromatic group and a $C_3$-$C_{20}$ hetero aromatic group. In addition, each of the $C_4$-$C_{20}$ alicyclic ring, the $C_3$-$C_{20}$ hetero alicyclic ring, the $C_6$-$C_{30}$ aromatic ring and the $C_3$-$C_{30}$ hetero aromatic ring formed by adjacent two of $R_1$ to $R_6$, adjacent two of $R_8$, or adjacent two of $R_9$ may be independently unsubstituted or substituted with at least one $C_1$-$C_{10}$ alkyl group.

Alternatively, adjacent two of $R_1$ to $R_6$, $R_8$ and $R_9$ may form an unsubstituted or substituted $C_4$-$C_{30}$ alicyclic ring (e.g., a $C_5$-$C_{10}$ alicyclic ring), an unsubstituted or substituted $C_3$-$C_{30}$ hetero alicyclic ring (e.g. a $C_3$-$C_{10}$ hetero alicyclic ring), an unsubstituted or substituted $C_6$-$C_{30}$ aromatic ring (e.g. a $C_6$-$C_{20}$ aromatic ring) or an unsubstituted or substituted $C_3$-$C_{30}$ hetero aromatic ring (e.g. a $C_3$-$C_{20}$ hetero aromatic ring). The alicyclic ring, the hetero alicyclic ring, the aromatic ring and the hetero aromatic ring formed by adjacent two of $R_1$ to $R_6$, $R_8$ and Ry are not limited to specific rings. For example, the aromatic ring or the hetero aromatic ring formed by those groups may comprise, but is not limited to, a benzene ring, a pyridine ring, an indole ring, a pyran ring, a fluorene ring unsubstituted or substituted with at least one $C_1$-$C_{10}$ alkyl group. In some embodiments, the aromatic ring or the hetero aromatic ring formed by two adjacent elements among $R_1$ to $R_6$, two adjacent carbons to which $R_8$ is attached or two adjacent carbons to which $R_9$ is attached may form an unsubstituted or substituted fused aromatic or heteroaromatic ring. The definitions of the fused aromatic ring and the fused heteroaromatic ring are the same as mentioned above.

The organic metal compound having the structure of Formula 1 has a hetero aromatic ligand consisting of at least 5 rings. Since the organic metal compound has a rigid chemical conformation, so that its conformation is not rotated in the luminous process, therefore, and it can maintain good luminous lifespan. The organic metal compound has specific ranges of photoluminescence emissions, so that its color purity can be improved.

In one exemplary aspect, each of m and n in Formula 1 may be 1 or 2. When the organic metal compound is a heteroleptic metal complex including two different bidentate ligands coordinated to the central metal atom, the photoluminescence color purity and emission colors of the organic metal compound can be controlled with ease by combining two different bidentate ligands. In addition, it is possible to control the color purity and emission peaks of the organic metal compound by introducing various substituents to each of the ligands. Alternatively, m may be 3 and n may be 0 in Formula 1. As an example, the organic metal compound having the structure of Formula 1 emits green color and can improve luminous efficiency of an organic light emitting diode.

As an example, $X_1$ is $CR_7$, $X_2$ is $CR_7$ or N, each of $X_3$ to $X_5$ is independently $CR_8$ and each of $X_6$ to $X_9$ is independently $CR_9$ in Formula 2. That is, each of $X_1$ and $X_3$ to $X_9$ may be independently an unsubstituted or substituted carbon atom.

In one exemplary aspect, the phenyl group in Formula 2 may be substituted to a meta position of the pyridine ring coordinated to the metal atom and each of $X_1$ and $X_3$ to $X_9$ in Formula 2 may be independently an unsubstituted or substituted carbon atom. Such $L_A$ may have the following structure of Formula 4A or Formula 4B:

[Formula 4A]

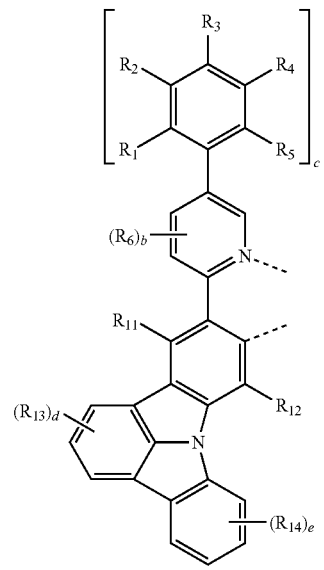

[Formula 4B]

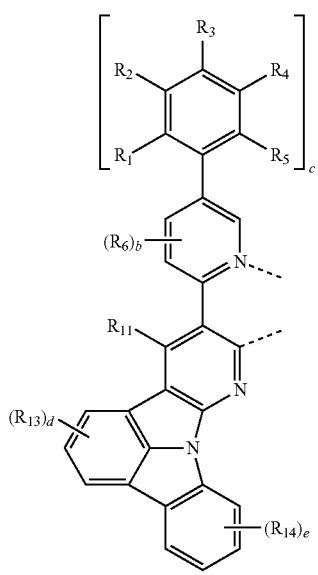

[Formula 4C]

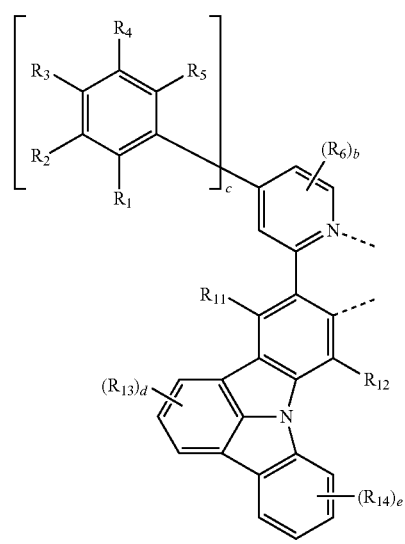

[Formula 4D]

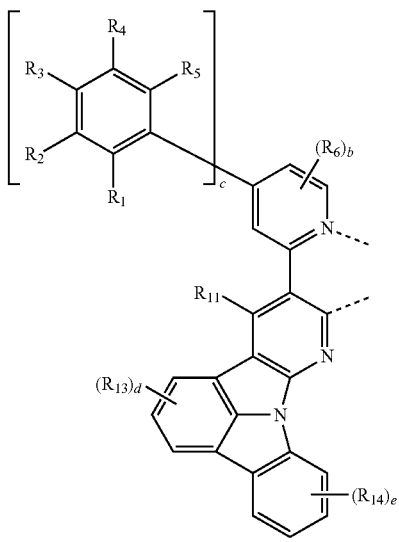

wherein, in Formulae 4A and 4B, each of $R_1$ to $R_6$ and b is a same as defined in Formula 2;

each of $R_{11}$ to $R_{14}$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent carbons to which $R_{13}$ is attached when d an integer of 2 or more, and/or two adjacent carbons tow which $R_{14}$ is attached when e is an integer of 2 or more form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring when each of d and e is an integer of two or more;

c is an integer of 0 or 1 d is an integer of 0 to 3; and e is an integer of 0 to 4.

In another exemplary aspect, the phenyl group in Formula 2 may be substituted to a para position of the pyridine ring coordinated to the metal atom and each of $X_1$ and $X_3$ to $X_9$ in Formula 2 may be independently an unsubstituted or substituted carbon atom. Such $L_A$ may have the following structure of Formula 4C or Formula 4D:

Wherein, in Formulae 4C and 4D, each of $R_1$ to $R_6$ and b is a same as defined in Formula 2;

each of $R_{11}$ to $R_{14}$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent carbons to which $R_{13}$ is attached when d an integer of 2 or more, and/or two adjacent carbons to which $R_{14}$ is attached when e is an integer of 2 or more form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

c is an integer of 0 or 1;

d is an integer of 0 to 3; and e is an integer of 0 to 4.

In one exemplary aspect, each of the alkyl, the hetero alkyl, the alkenyl, the hetero alkenyl, the alkoxy, the alkyl amino, the alkyl silyl, the alicyclic group, the hetero alicyclic group, the aromatic group and the hetero aromatic group of $R_1$ to $R_6$ and $R_{11}$ to $R_{14}$ in Formulae 4A to 4D may be independently unsubstituted or substituted with at least one of deuterium, tritium, halogen, $C_1$-$C_{10}$ alkyl, a $C_4$-$C_{20}$ alicyclic group, a $C_3$-$C_{20}$ hetero alicyclic group, a $C_6$-$C_{20}$ aromatic group and a $C_3$-$C_{20}$ hetero aromatic group. In addition, each of the $C_4$-$C_{20}$ alicyclic ring, the $C_3$-$C_{20}$ hetero alicyclic ring, the $C_6$-$C_{30}$ aromatic ring and the $C_3$-$C_{30}$ hetero aromatic ring formed by adjacent two of $R_1$ to $R_6$, $R_{13}$ and $R_{14}$ in Formulae 4A to 4D may be independently unsubstituted or substituted with at least one $C_1$-$C_{10}$ alkyl group.

In still another exemplary aspect, $L_B$ as the auxiliary ligand may be a phenyl-pyridino-based ligand or an acetylacetonate-based ligand. As an example, $L_B$ may have, but is not limited to, the following structure of Formula 5A or Formula 5B:

[Formula 5A]

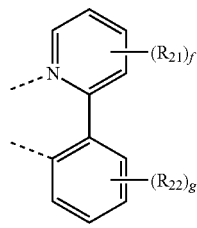

[Formula 5B]

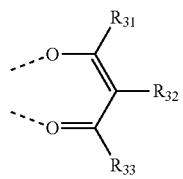

wherein, each of $R_{21}$, $R_{22}$ and $R_{31}$ to $R_{33}$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, optionally, two adjacent carbons to which $R_{21}$ is attached when f is an integer of 2 or more, and/or two adjacent carbons to which $R_{22}$ is attached when g is an integer of 2 or more, and/or $R_{31}$ and $R_{32}$ or $R_{32}$ and $R_{33}$ form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

each of f and g is an integer of 0 to 4.

The substituents of $R_{21}$ to $R_{22}$ and $R_{31}$ to $R_{33}$ or the ring formed by $R_{21}$ to $R_{22}$ and $R_{31}$ to $R_{33}$ may be identical to the substituents or the ring as described in Formula 2. In one exemplary aspect, the organic metal compound having the structure of Formulae 1 to 5B may be selected from, but is not limited to, the following organic metal compounds of Formula 6:

[Formula 6]

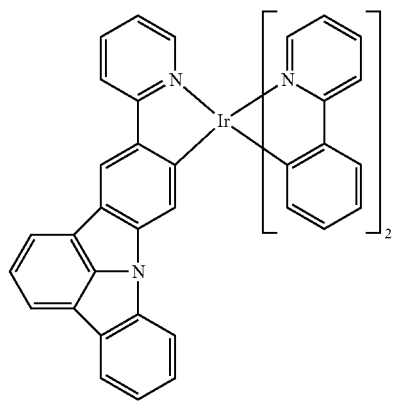

1

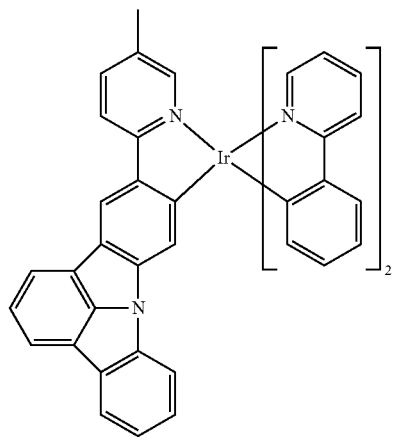

2

3
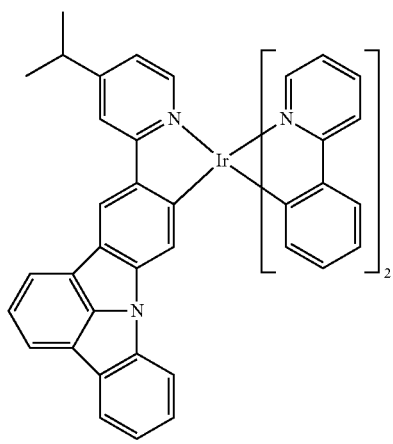
4
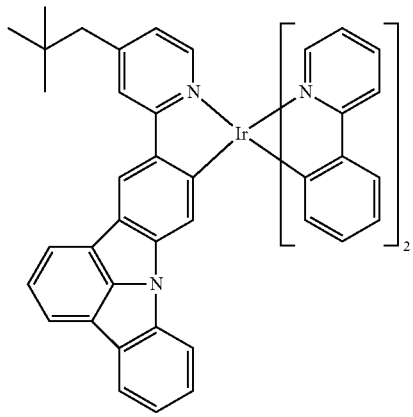
5
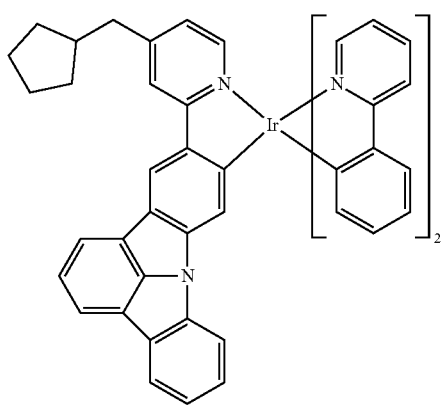
6
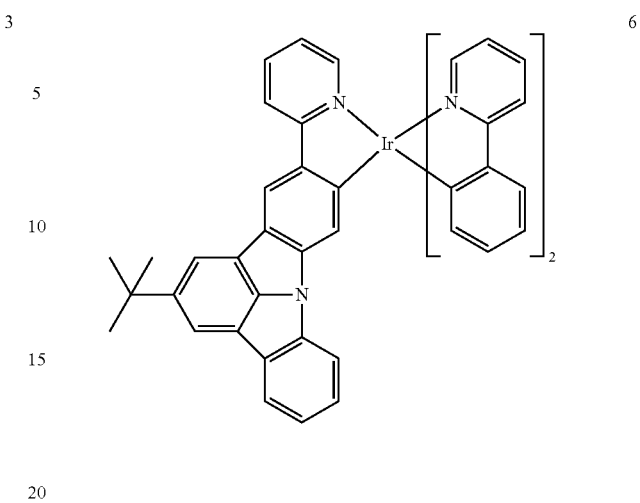
7
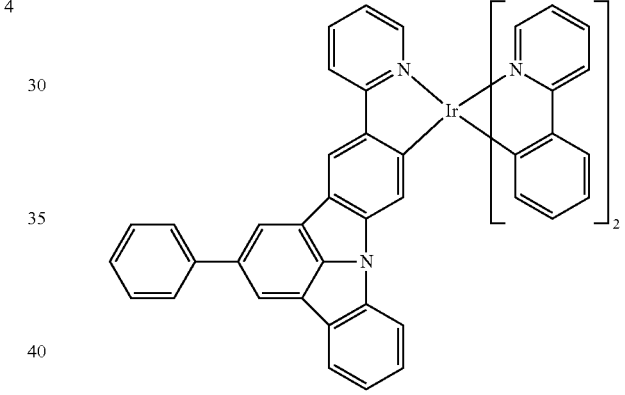
8
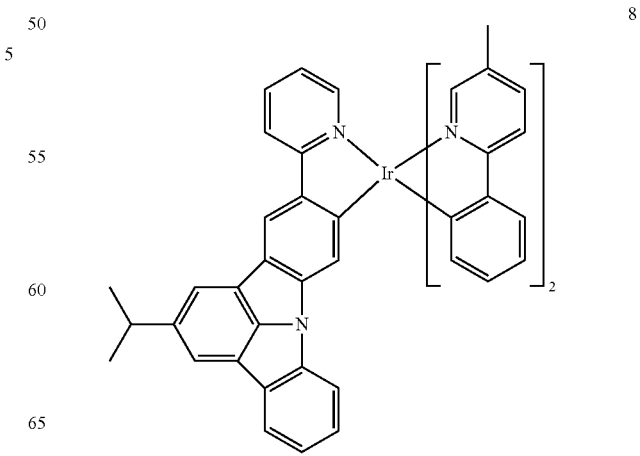

9
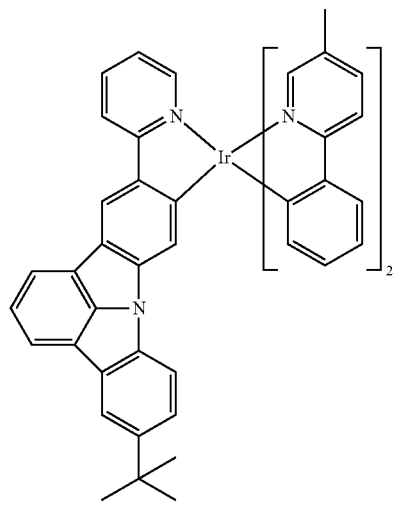
10
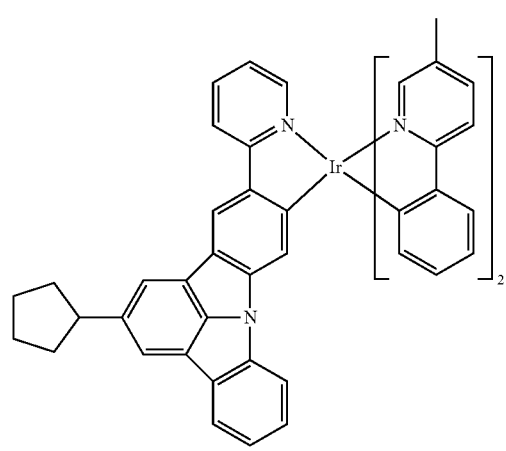
11
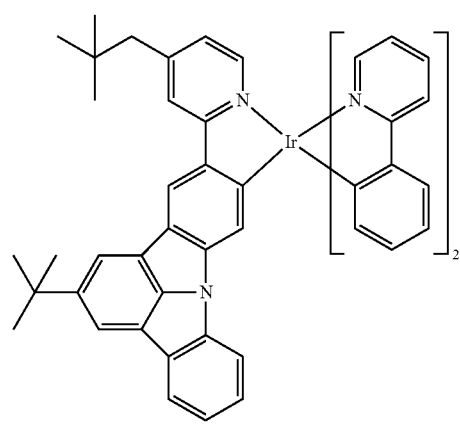
12
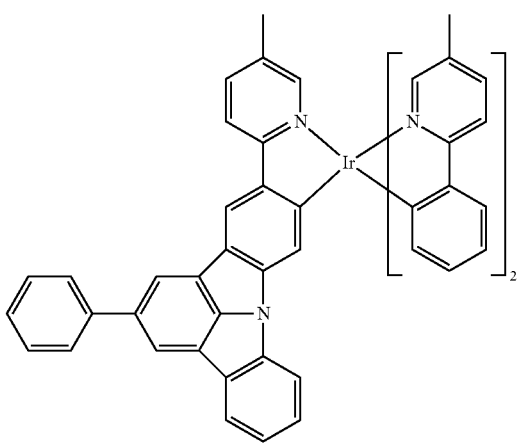
13
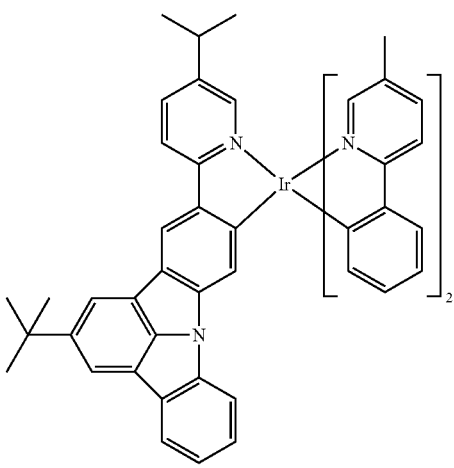
14
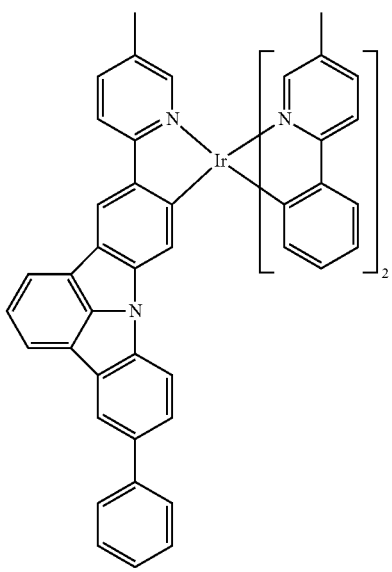

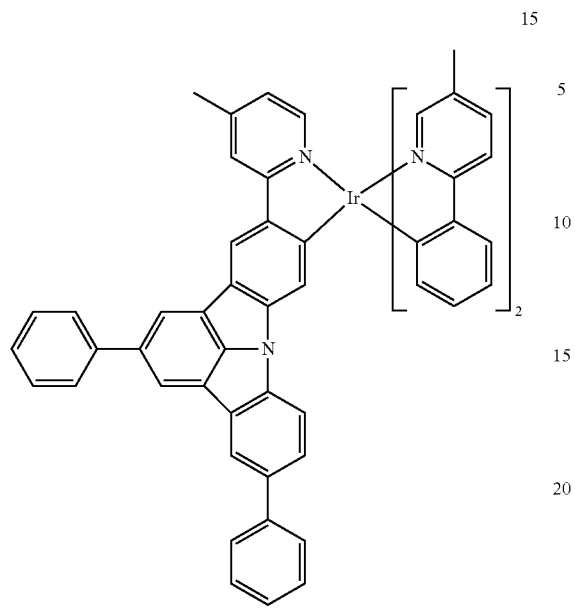
15
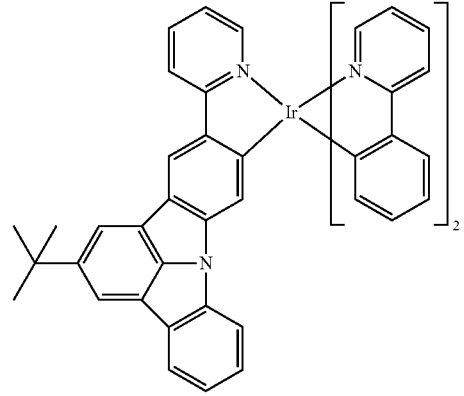
18
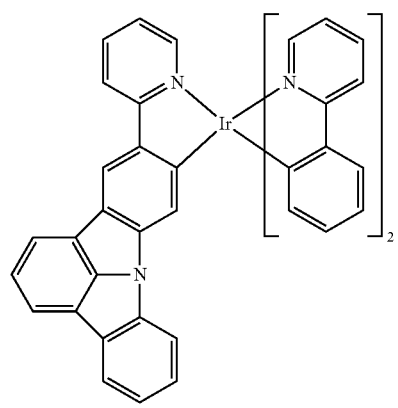
16
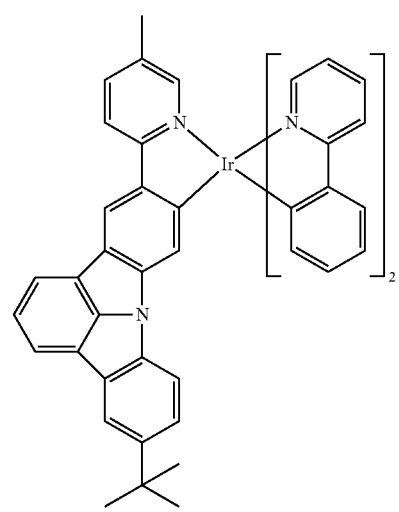
19
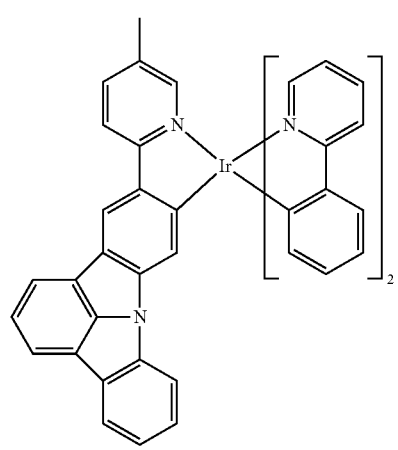
17
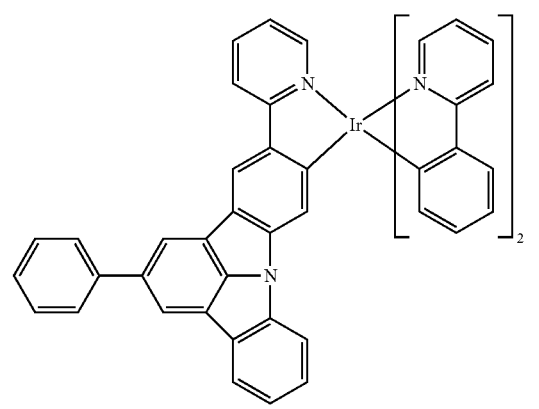
20

21
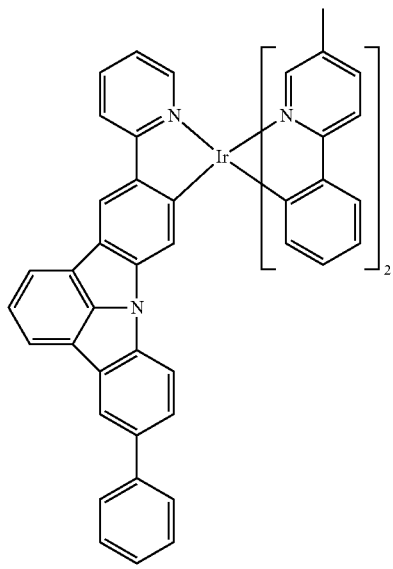
22
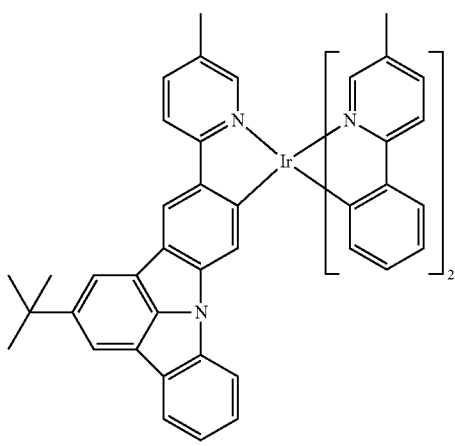
23
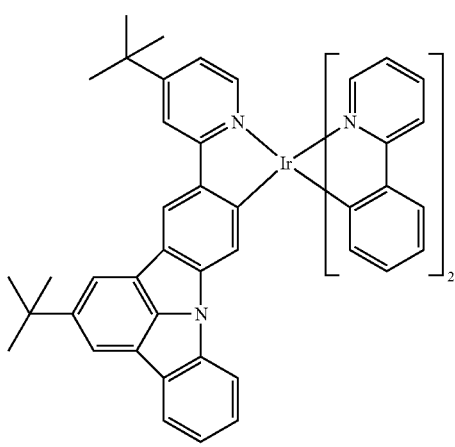
24
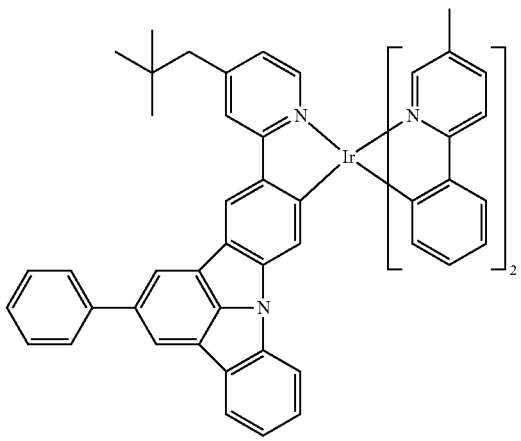
25
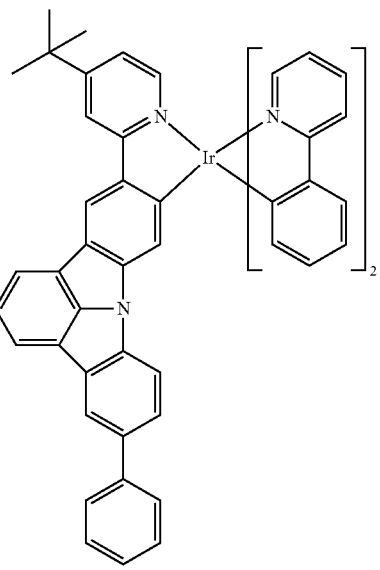
26
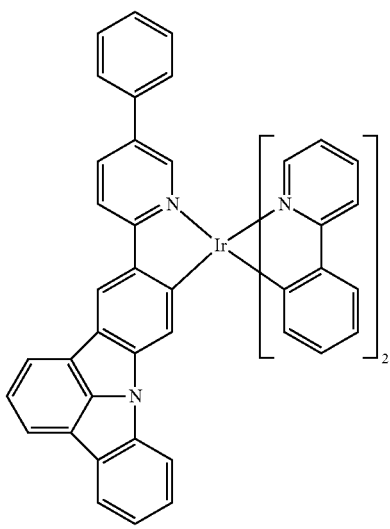

27
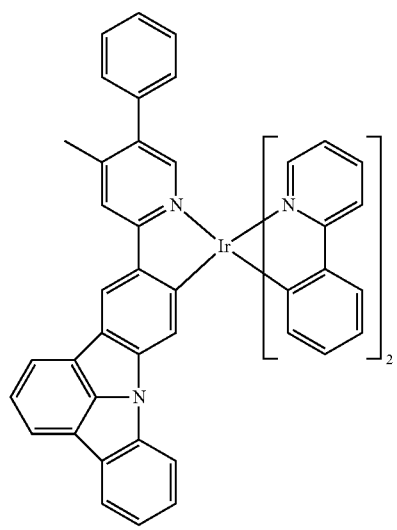
28
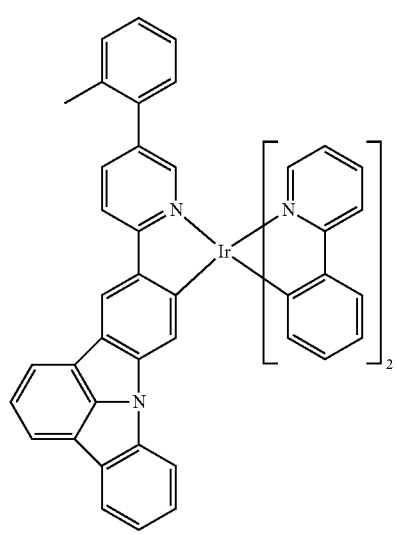
29
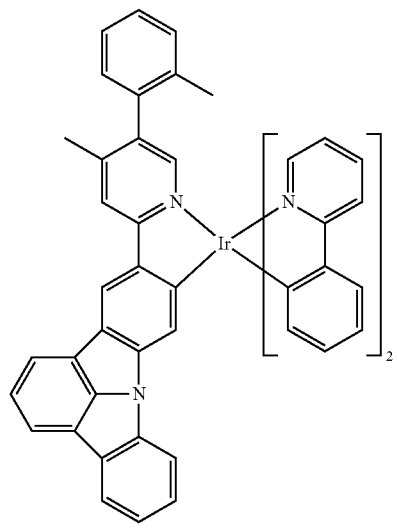
30
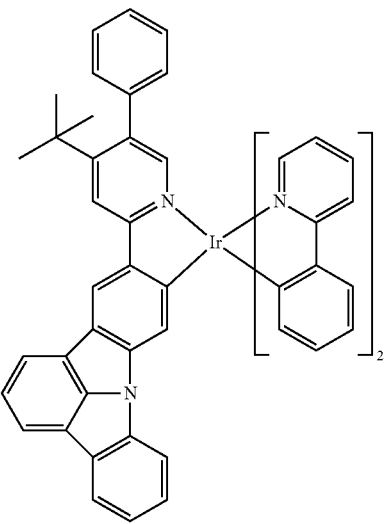
31
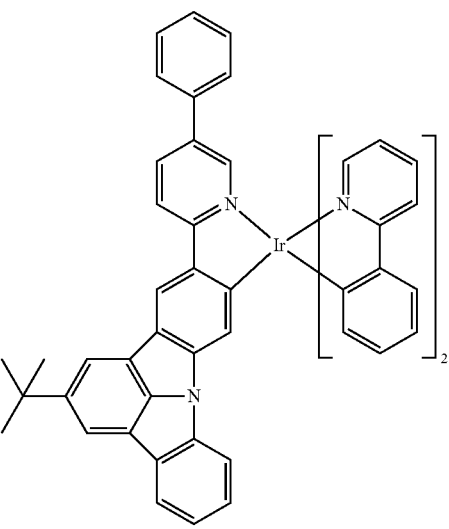
32
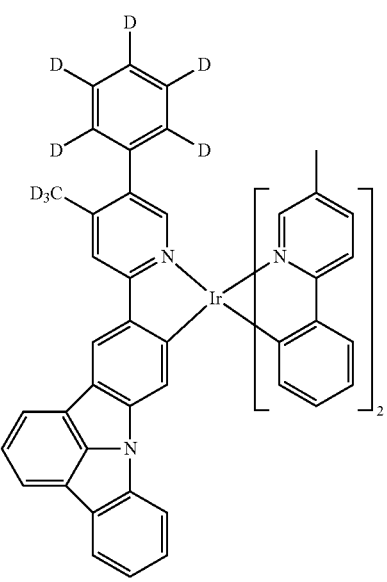

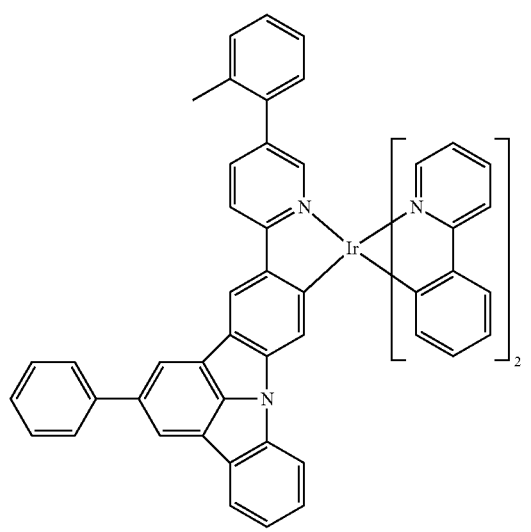
33
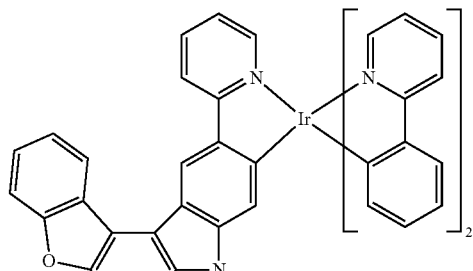
36
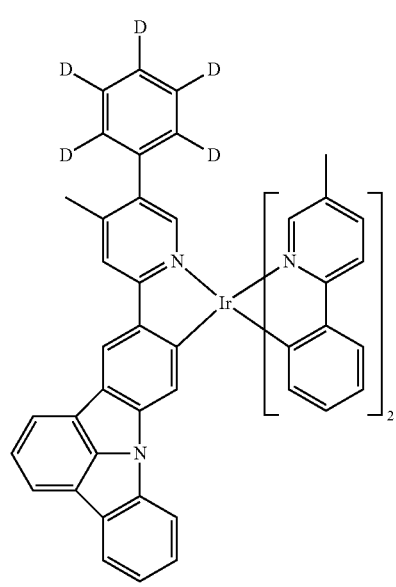
34
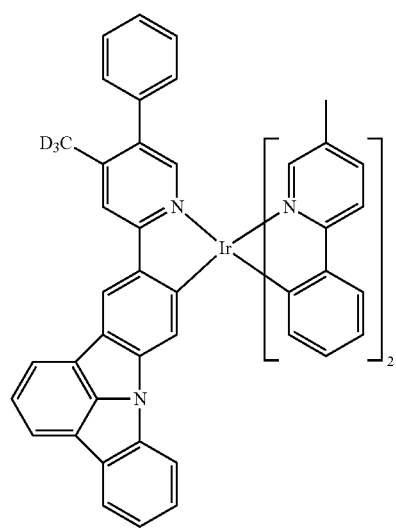
35
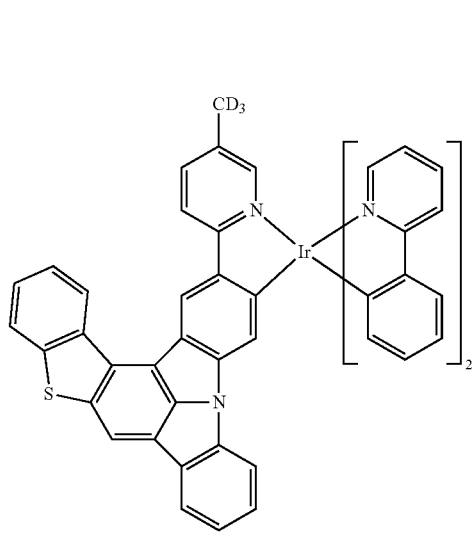
37
38

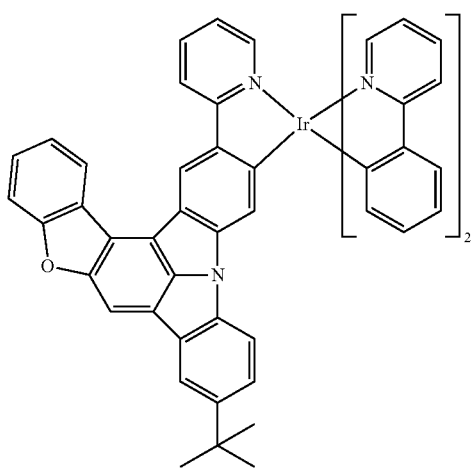
39
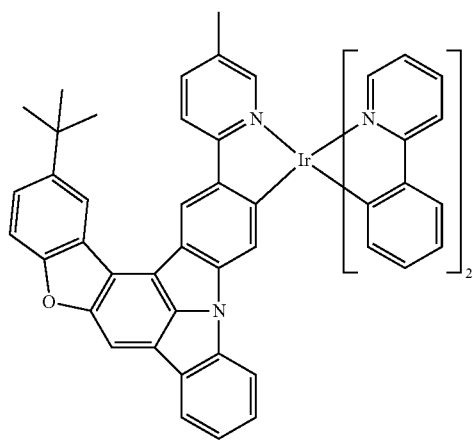
42
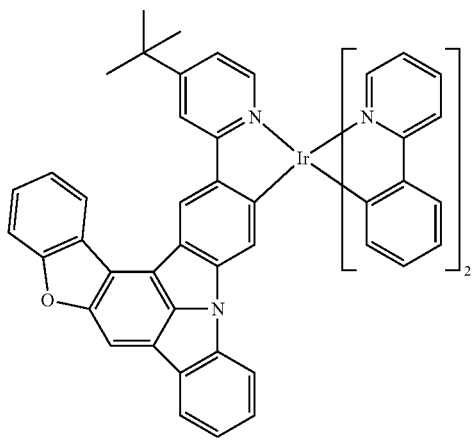
40
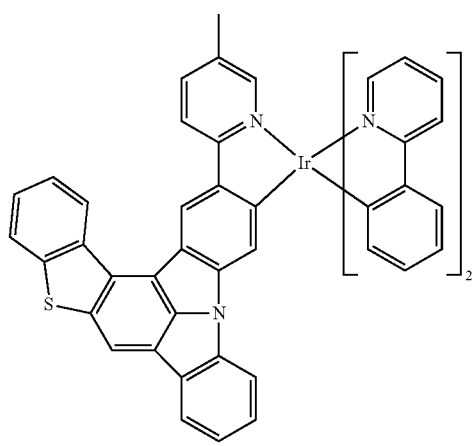
43
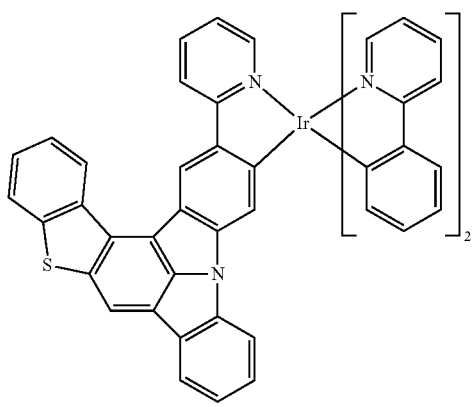
41
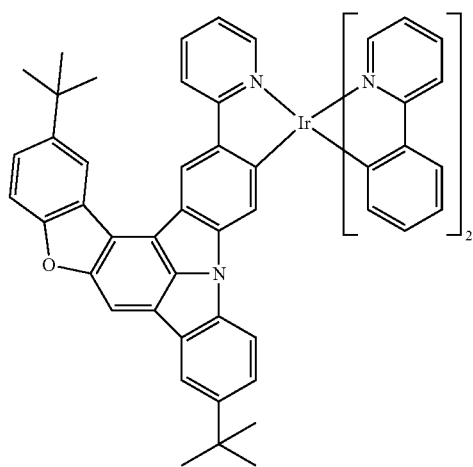
44

45
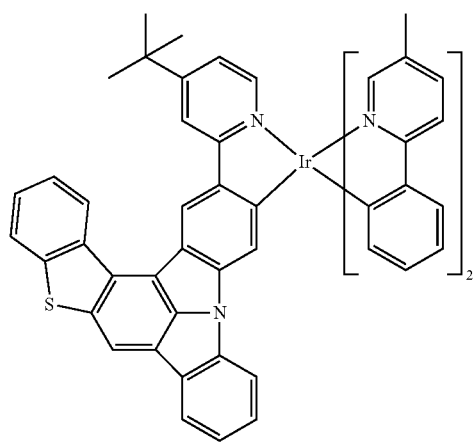
46
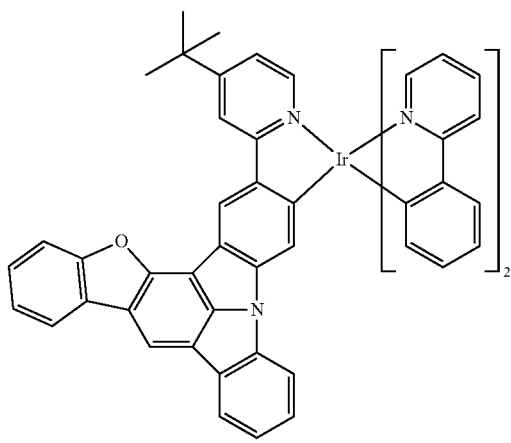
48
49
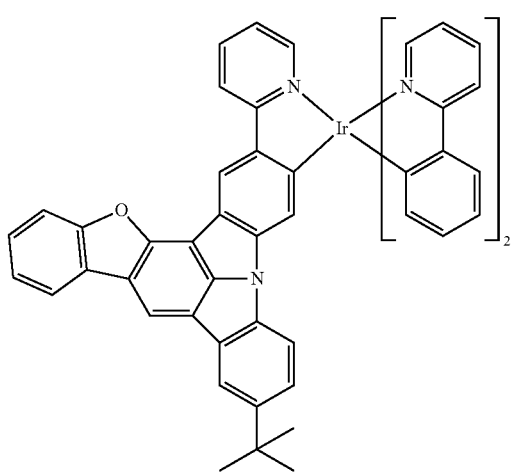
47
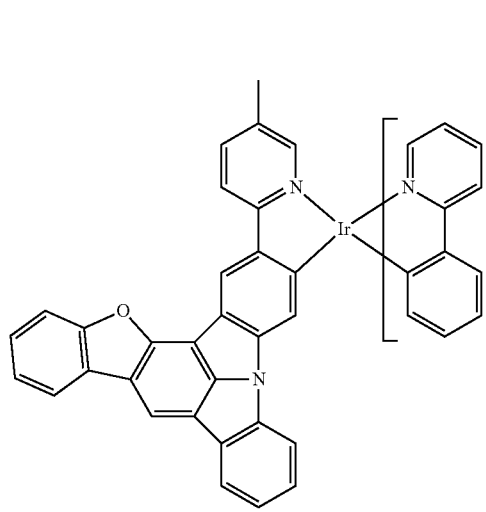
50
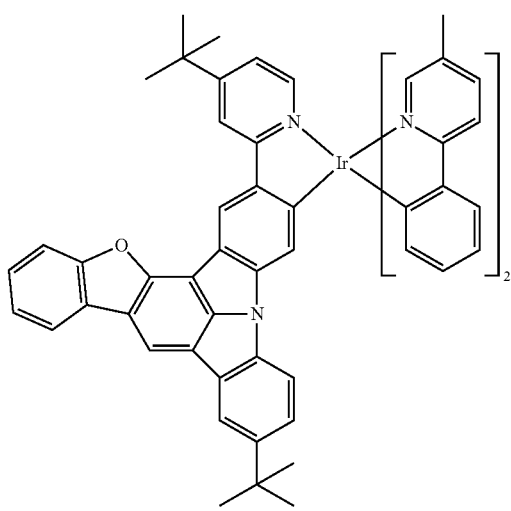

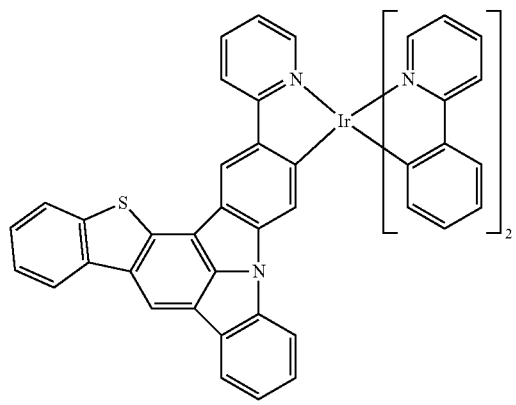
51
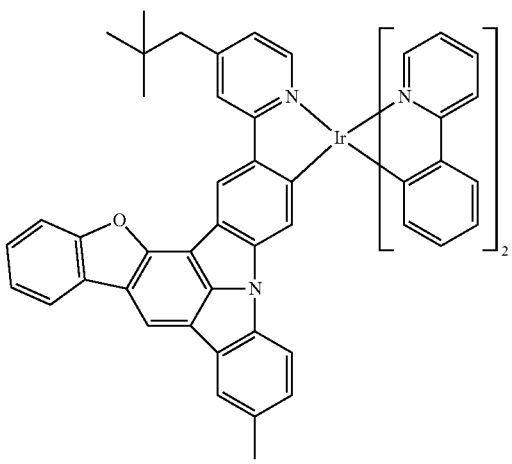
54
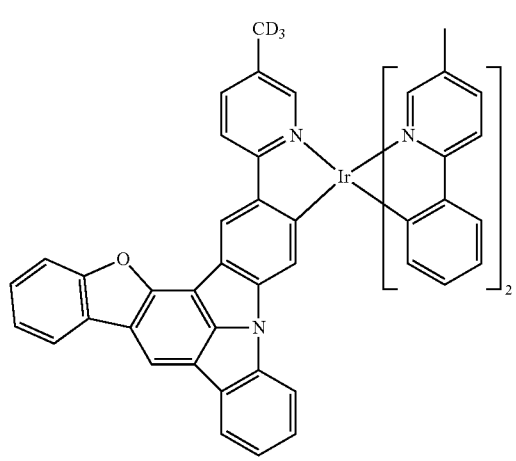
52
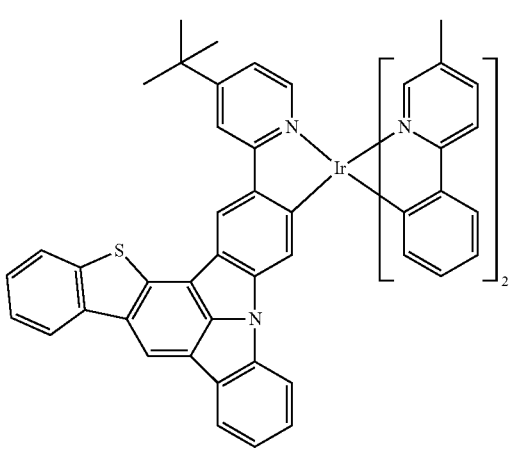
55
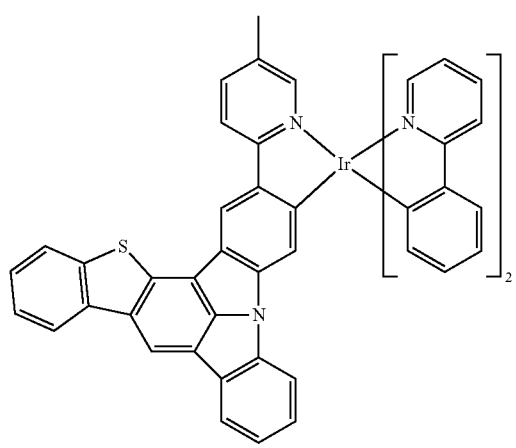
53
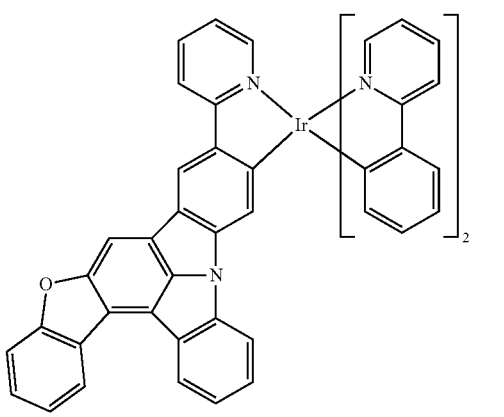
56

57
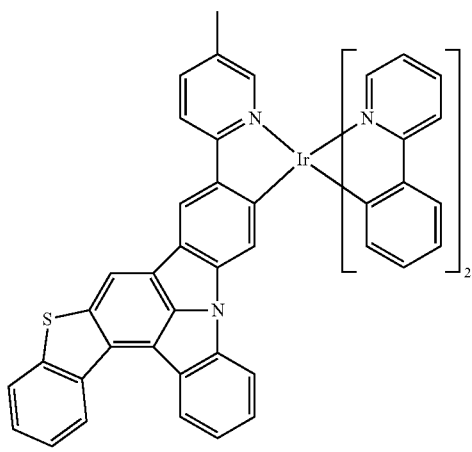
58
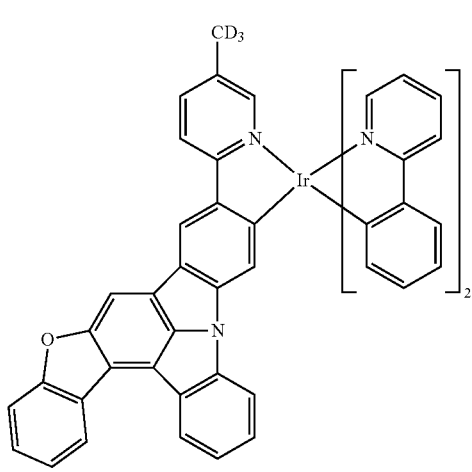
59
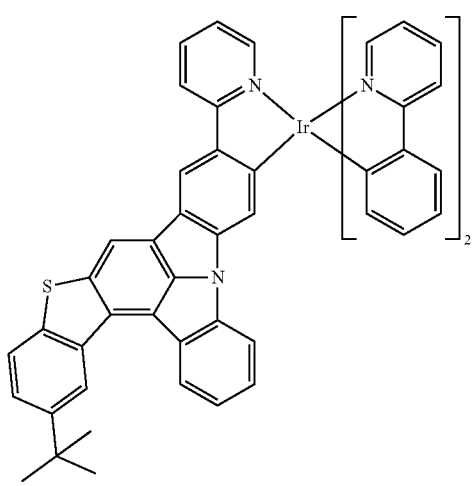
60
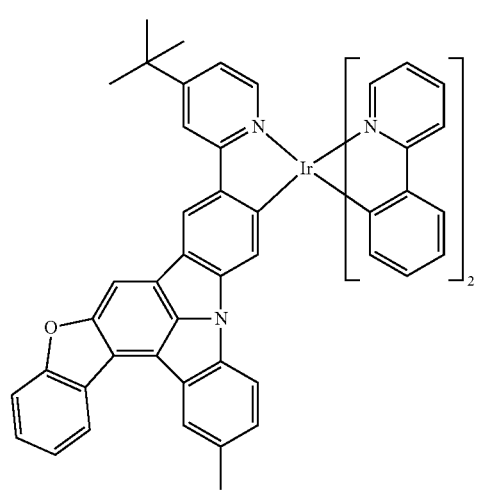
61
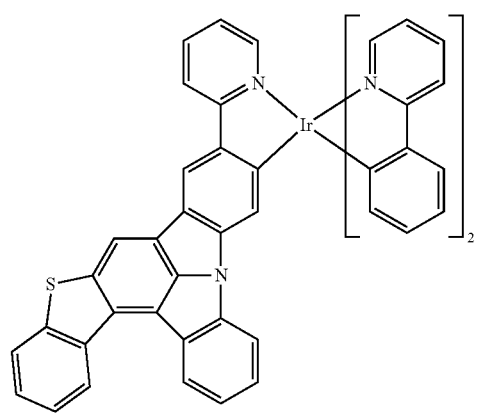
62

33
-continued
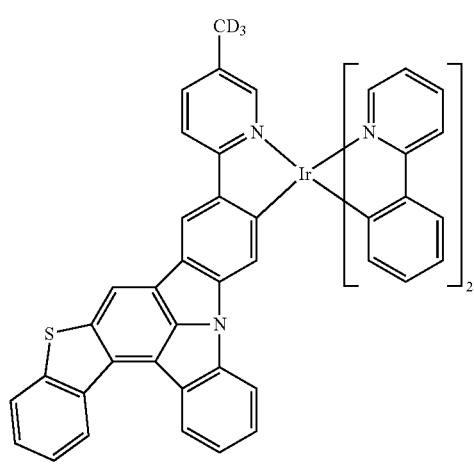
63
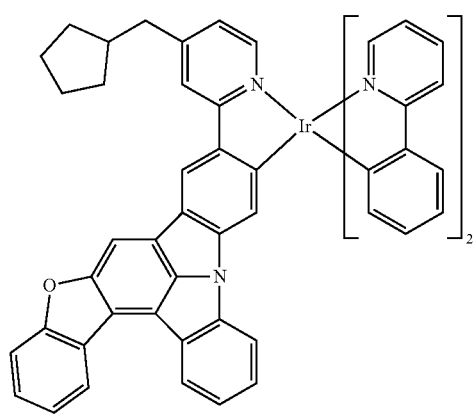
64
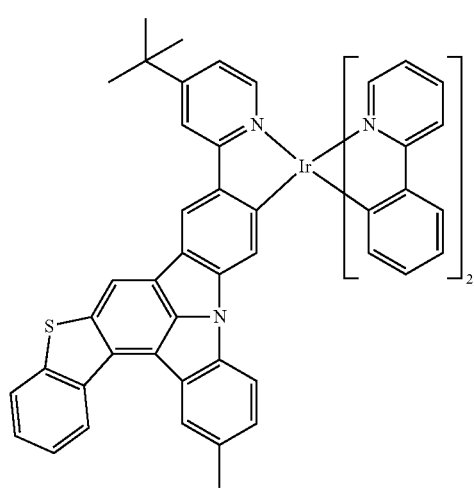
65
34
-continued
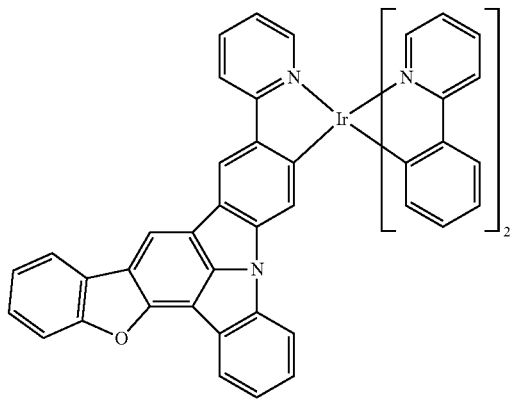
66
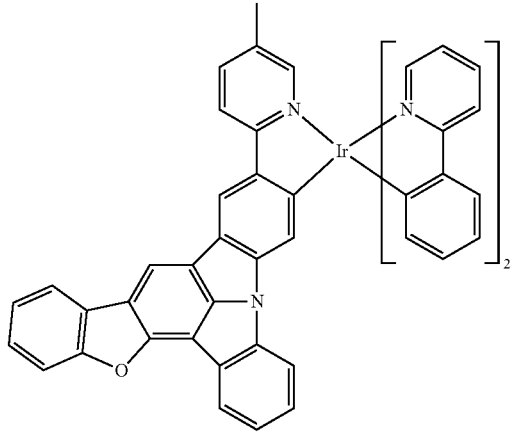
67
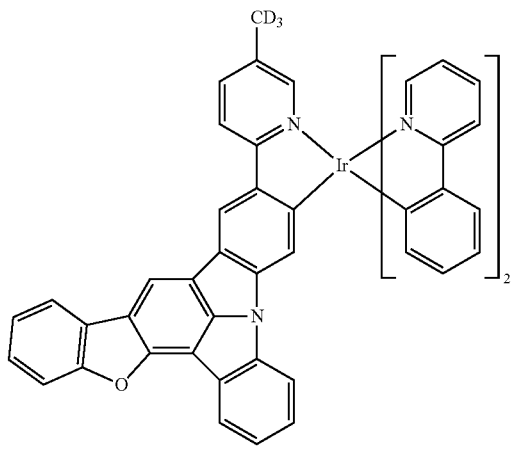
68

35
-continued
69
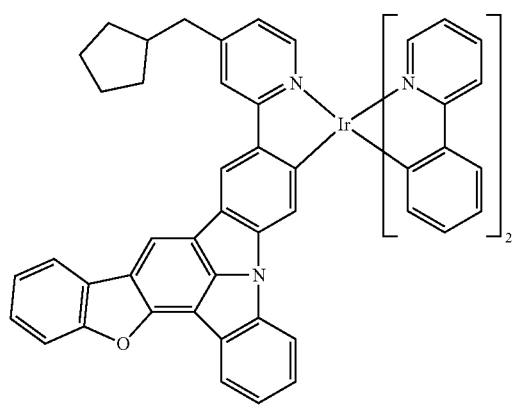
70
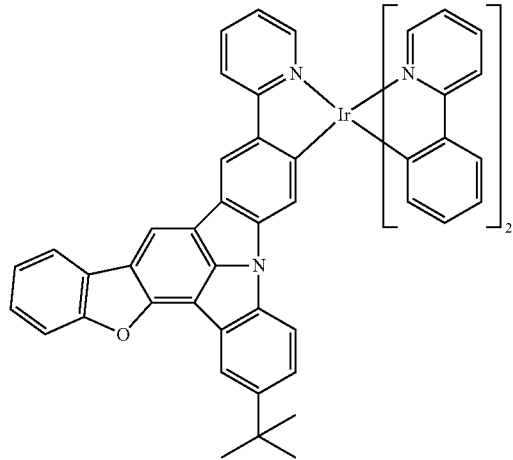
71
36
-continued
72
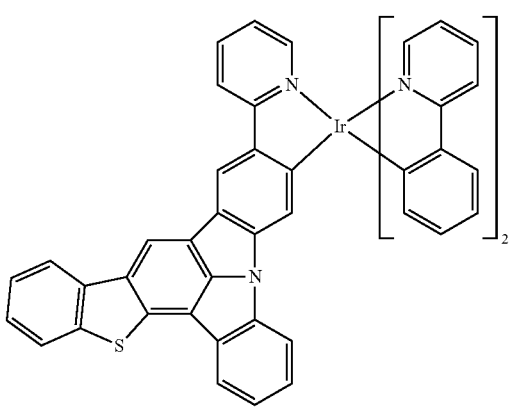
73
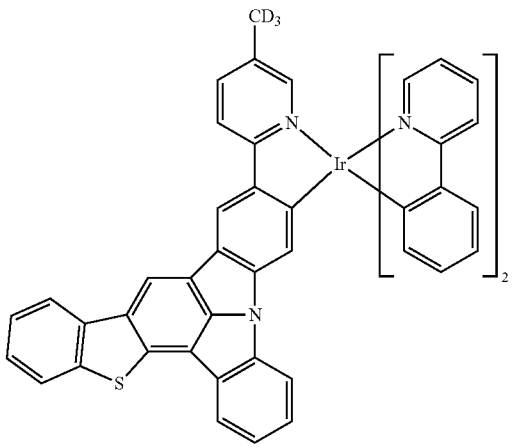
74
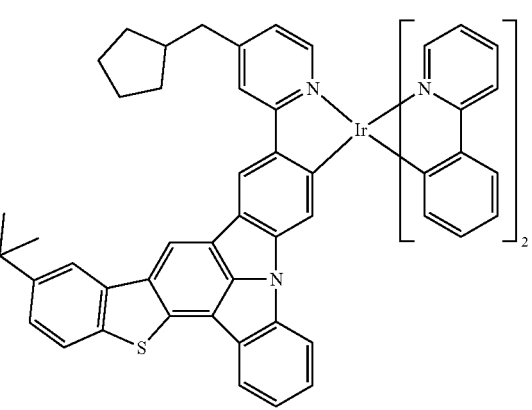

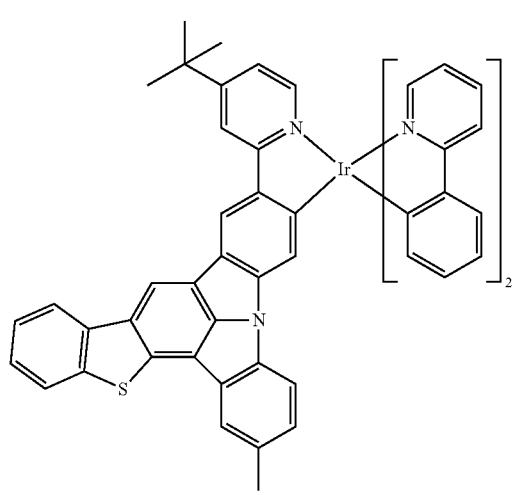
75
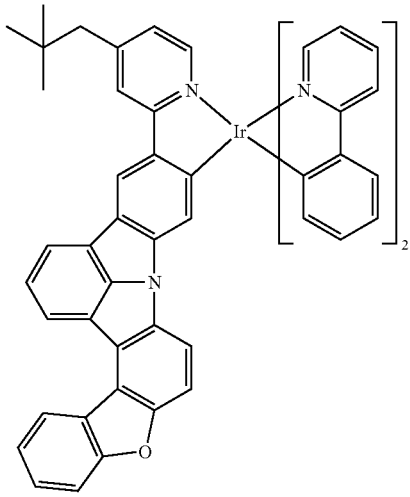
78
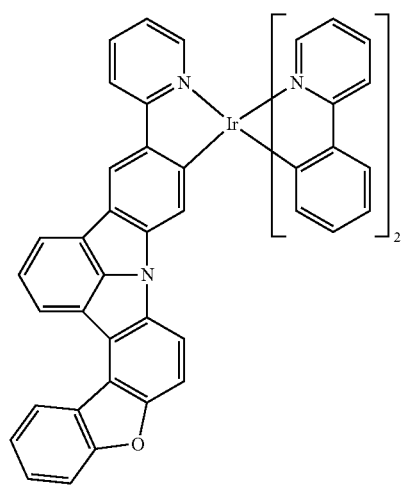
76
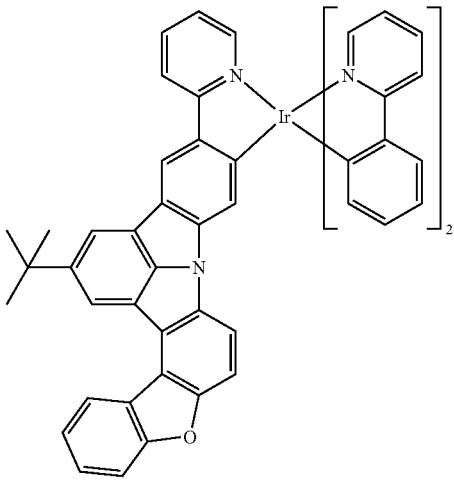
79
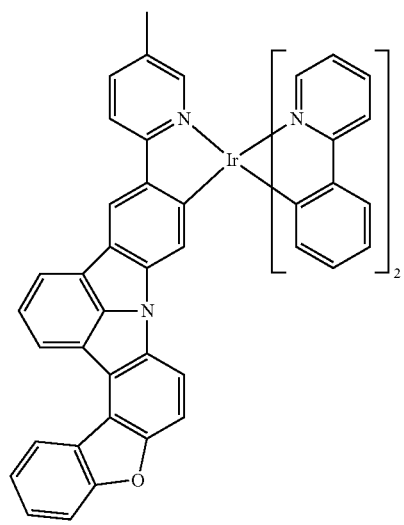
77
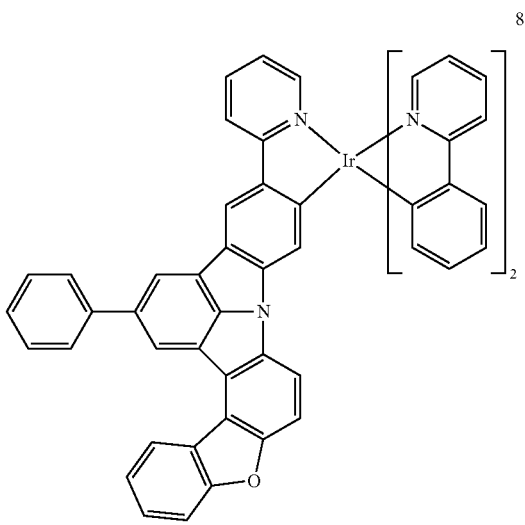
80

81
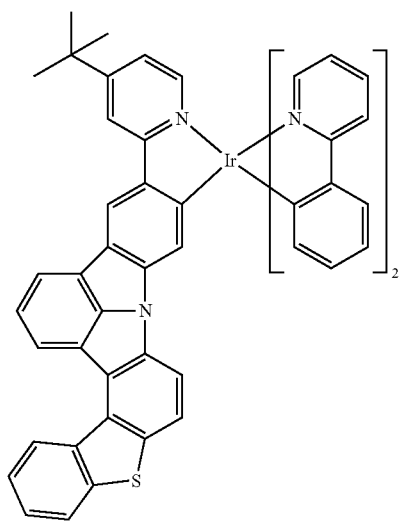
84
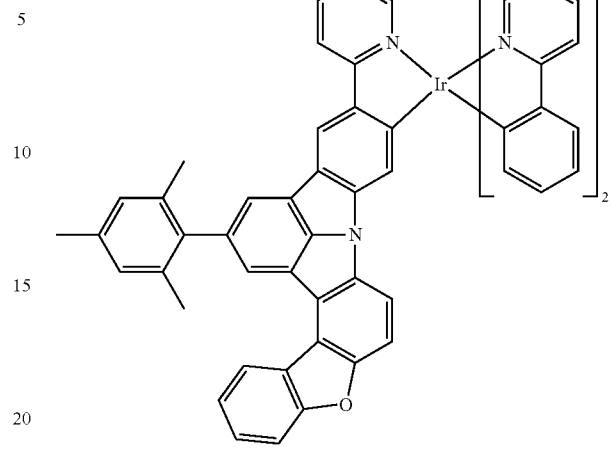
82
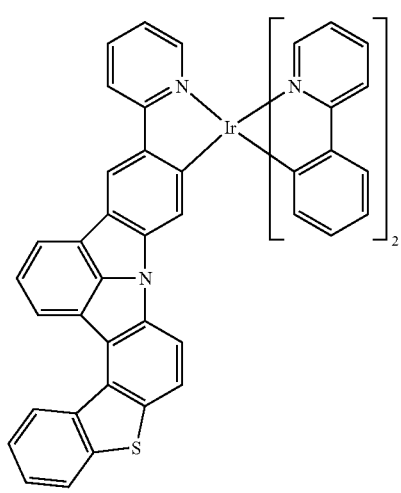
85
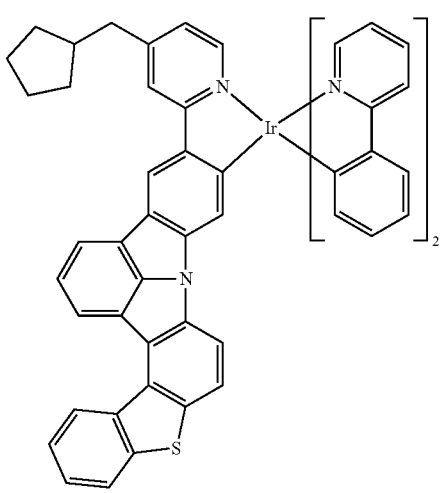
83
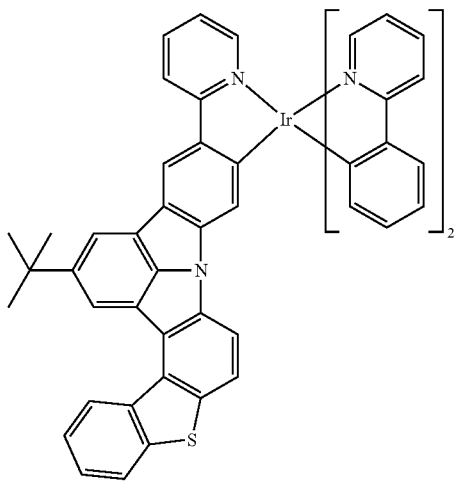
86
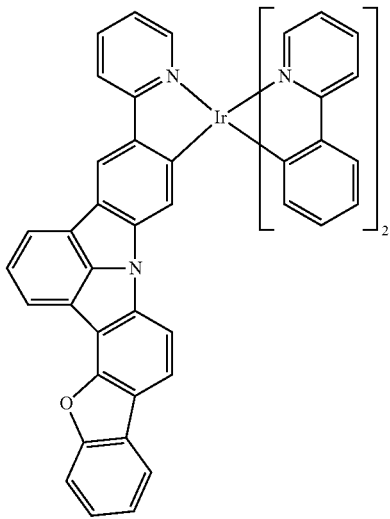

87
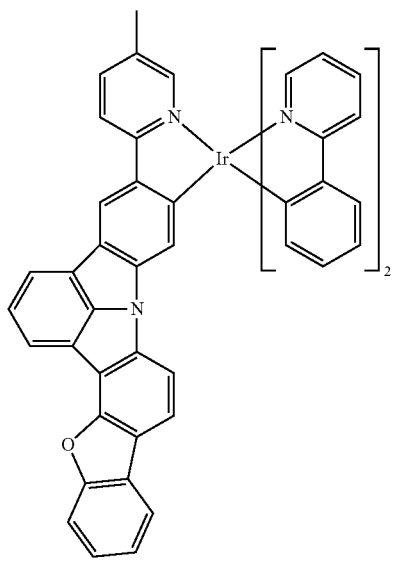
88
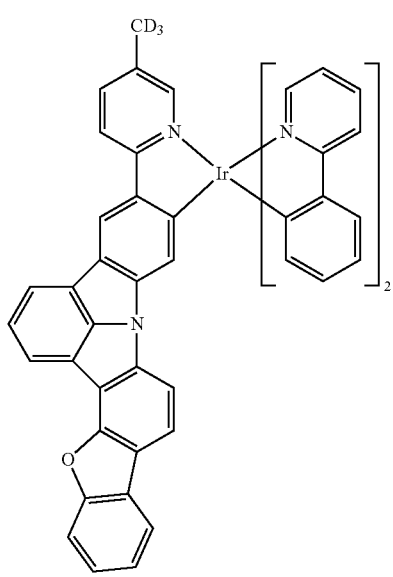
89
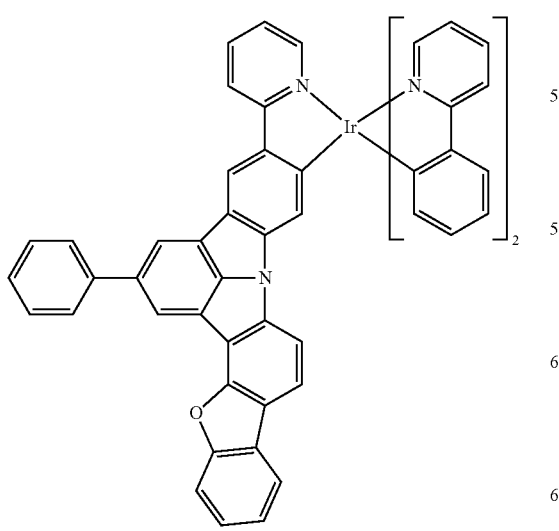
90
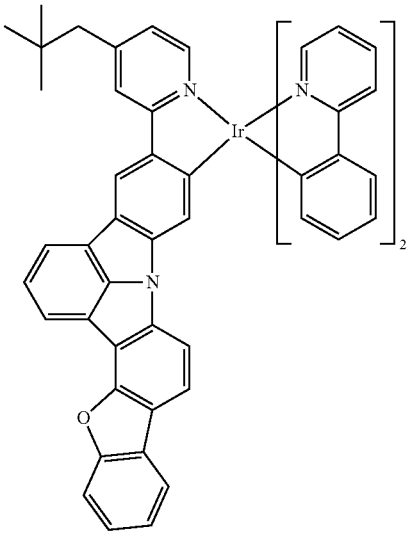
91
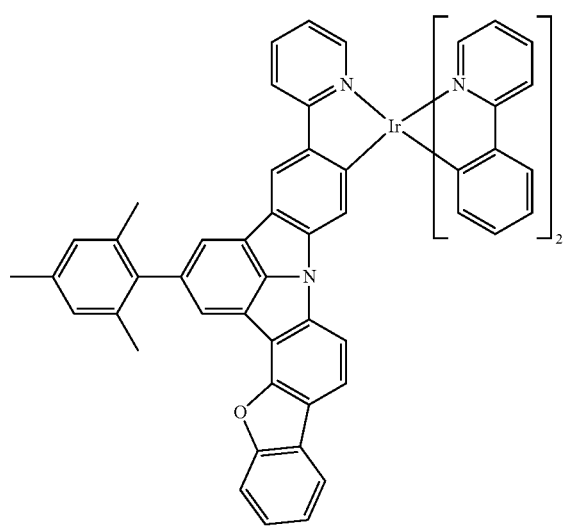
92

93
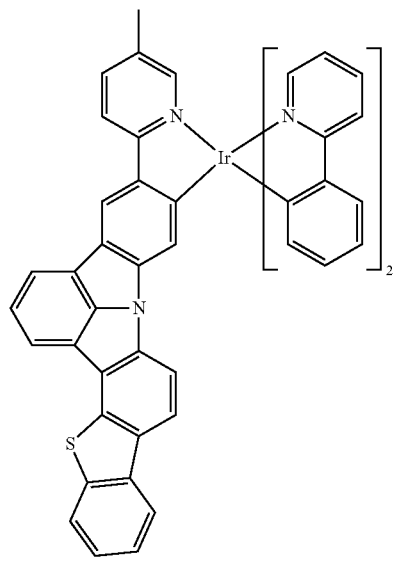
94
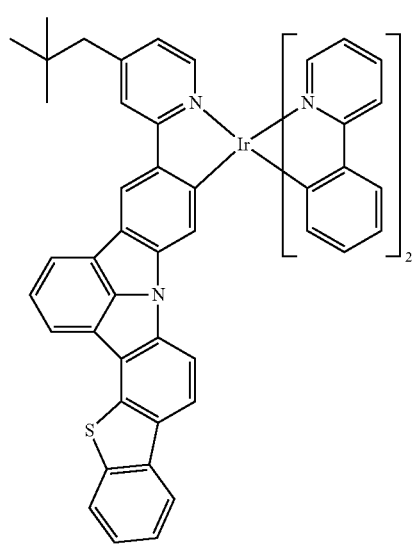
95
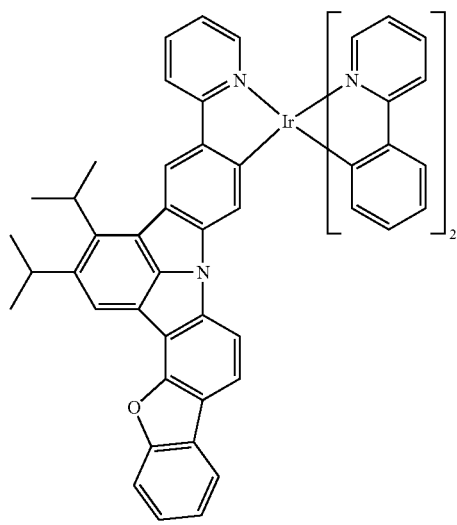
96
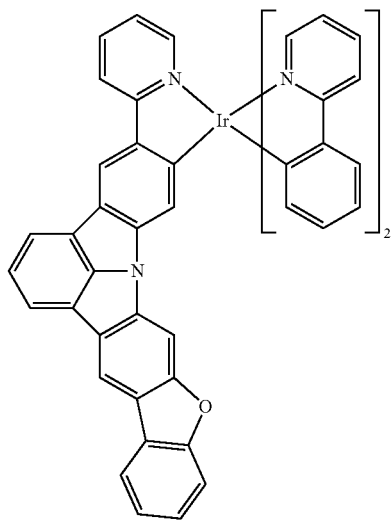
97
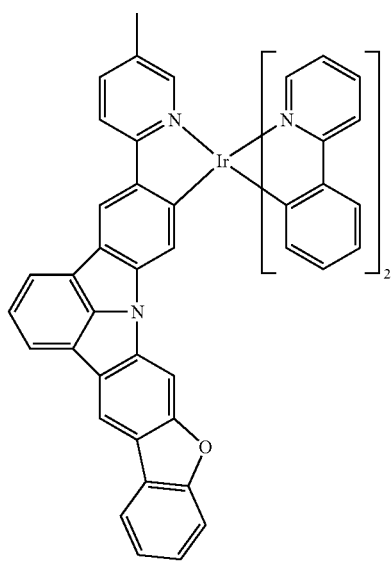
98
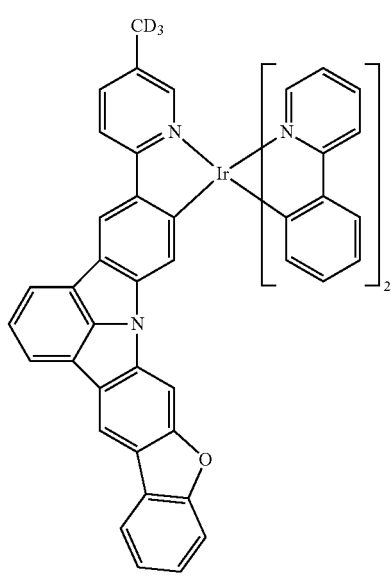

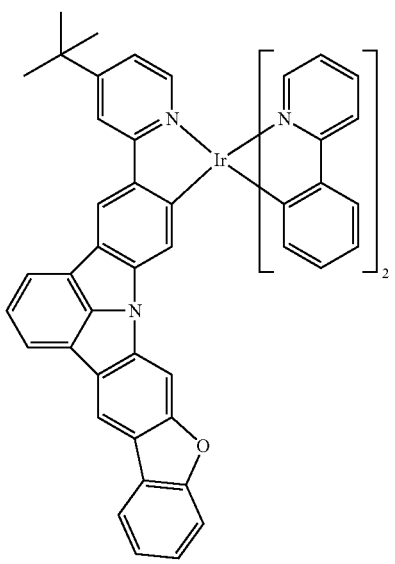
99
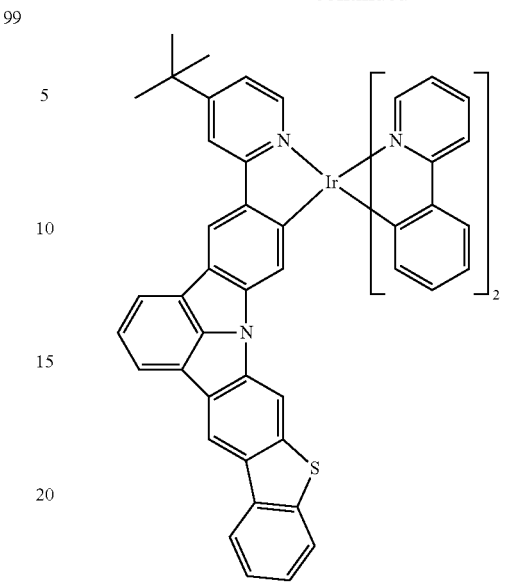
102
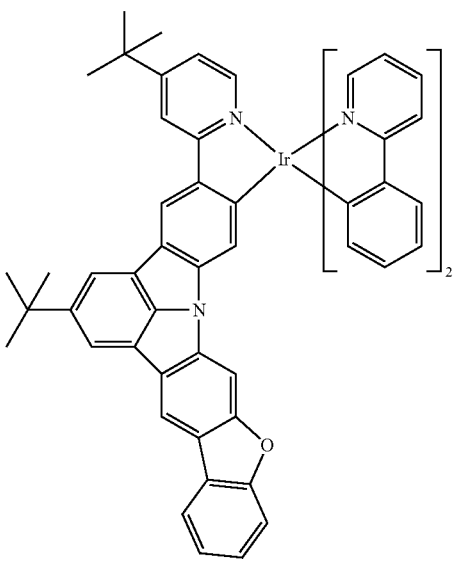
100
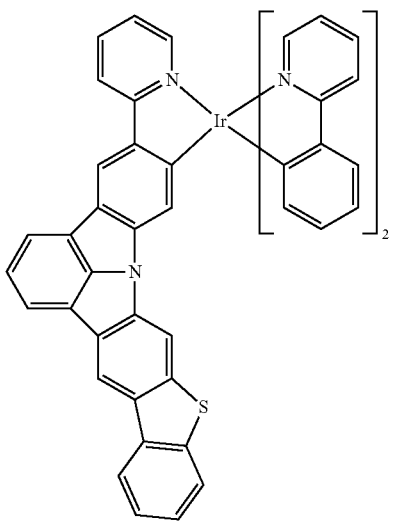
101
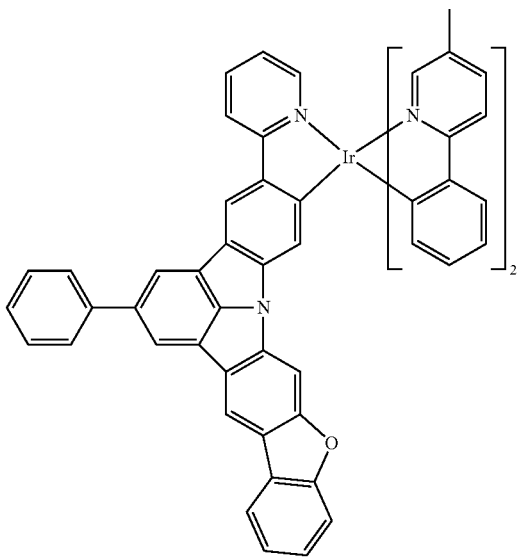
103

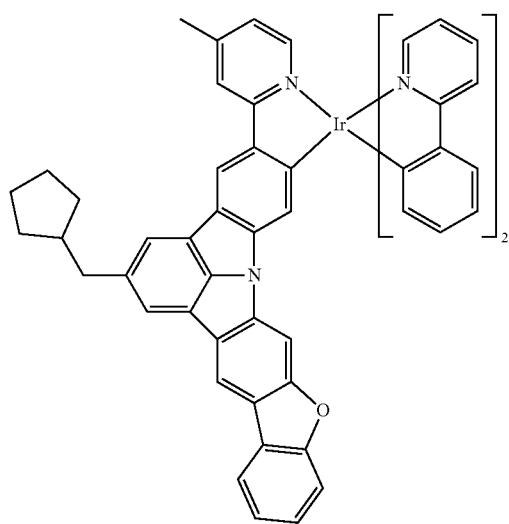
104
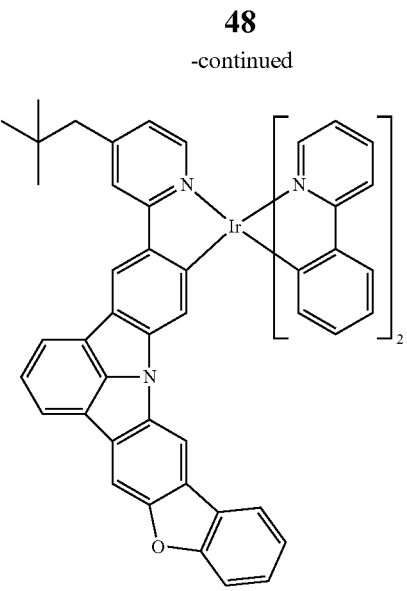
107
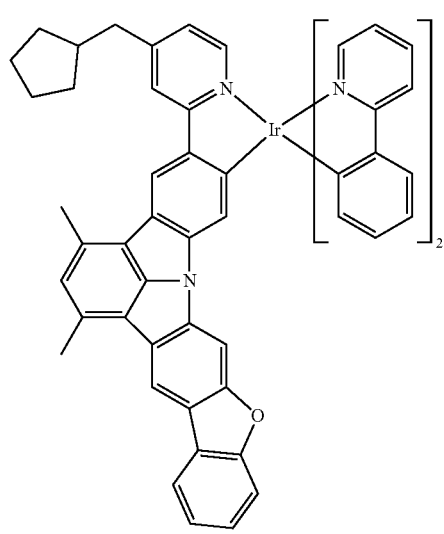
105
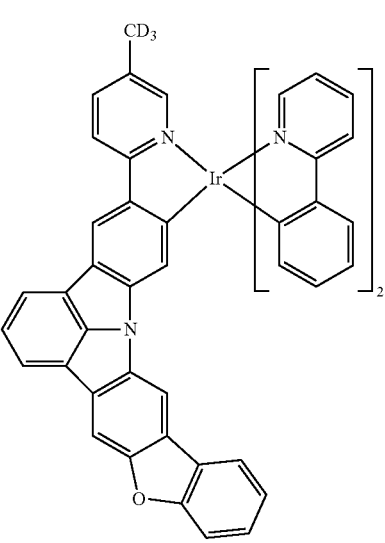
108
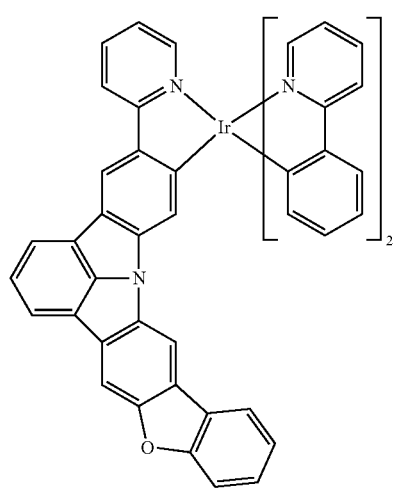
106
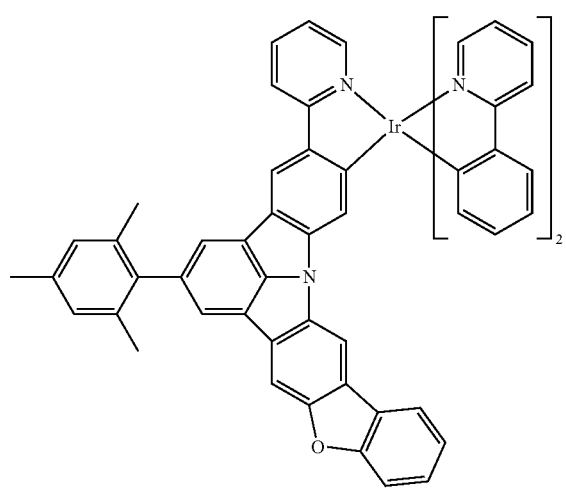
109

110
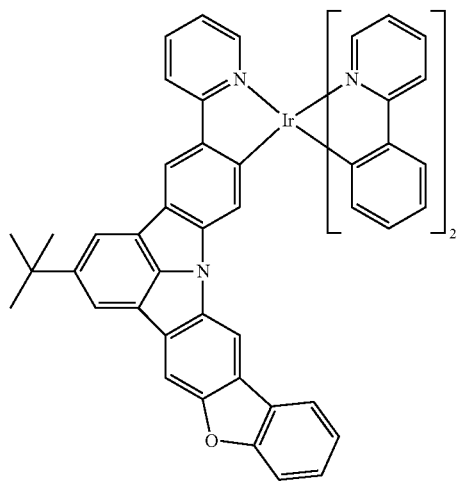
113
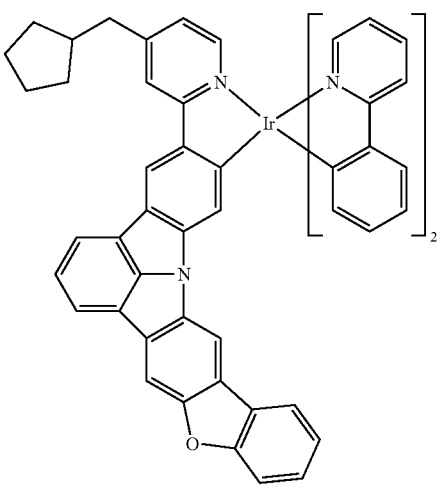
111
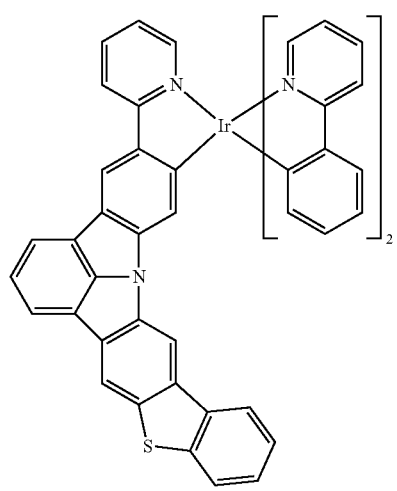
114
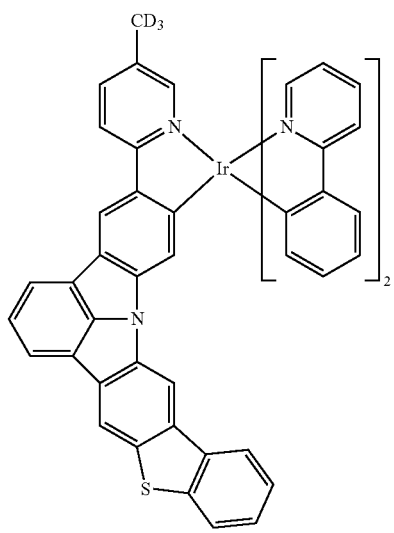
112
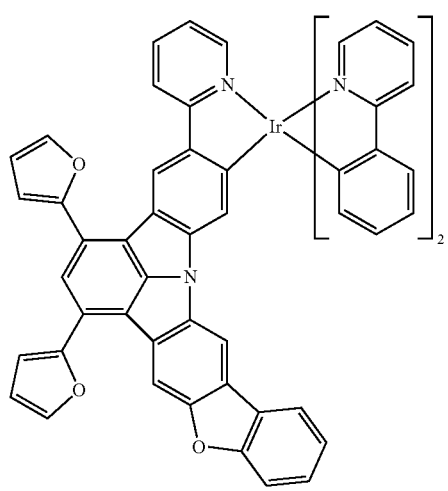
115
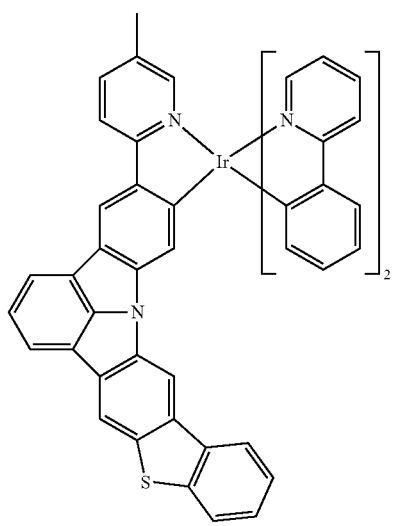

51
-continued
116
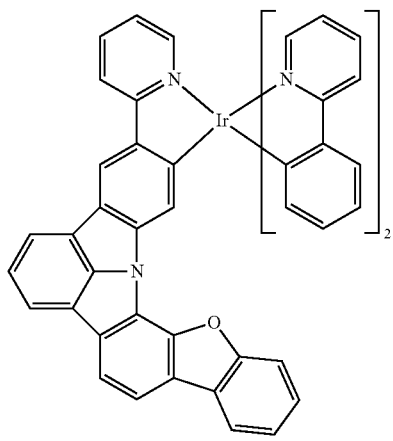
117
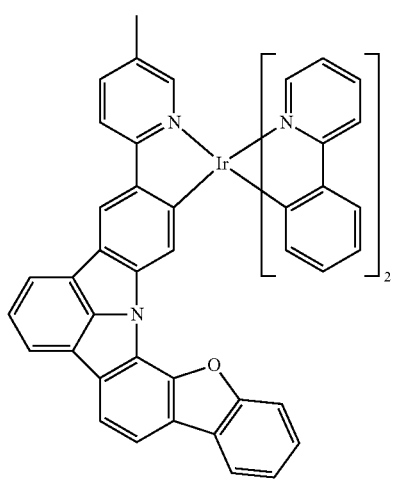
118
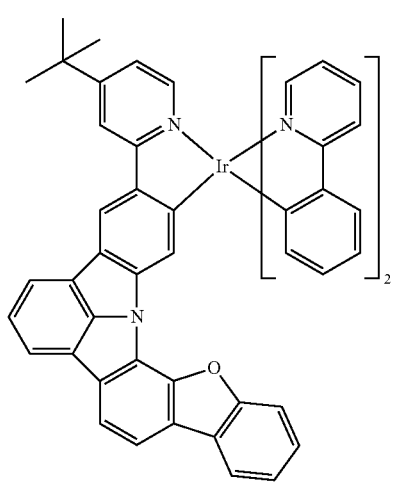
52
-continued
119
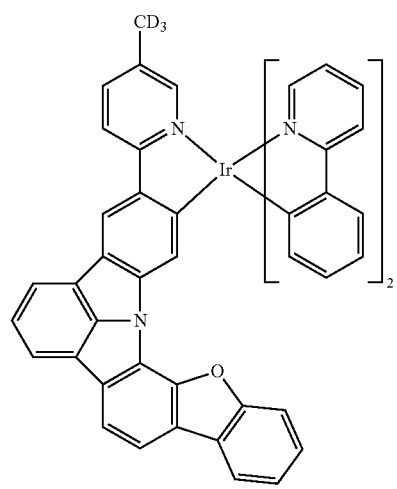
120
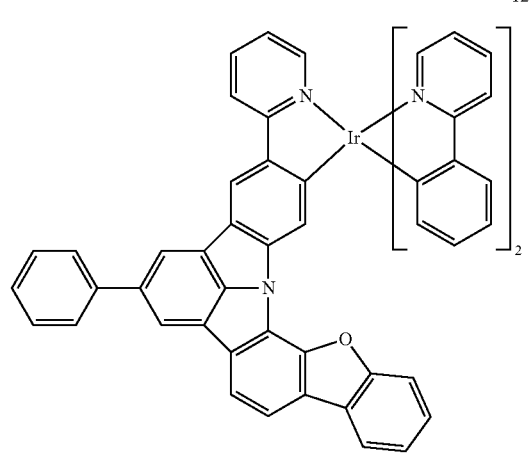
121
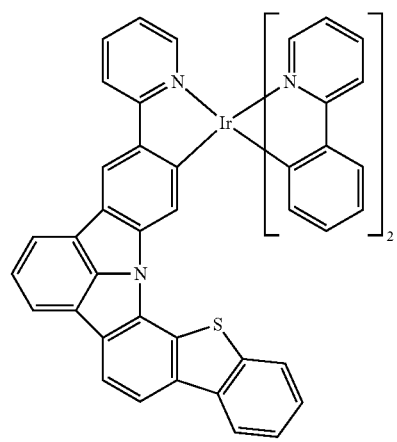

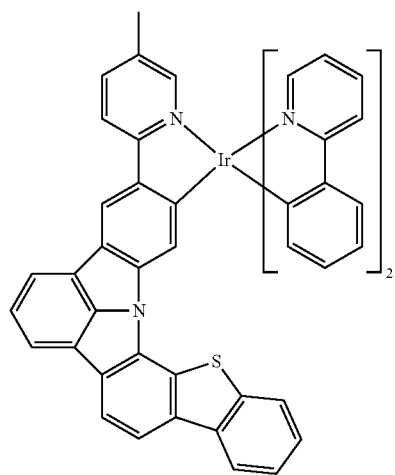
122
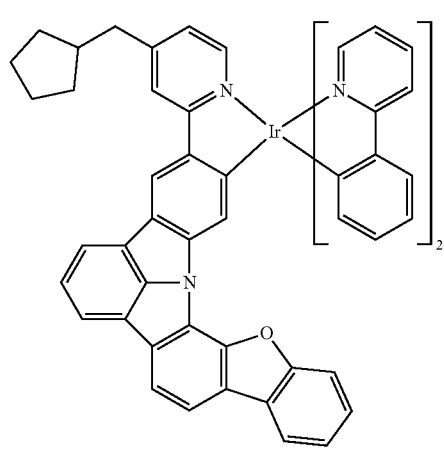
123
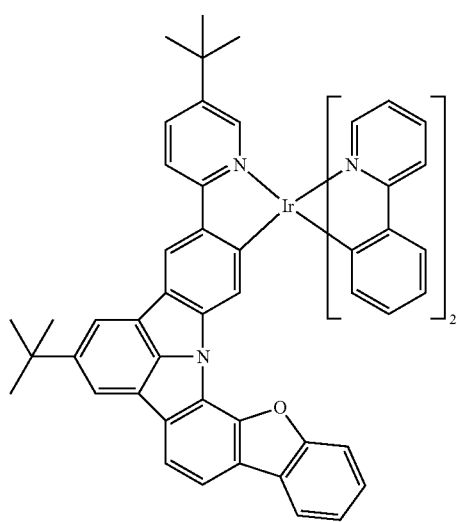
124
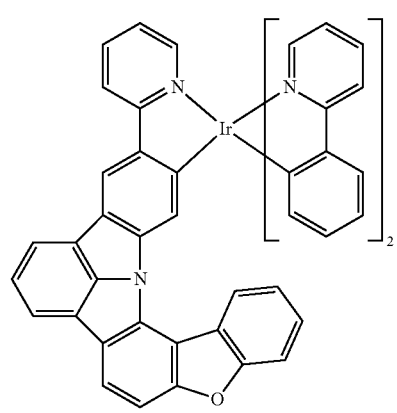
125
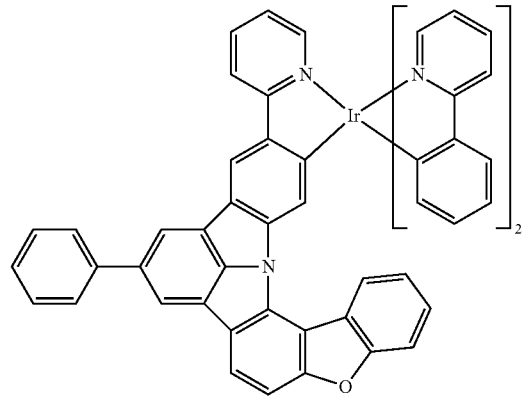
126
127

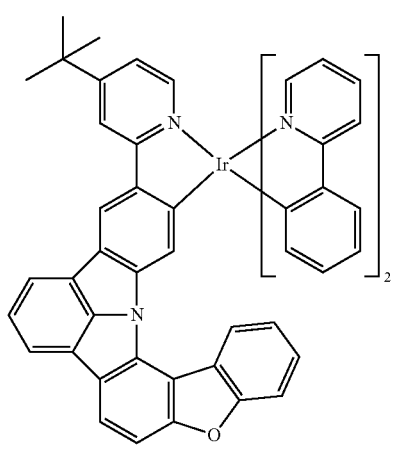
128
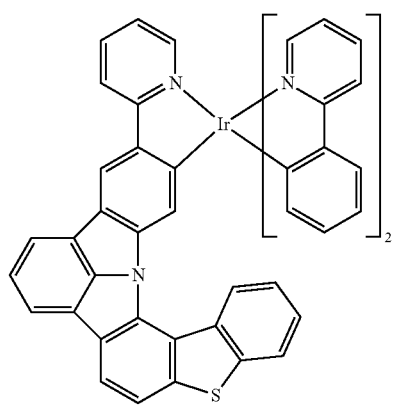
131
129
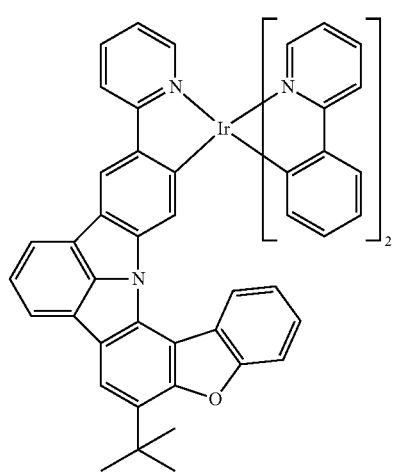
132
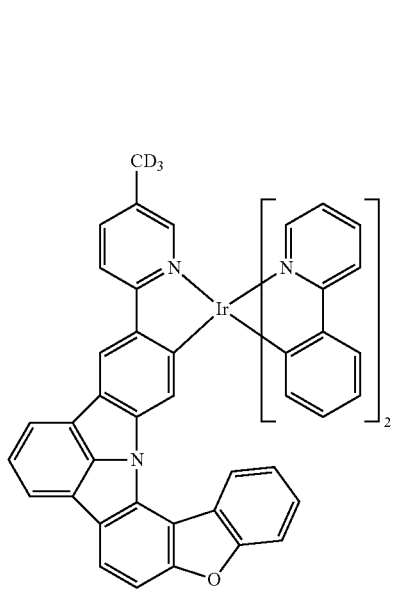
130
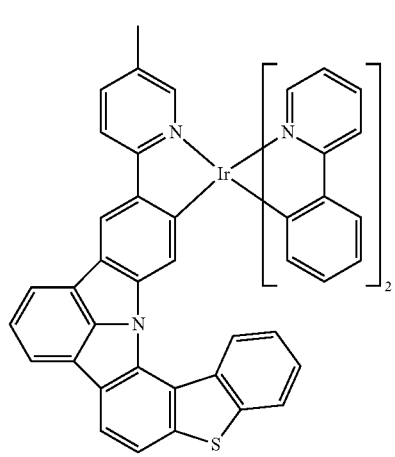
133

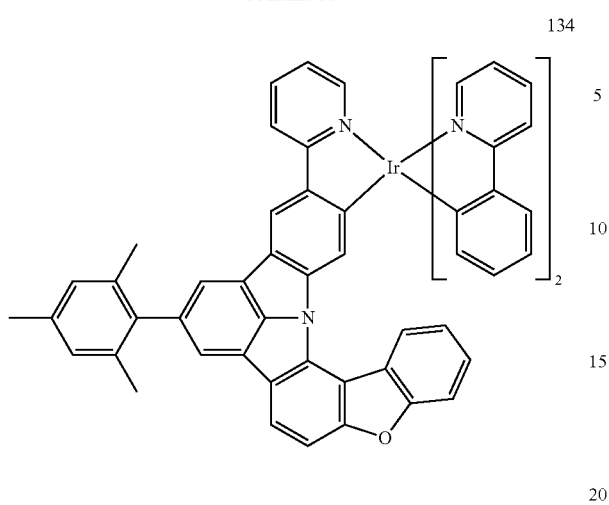
134
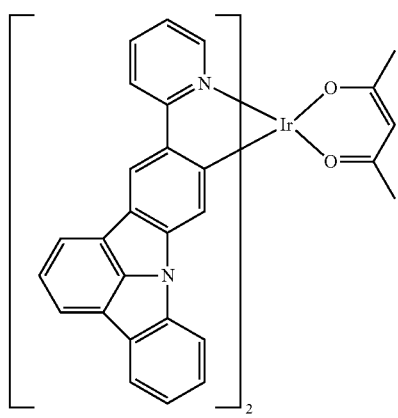
137
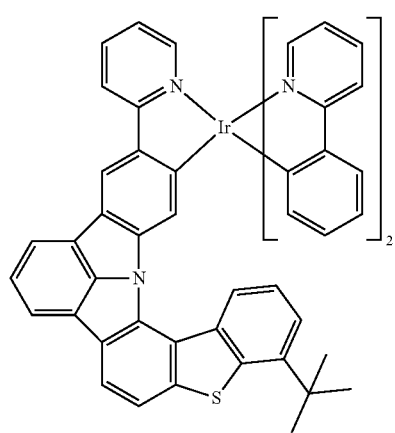
135
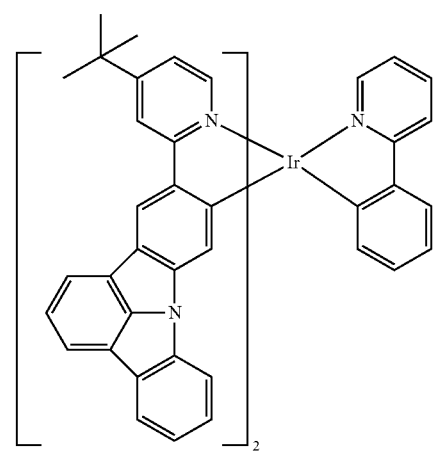
138
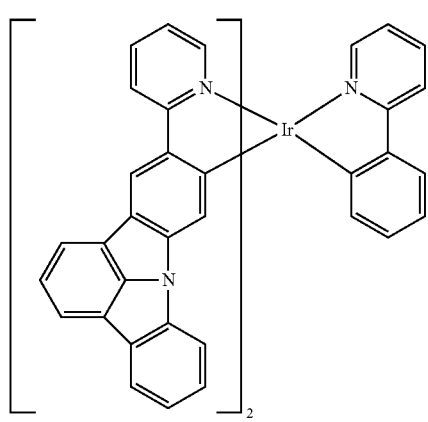
136
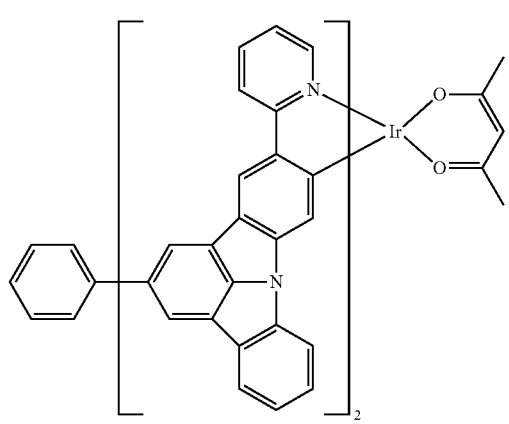
139

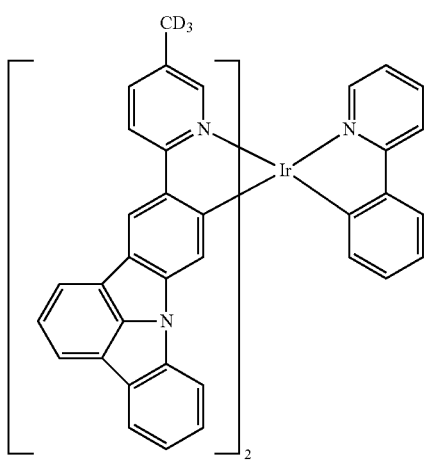
140
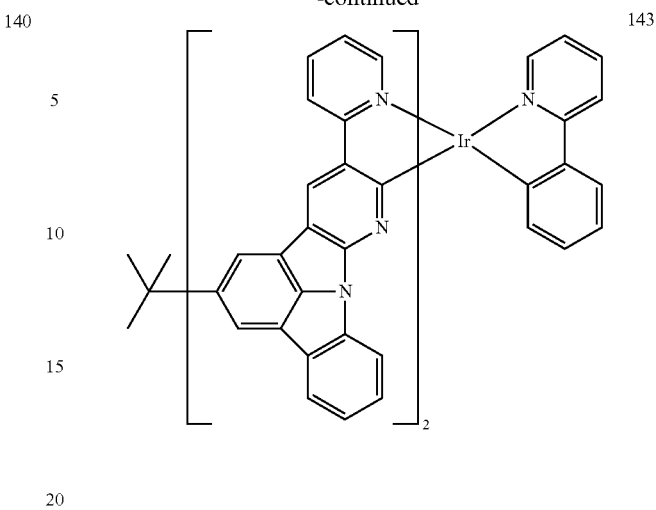
143
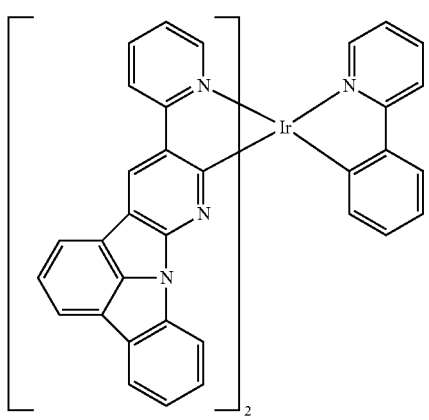
141
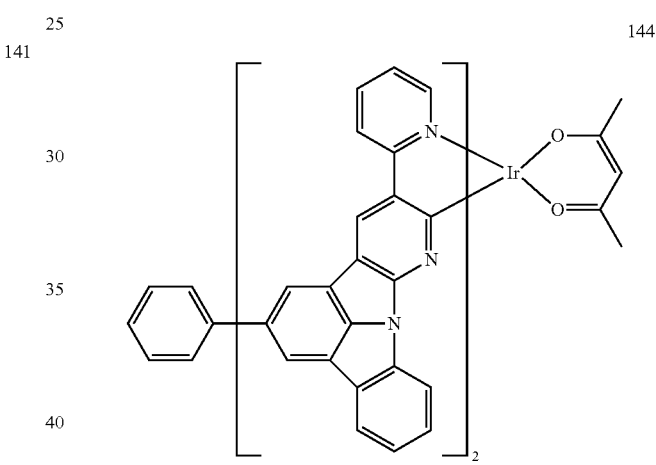
144
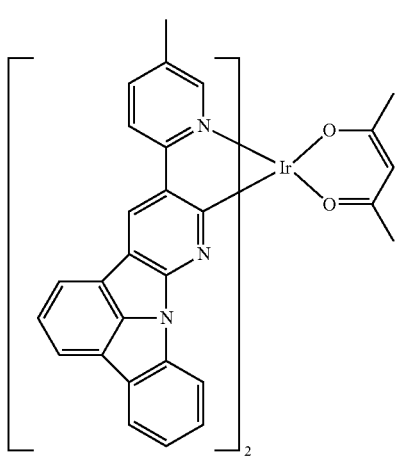
142
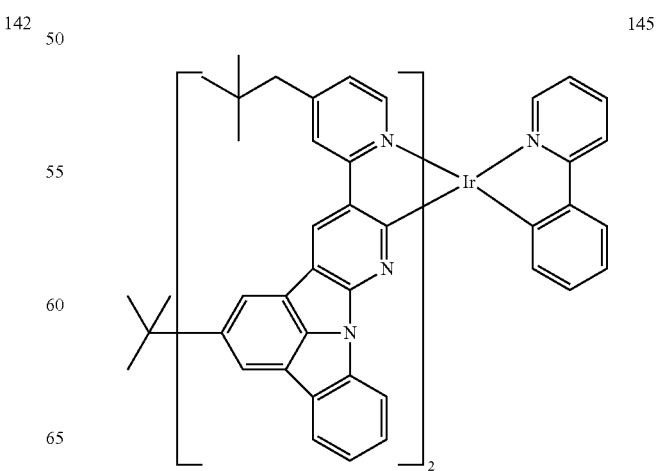
145

146
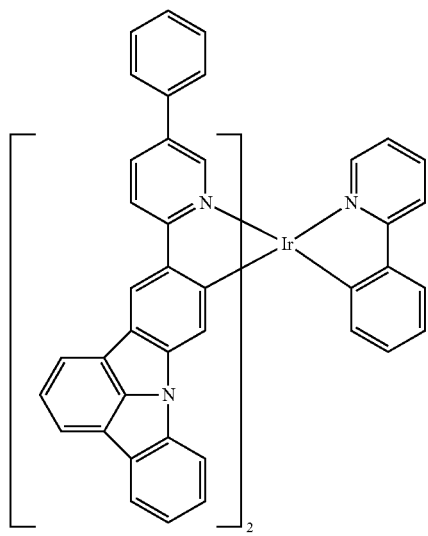
147
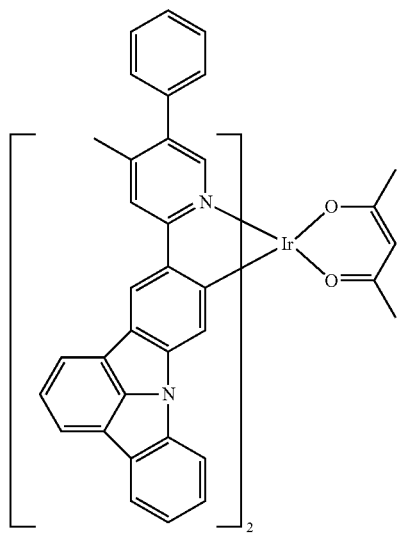
148
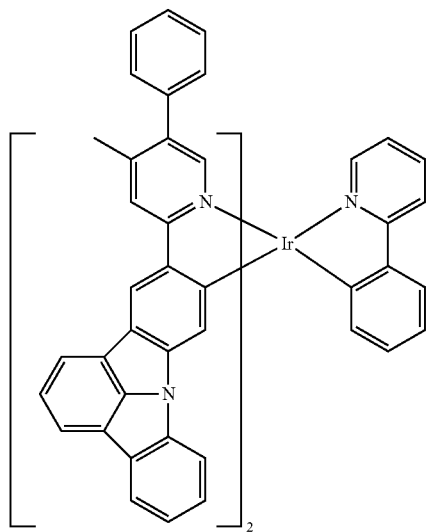
149
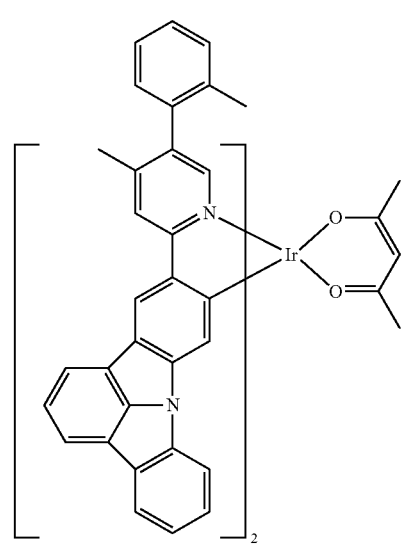
150
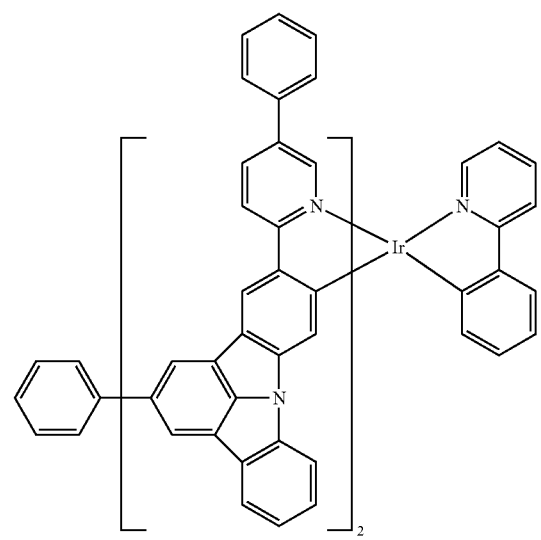
151
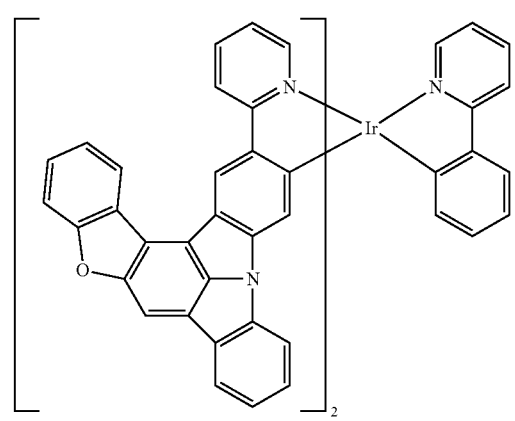

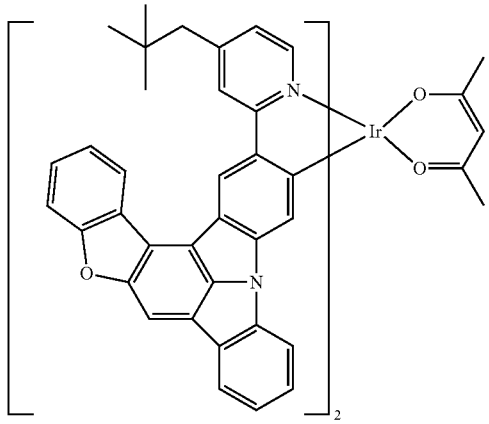
152
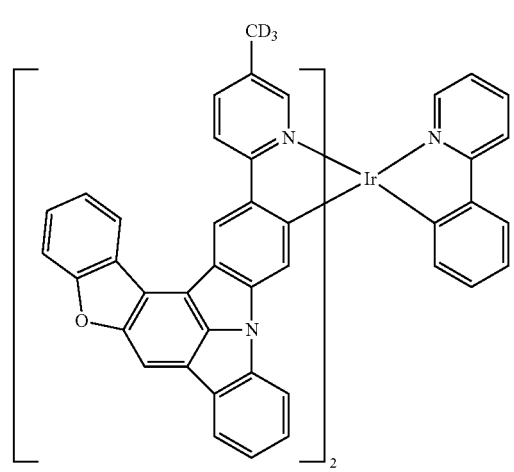
155
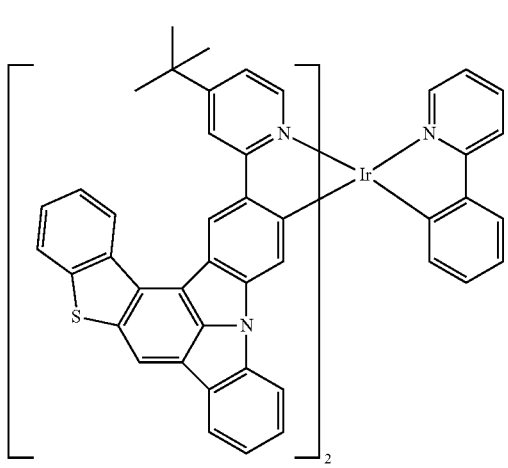
153
156
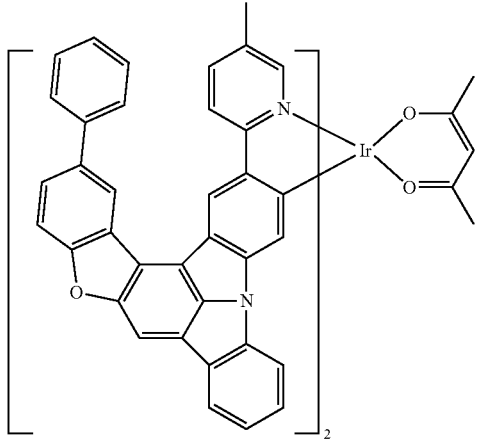
154
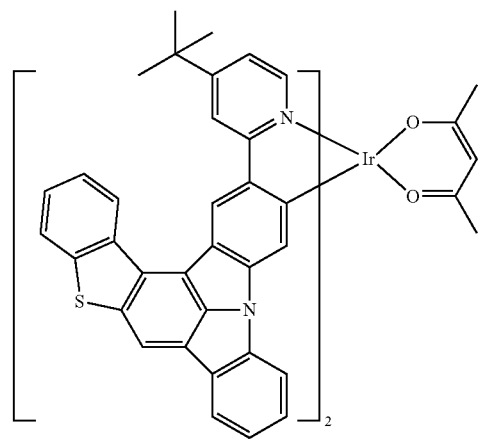
157

158
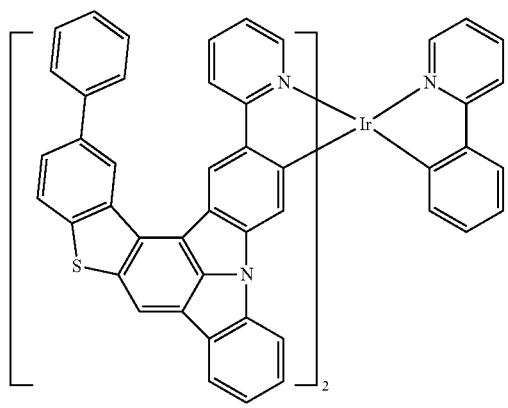
159
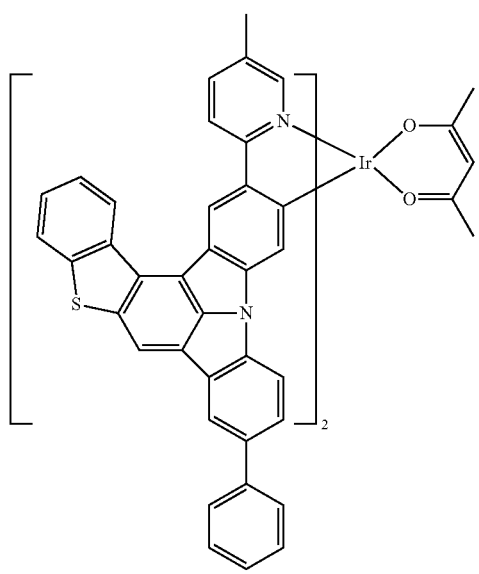
160
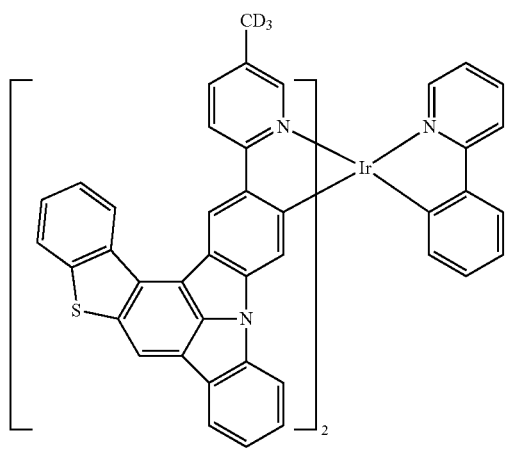
161
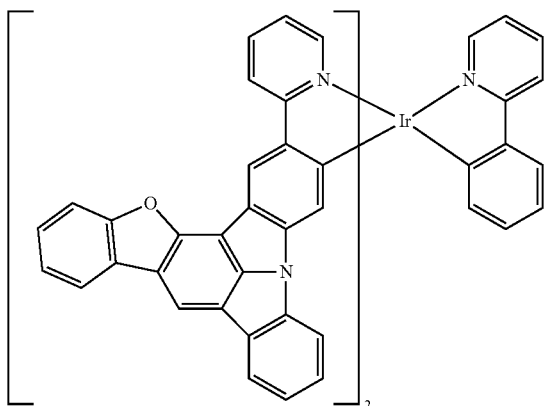
162
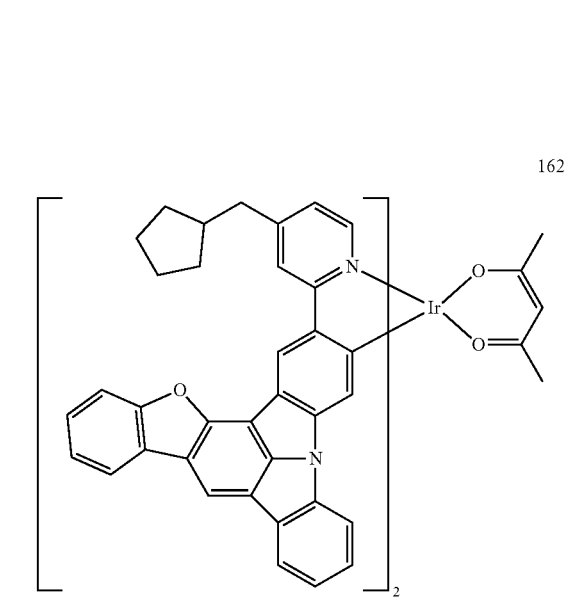
163
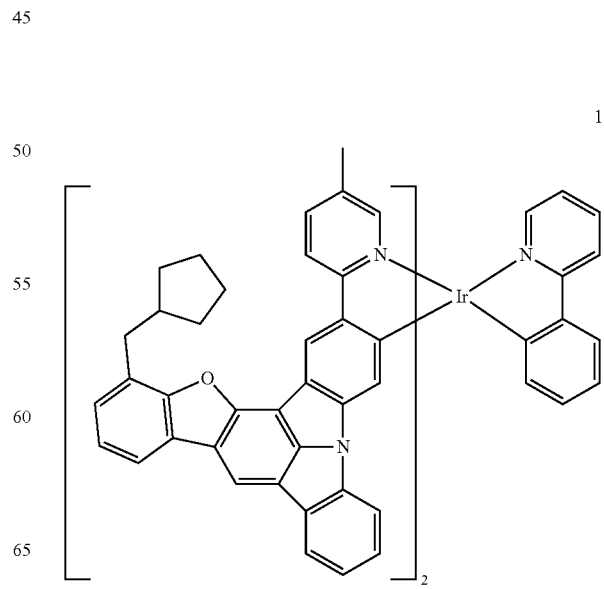

-continued
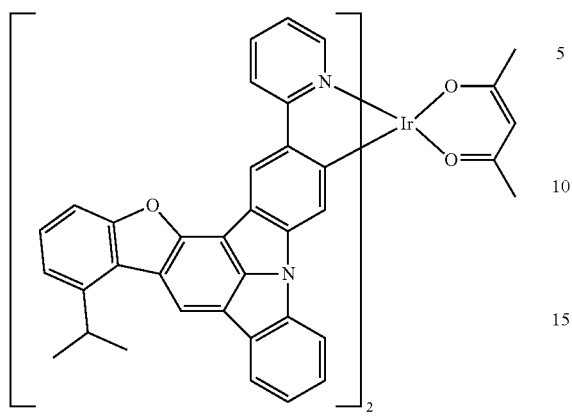
164
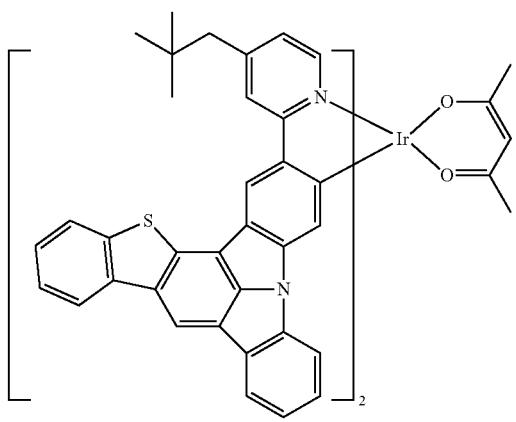
167
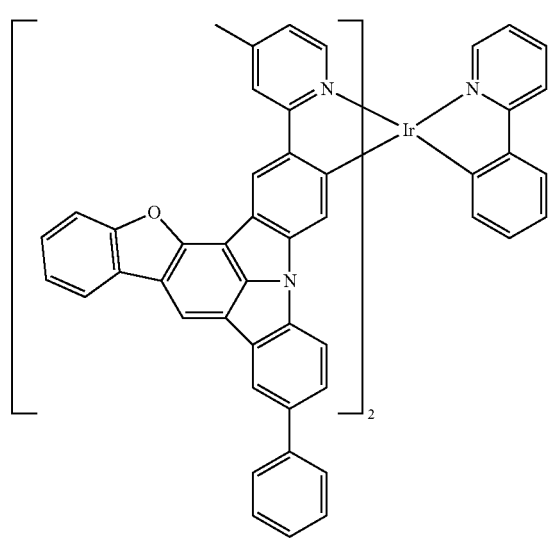
165
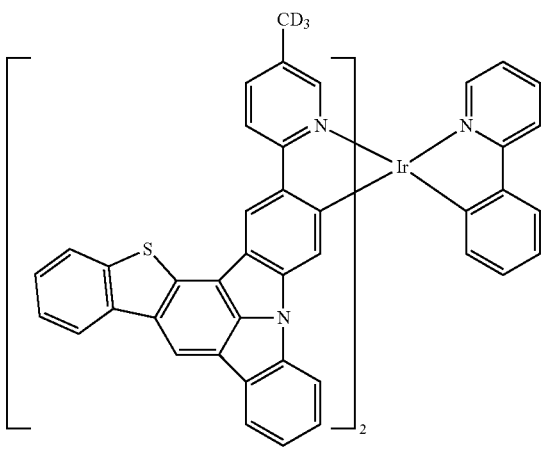
168
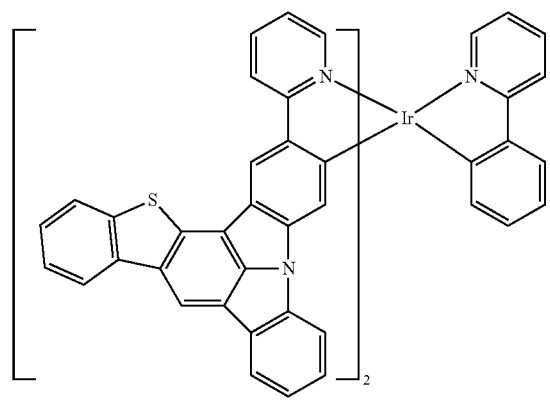
166
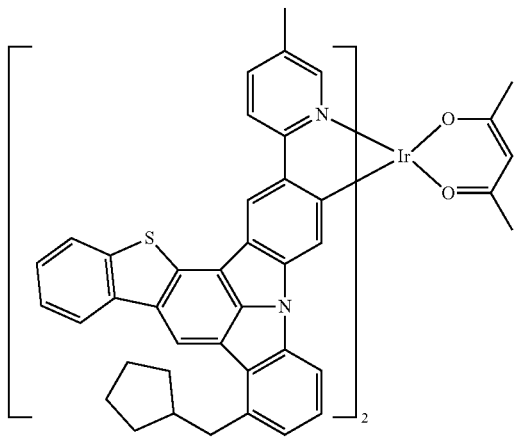
169

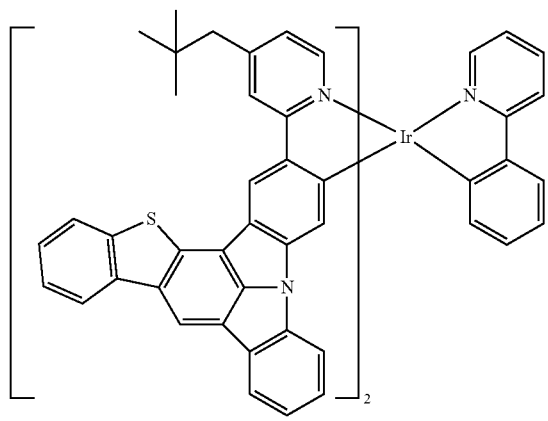
170
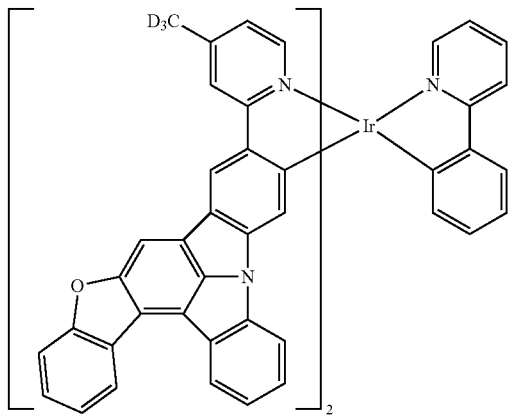
173
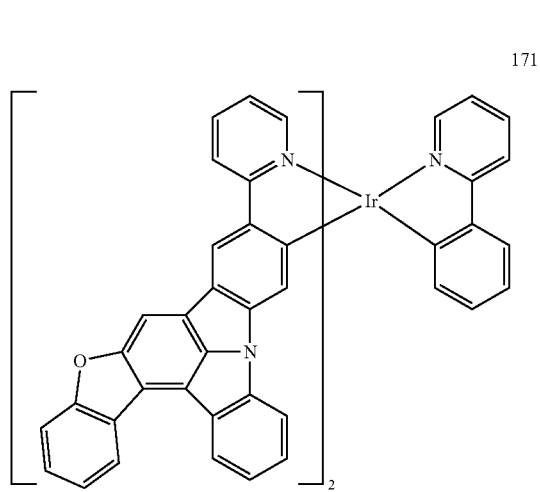
171
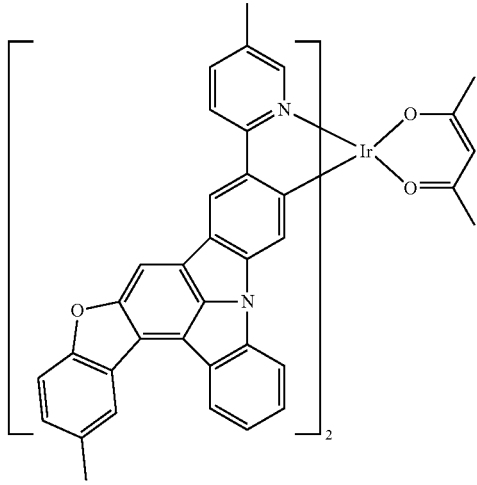
174
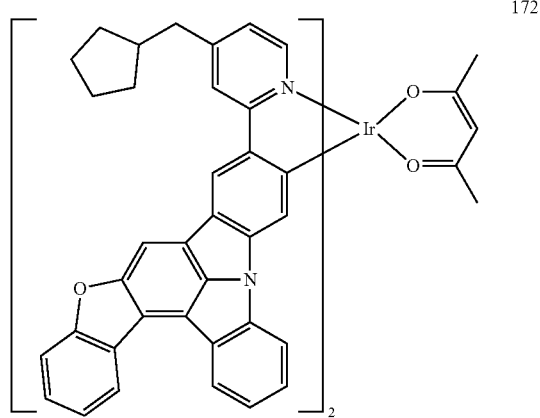
172
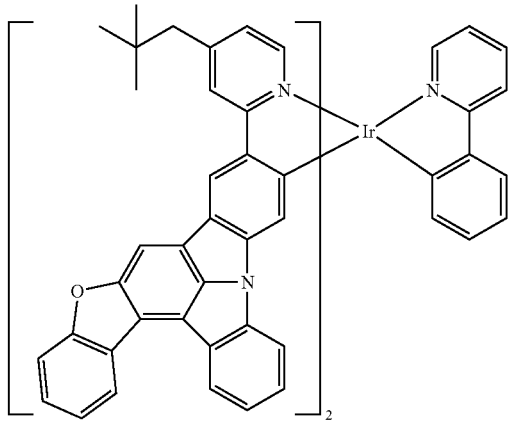
175

176
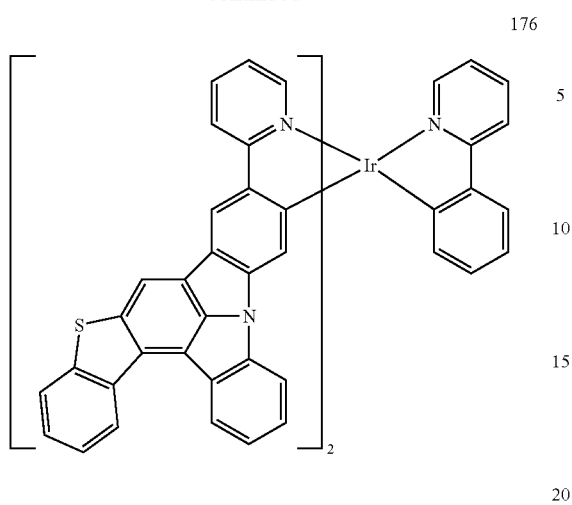
177
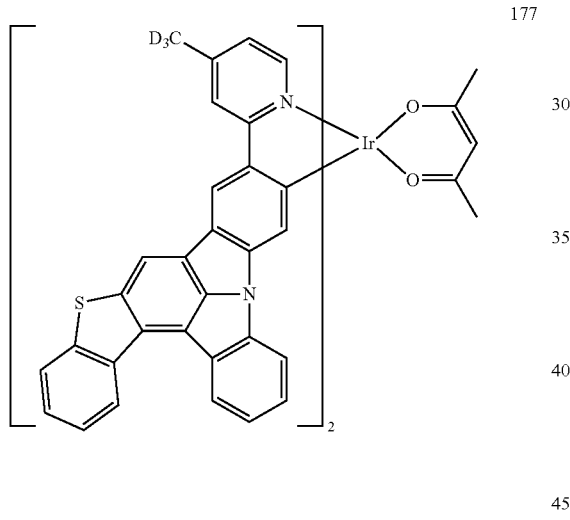
178
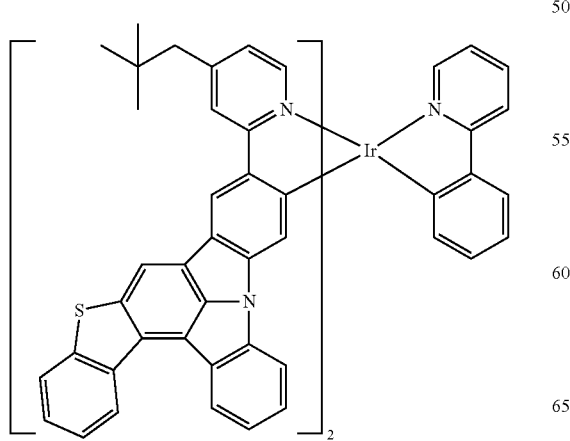
179
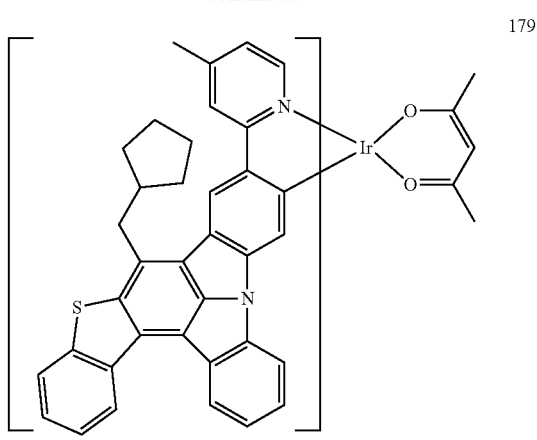
180
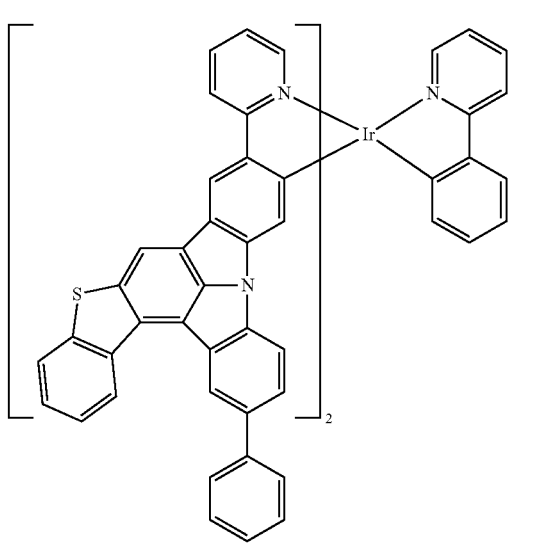
181
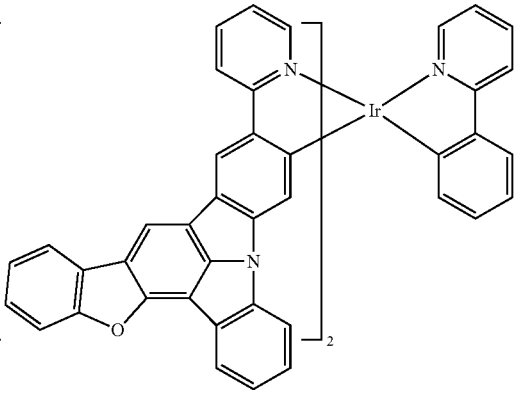

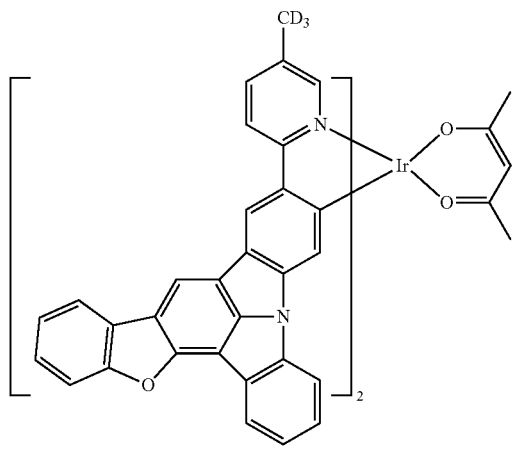
182
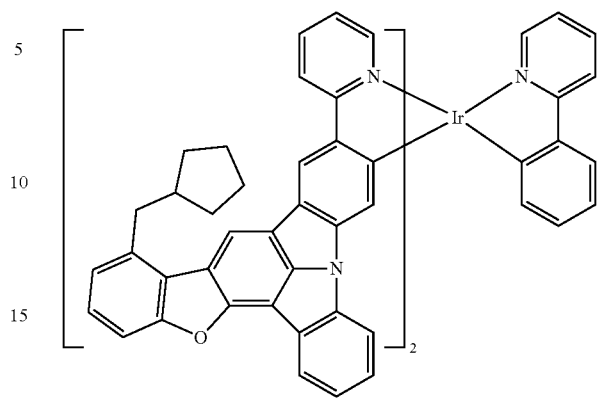
185
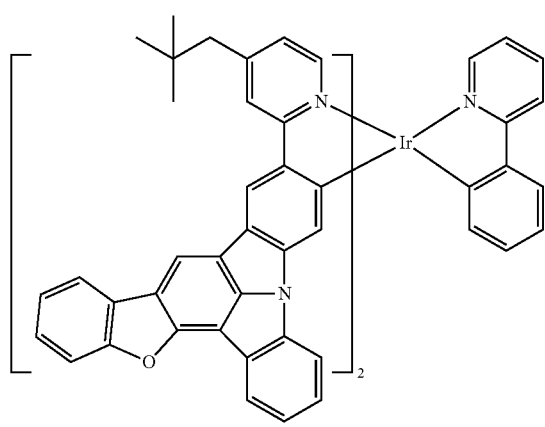
183
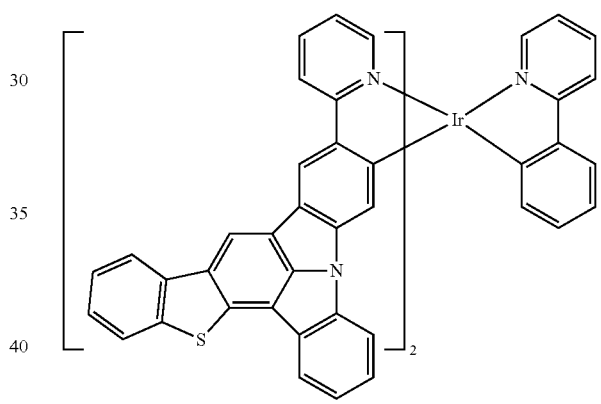
186
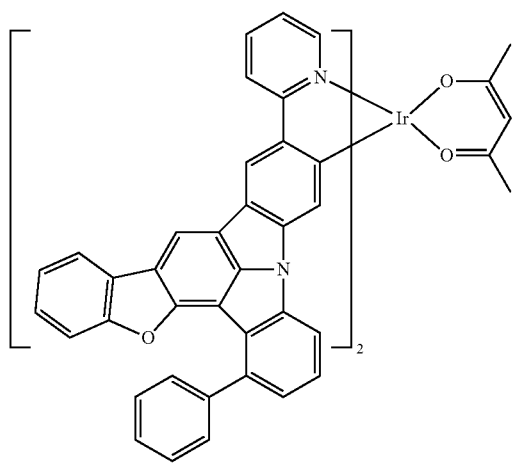
184
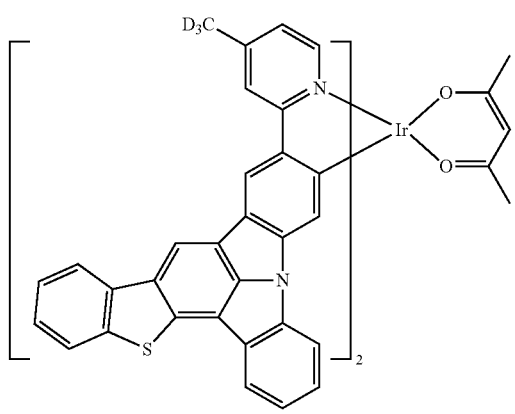
187

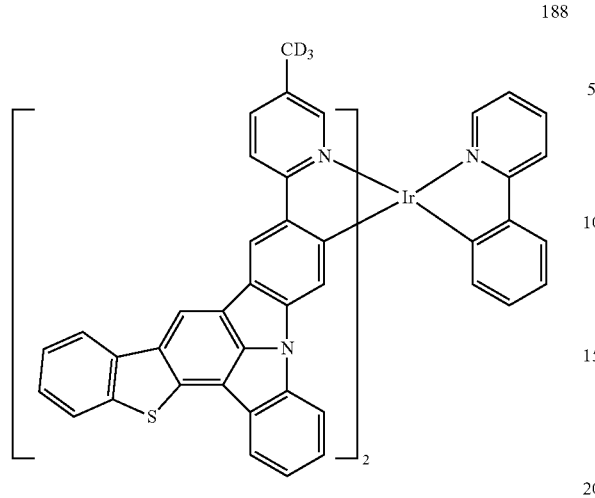
188
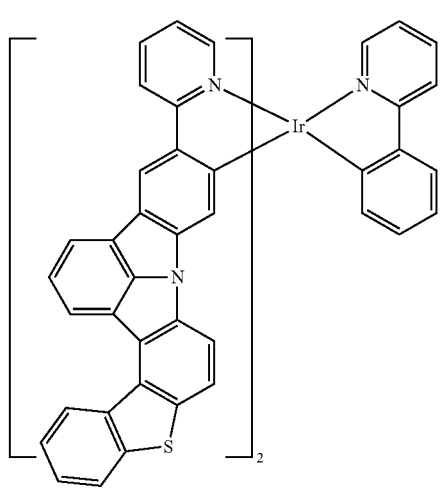
191
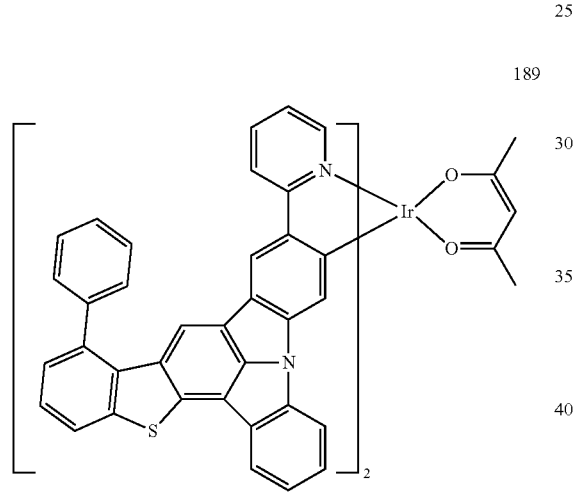
189
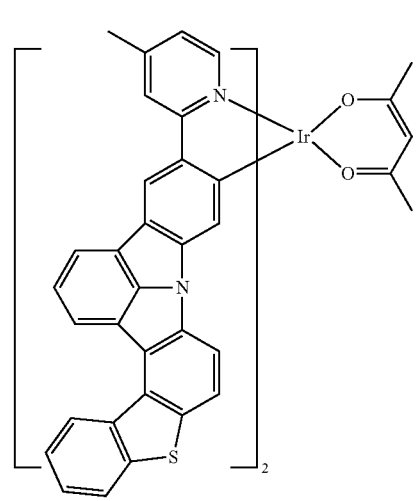
192
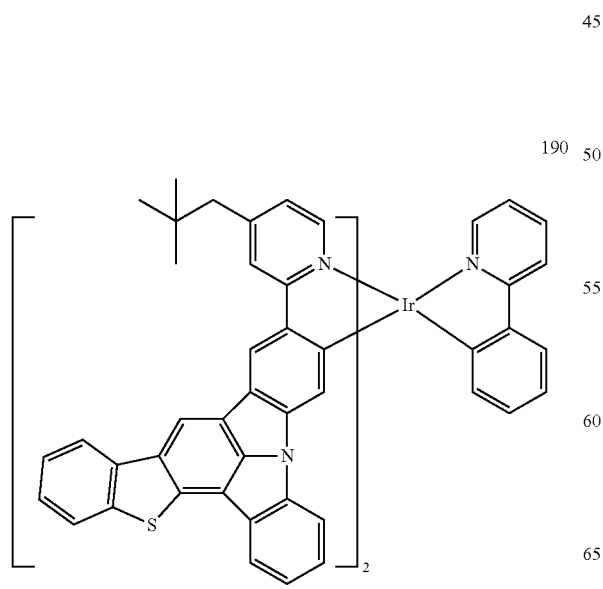
190
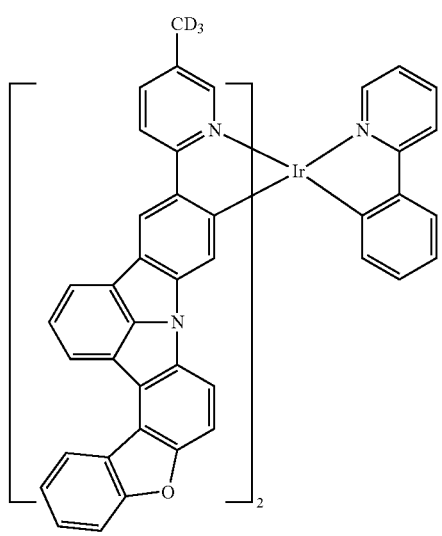
193

-continued
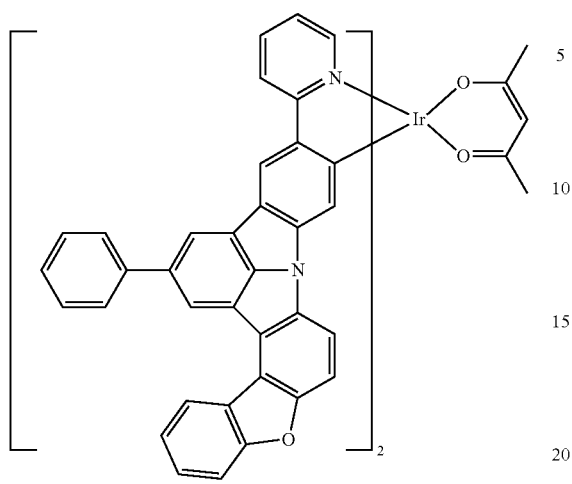
194
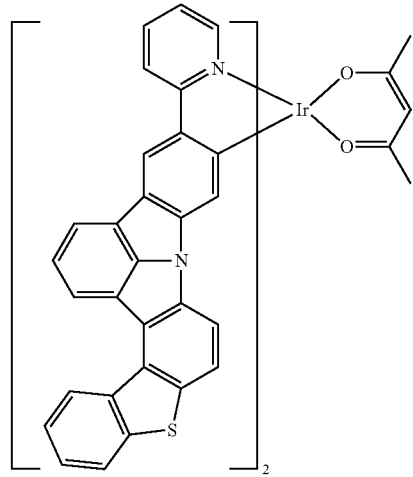
197
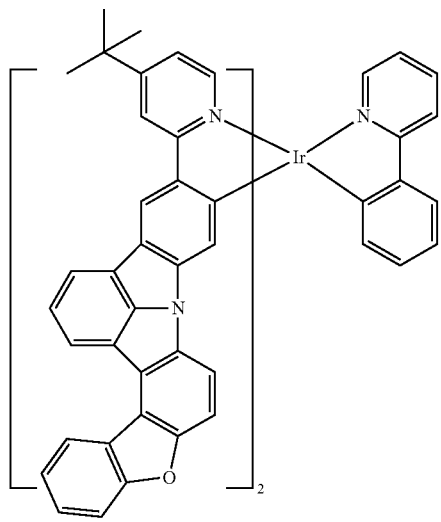
195
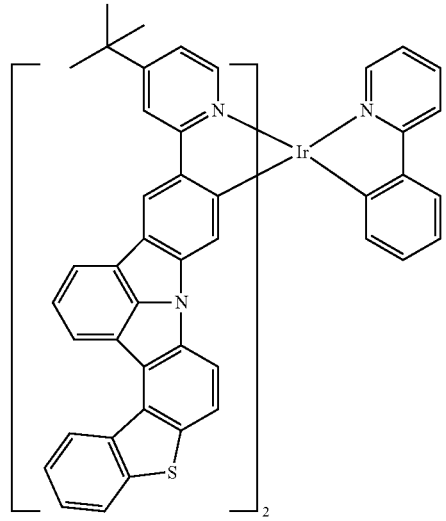
198
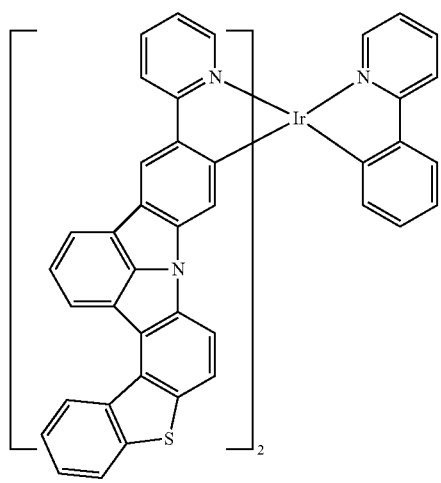
196
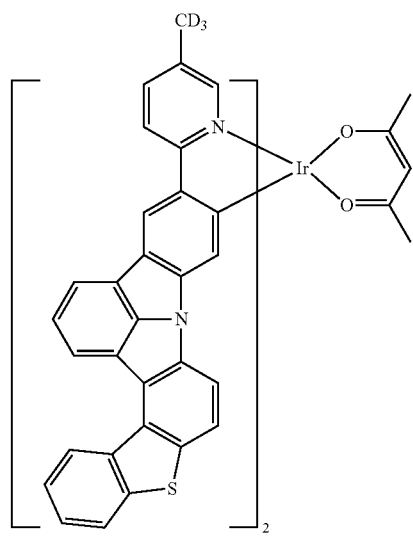
199

200
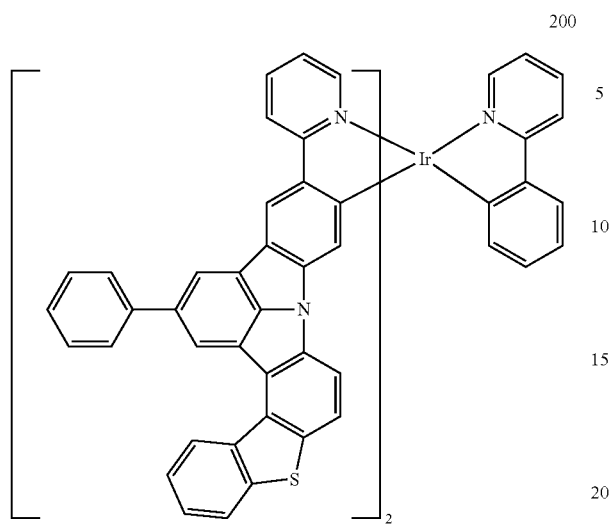
201
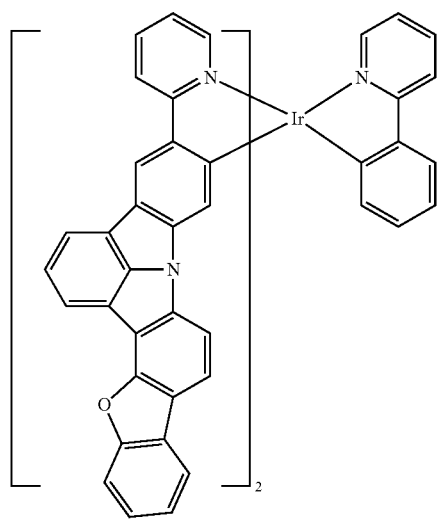
202
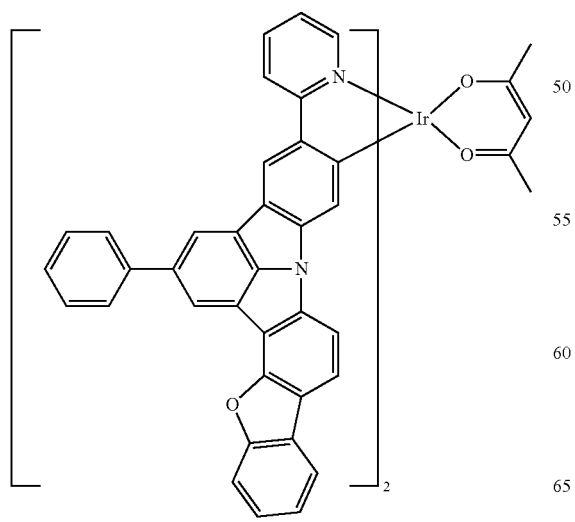
203
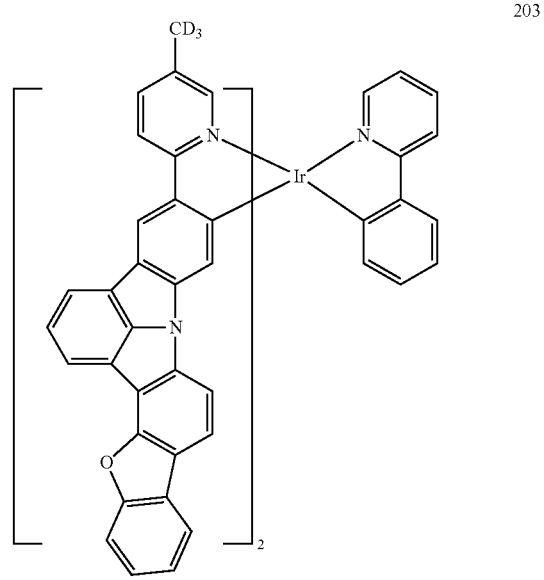
204
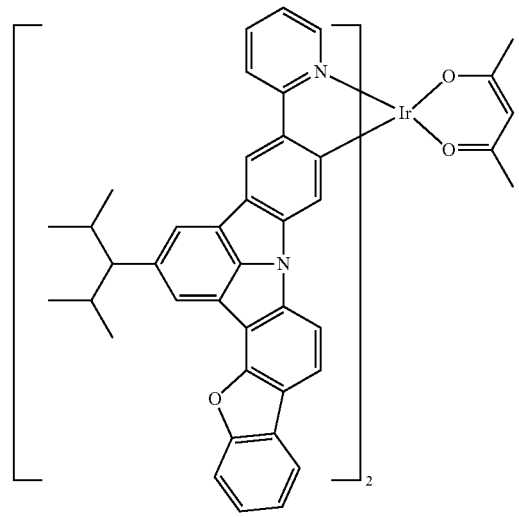
205
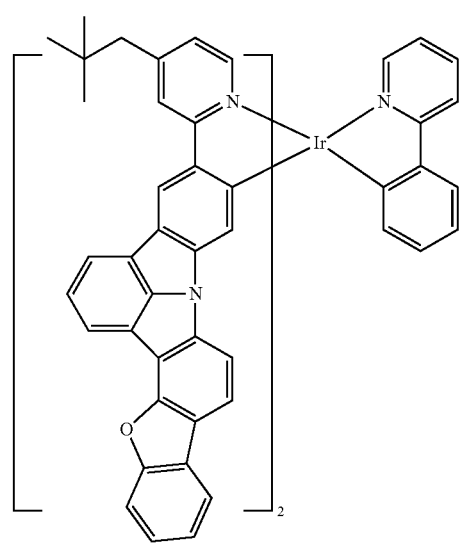

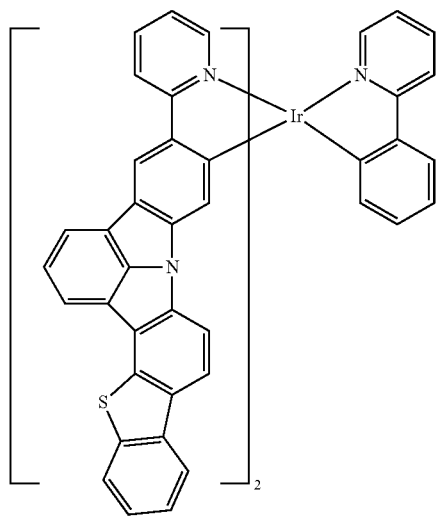
206
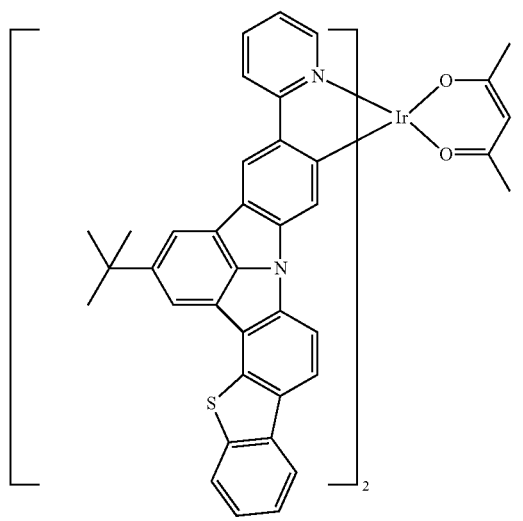
207
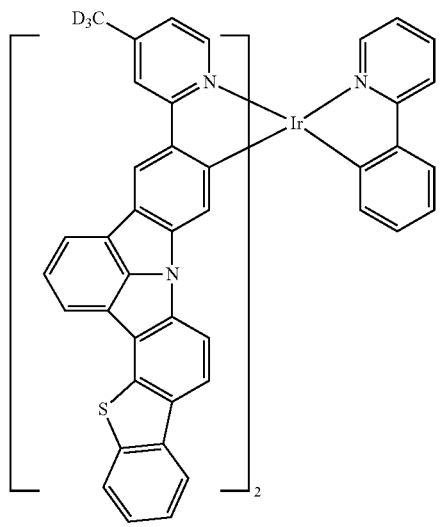
208
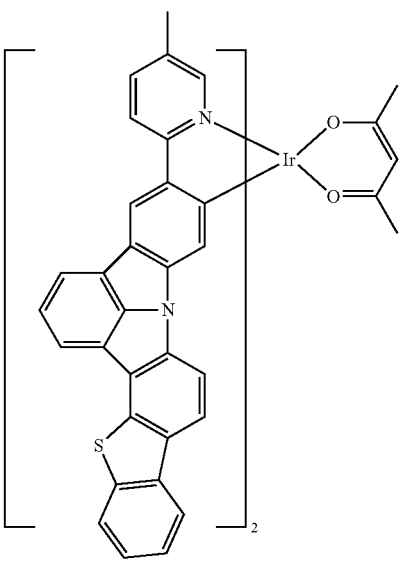
209
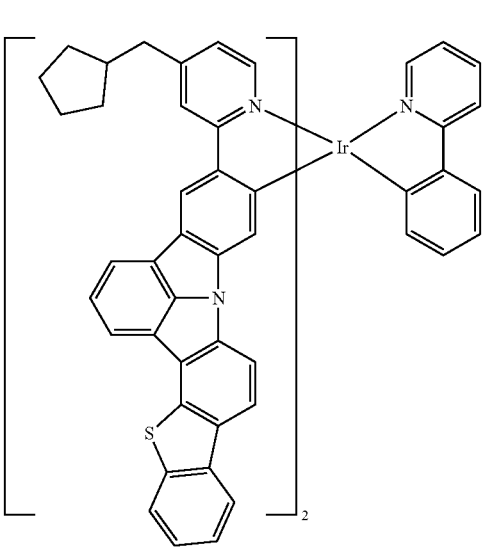
210
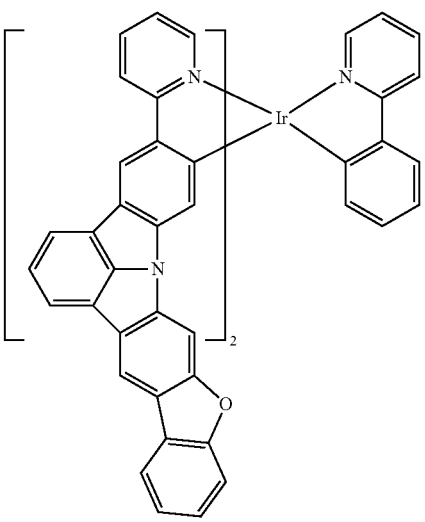
211

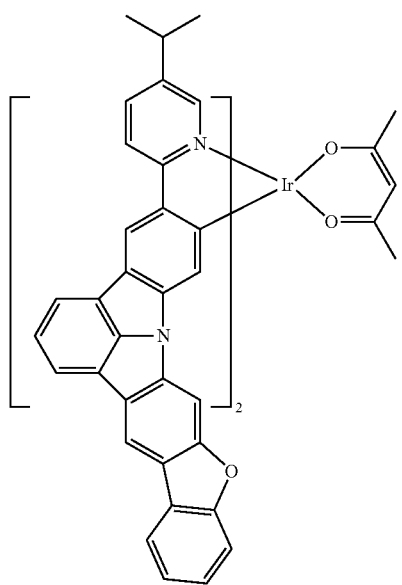
212
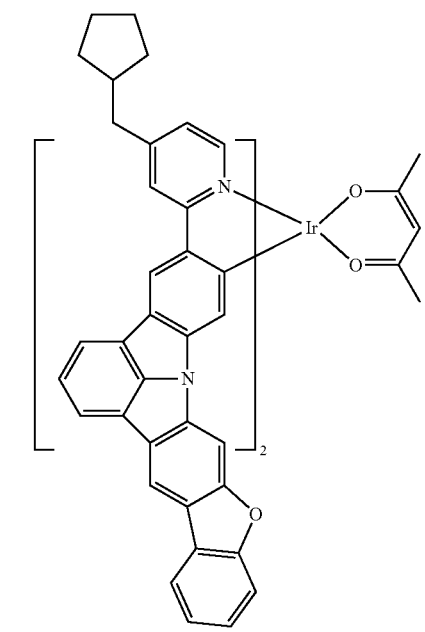
214
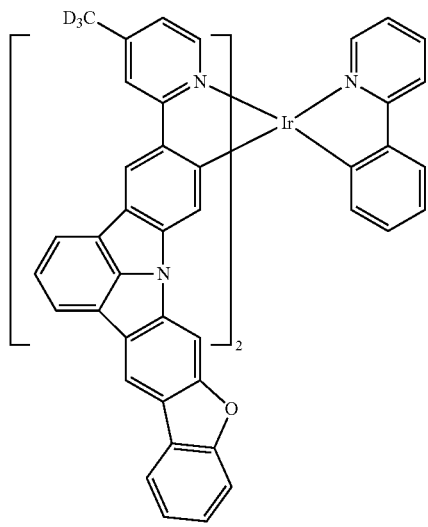
213
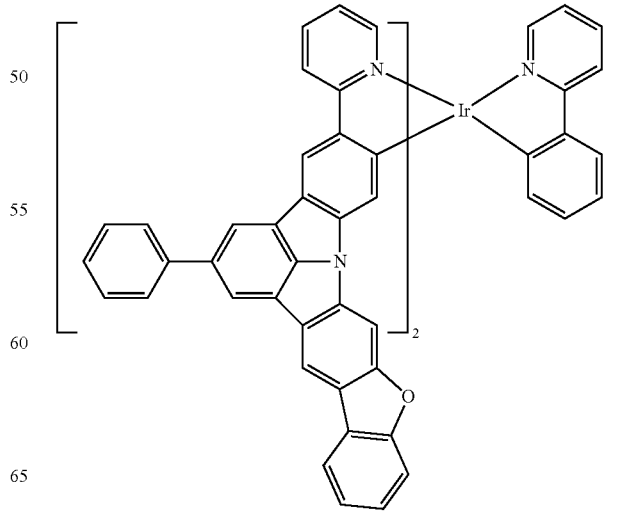
215

-continued
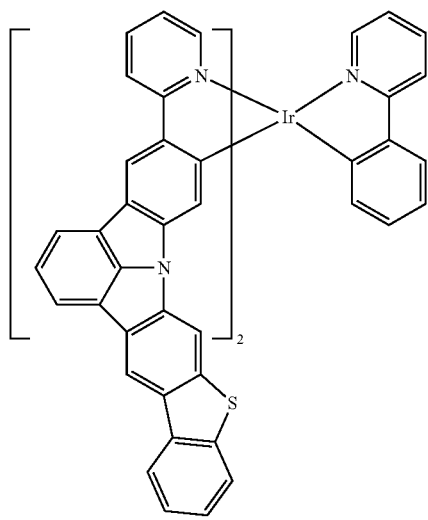
216
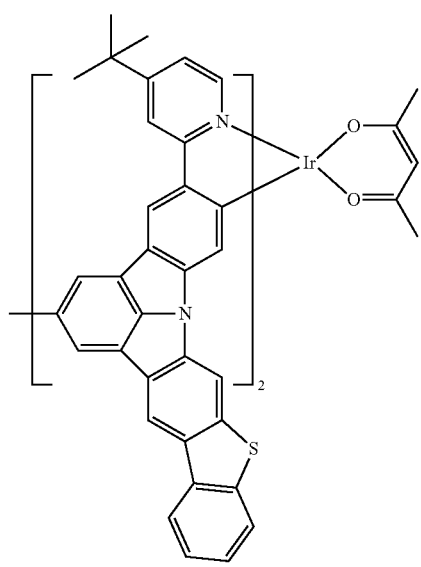
219
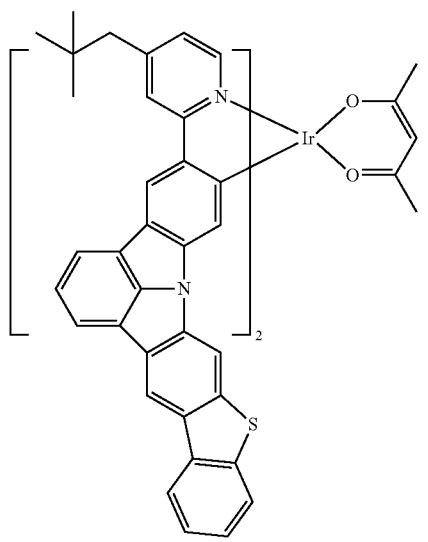
217
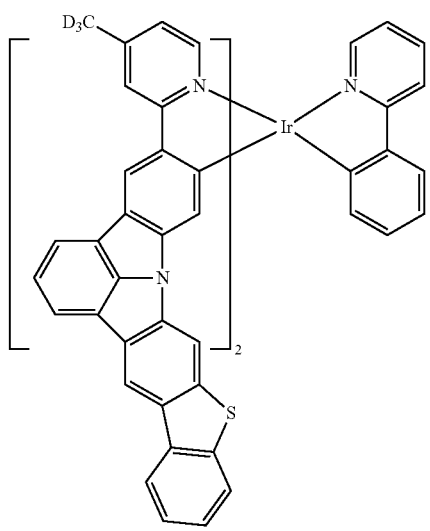
220
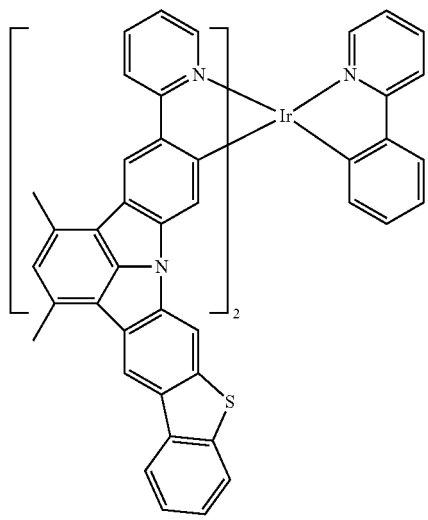
218
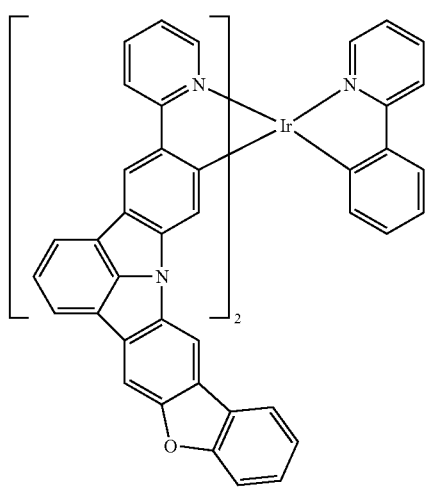
221

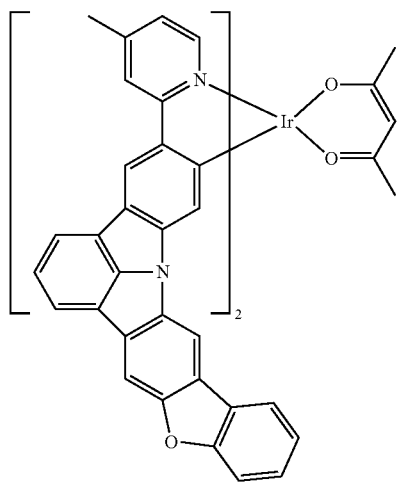
222
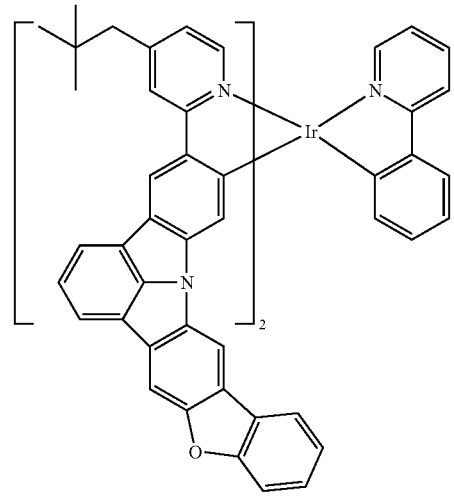
225
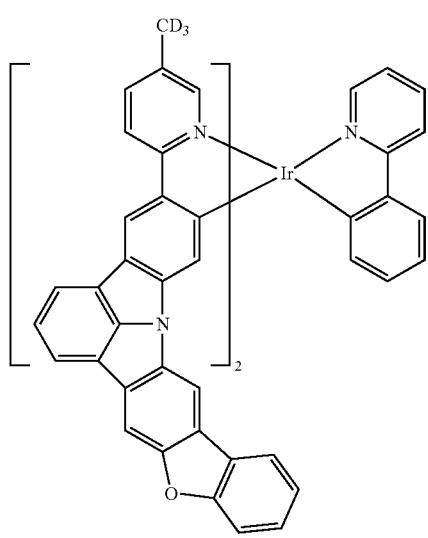
223
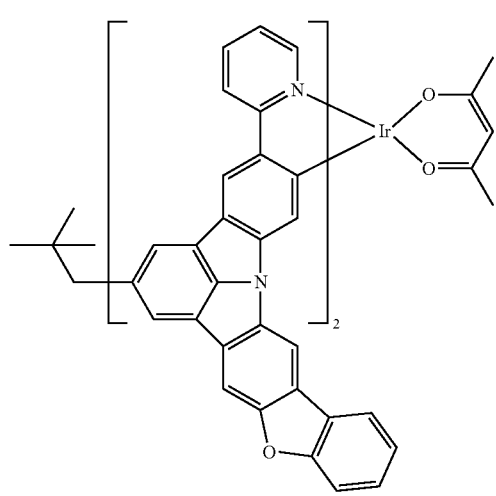
224
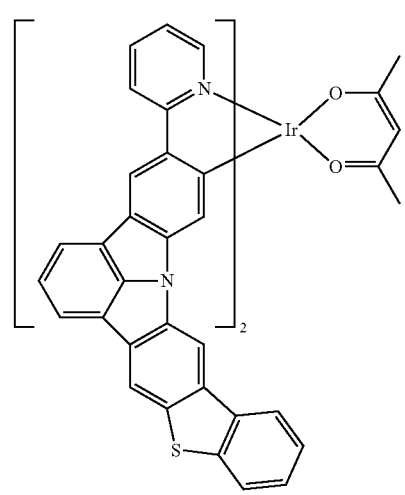
226
227

228
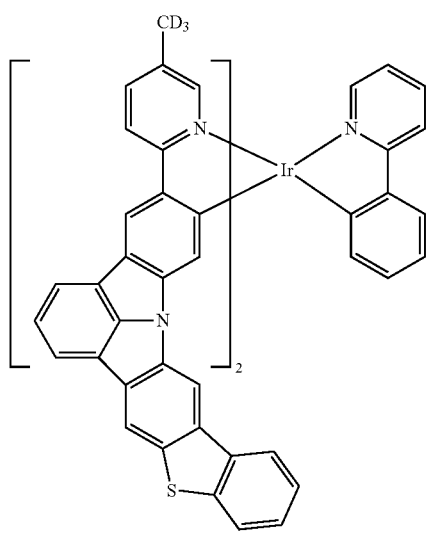
229
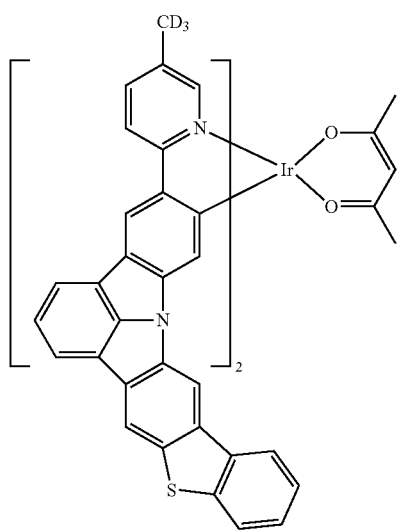
230
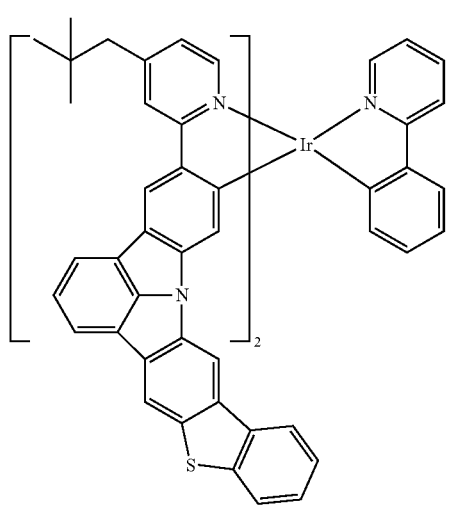
231
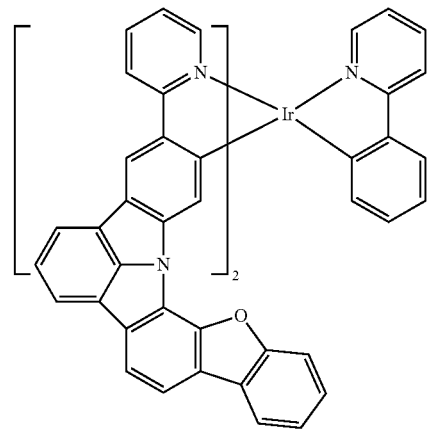
232
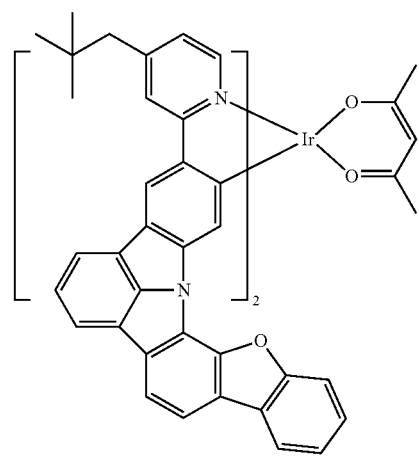
233
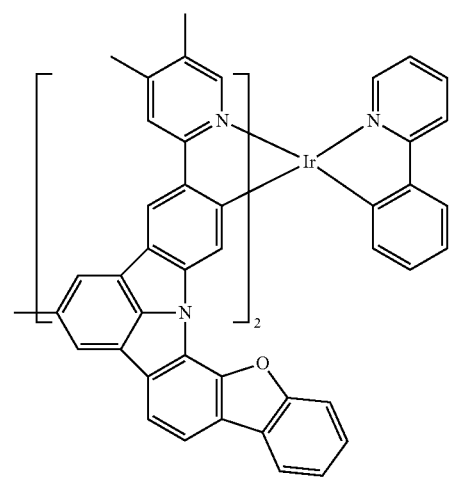

234
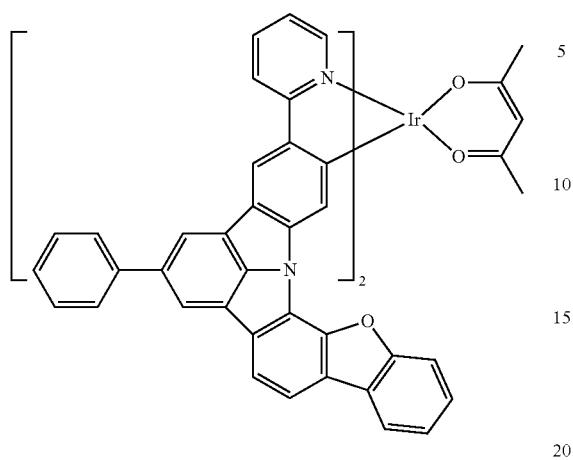
235
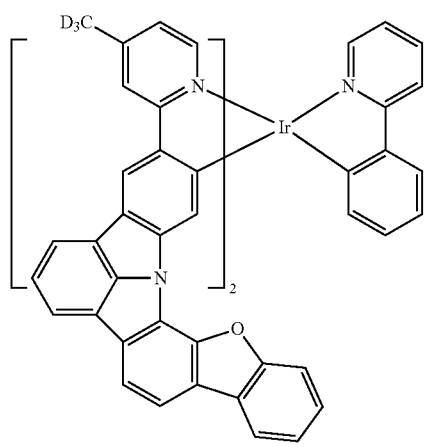
236
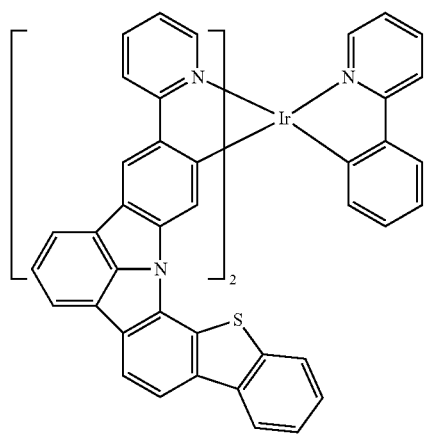
237
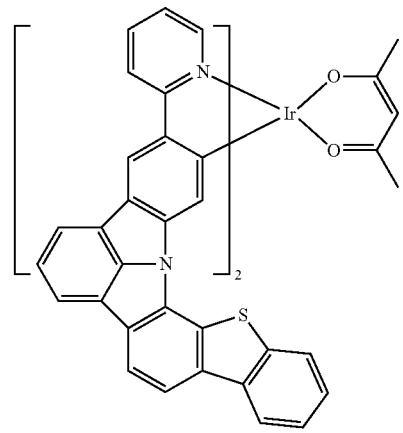
238
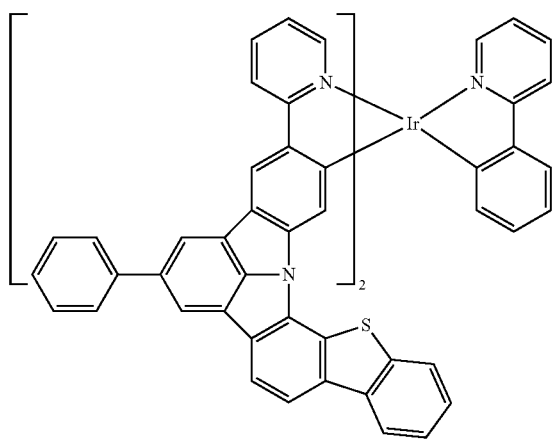
239
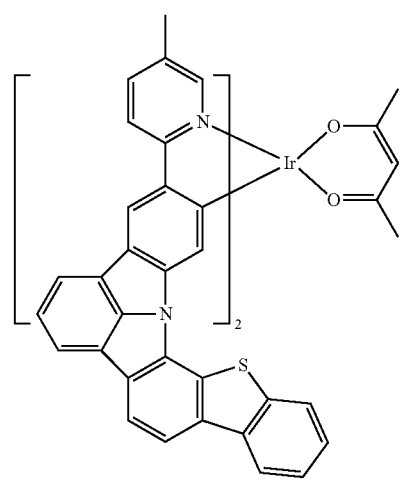

93
-continued
240
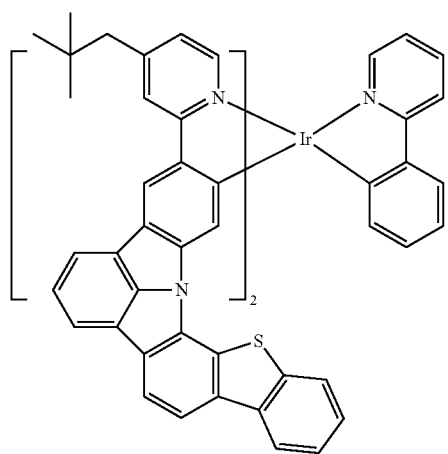
241
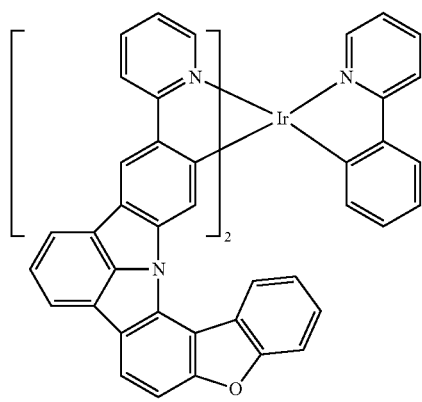
242
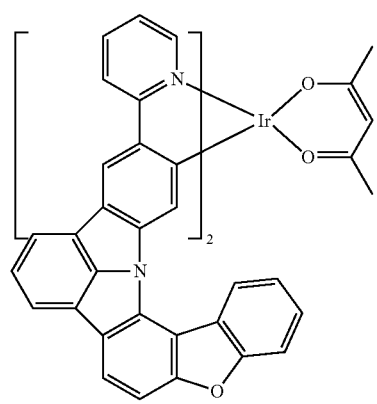
94
-continued
243
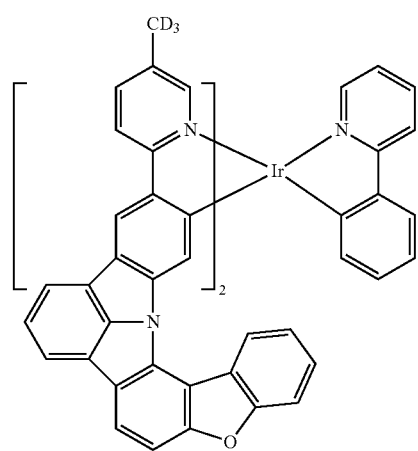
244
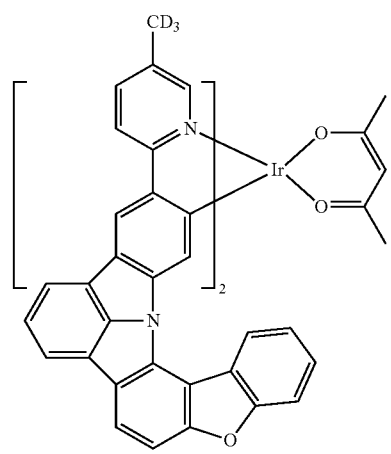
245
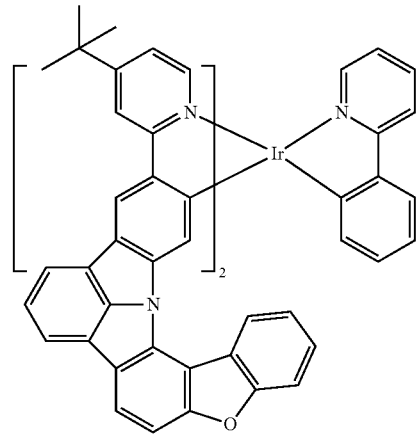

246

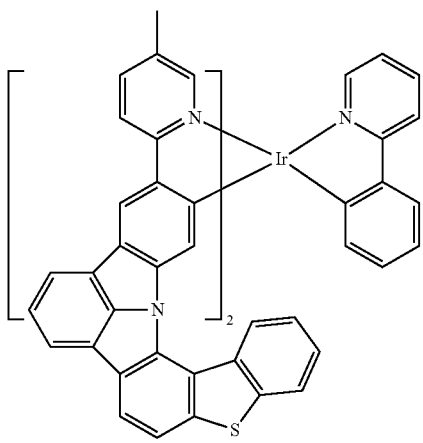

247

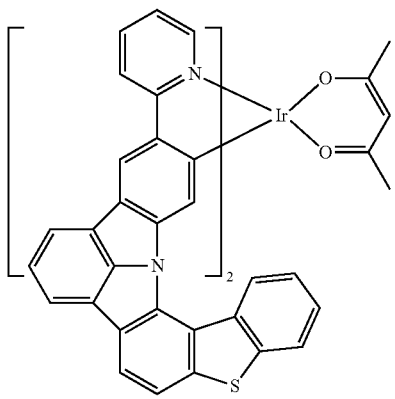

248

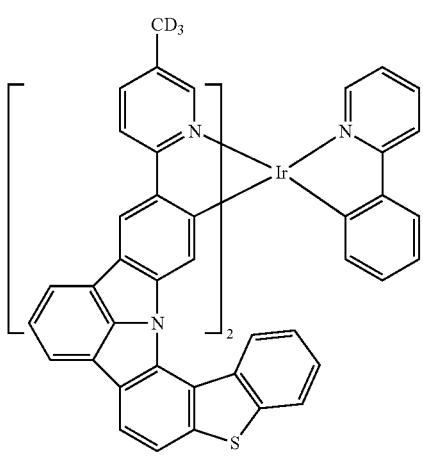

249

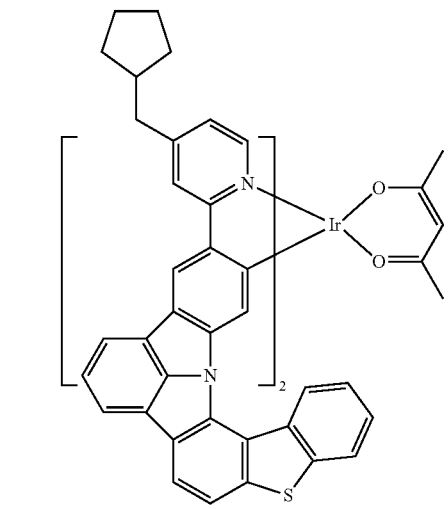

250

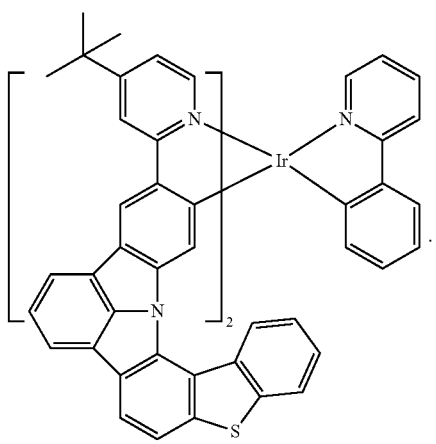

The organic metal compound having anyone of the structures of Formula 4A to Formula 6 includes a hetero aromatic ligand consisting of at least 5 rings, so it has a rigid chemical conformation. The organic metal compound can improve its color purity and luminous lifespan because it can maintain its stable chemical conformation in the emission process. In addition, since the organic metal compound may be a metal complex with bidentate ligands, it is possible to control the emission color purity and emission colors with ease. Accordingly, an organic light emitting diode having excellent luminous efficiency by applying the organic metal compound having the structure of Formulae 1 to 6 into an emissive layer.

[Organic Light Emitting Device and Organic Light Emitting Diode]

It is possible to realize an OLED having reduced driving voltage and excellent luminous efficiency and improved luminous lifespan by applying the organic compound having the structure of Formulae 1 to 6 into an emissive layer, for example an emitting material layer of the OLED. The OLED of the present disclosure may be applied to an organic light emitting device such as an organic light emitting display device or an organic light emitting illumination device. An organic light emitting display device including the OLED will be explained.

FIG. 1 is a schematic circuit diagram illustrating an organic light emitting display device in accordance with an exemplary aspect of the present disclosure. As illustrated in FIG. 1, a gate line GL, a data line DL and power line PL, each of which cross each other to define a pixel region P, in the organic light display device. A switching thin film transistor Ts, a driving thin film transistor Td, a storage capacitor Cst and an organic light emitting diode D are formed within the pixel region P. The pixel region P may include a red (R) pixel region, a green (G) pixel region and a blue (B) pixel region.

The switching thin film transistor Ts is connected to the gate line GL and the data line DL, and the driving thin film transistor Td and the storage capacitor Cst are connected between the switching thin film transistor Ts and the power line PL. The organic light emitting diode D is connected to the driving thin film transistor Td. When the switching thin film transistor Ts is turned on by a gate signal applied into the gate line GL, a data signal applied into the data line DL is applied into a gate electrode of the driving thin film transistor Td and one electrode of the storage capacitor Cst through the switching thin film transistor Ts.

The driving thin film transistor Td is turned on by the data signal applied into the gate electrode so that a current proportional to the data signal is supplied from the power line PL to the organic light emitting diode D through the driving thin film transistor Td. And then, the organic light emitting diode D emits light having a luminance proportional to the current flowing through the driving thin film transistor Td. In this case, the storage capacitor Cst is charge with a voltage proportional to the data signal so that the voltage of the gate electrode in the driving thin film transistor Td is kept constant during one frame. Therefore, the organic light emitting display device can display a desired image.

Figure 2:
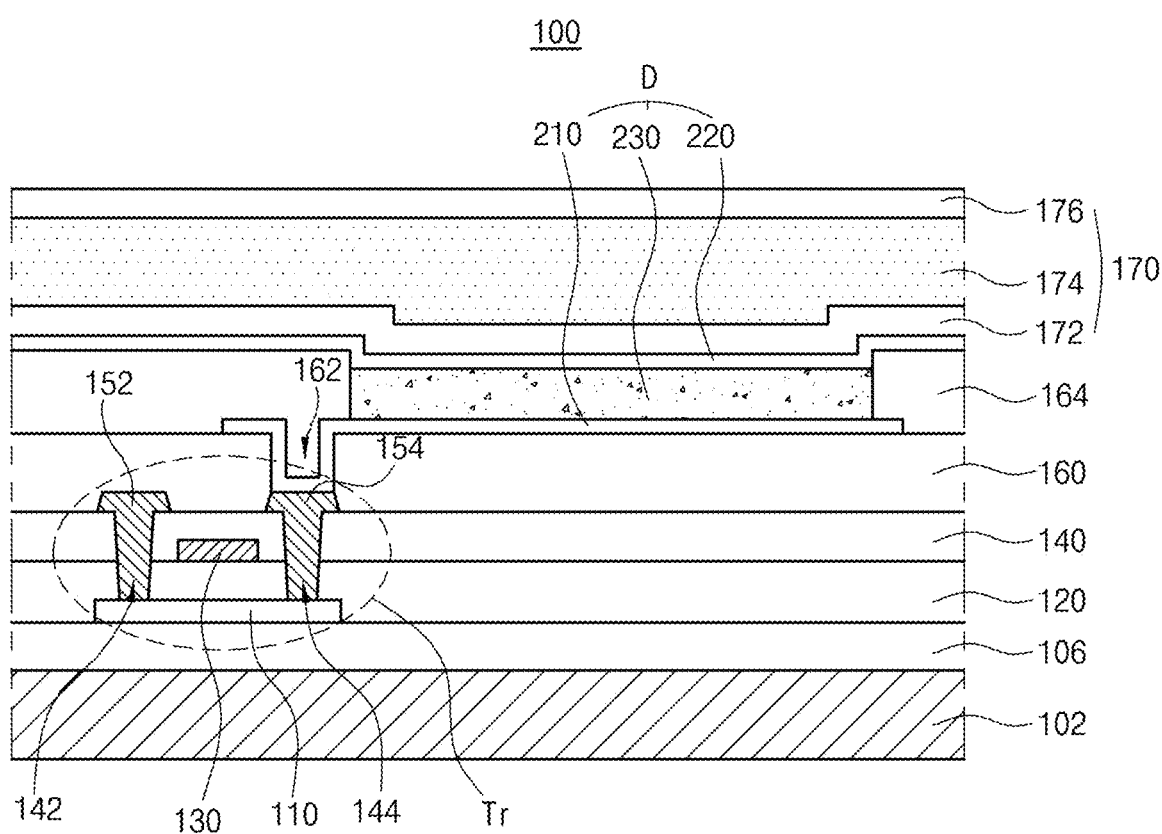
FIG. 2 is a cross-sectional view illustrating an organic light emitting display device as an example of an organic light emitting device in accordance with an exemplary aspect of the present disclosure.

FIG. 2 is a schematic cross-sectional view illustrating an organic light emitting display device in accordance with an exemplary aspect of the present disclosure. As illustrated in FIG. 2, the organic light emitting display device 100 comprises a substrate 102, a thin-film transistor Tr over the substrate 102, and an organic light emitting diode D connected to the thin film transistor Tr. As an example, the substrate 102 defines a red pixel region, a green pixel region and a blue pixel region and the organic light emitting diode D is located in each pixel region. In other words, the organic light emitting diode D, each of which emits red, green or blue light, is located correspondingly in the red pixel region, the green pixel region and the blue pixel region.

The substrate 102 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combination thereof. The substrate 102, over which the thin film transistor Tr and the organic light emitting diode D are arranged, forms an array substrate.

A buffer layer 106 may be disposed over the substrate 102, and the thin film transistor Tr is disposed over the buffer layer 106. The buffer layer 106 may be omitted.

A semiconductor layer 110 is disposed over the buffer layer 106. In one exemplary aspect, the semiconductor layer 110 may include, but is not limited to, oxide semiconductor materials. In this case, a light-shield pattern may be disposed under the semiconductor layer 110, and the light-shield pattern can prevent light from being incident toward the semiconductor layer 110, and thereby, preventing the semiconductor layer 110 from being deteriorated by the light. Alternatively, the semiconductor layer 110 may include polycrystalline silicon. In this case, opposite edges of the semiconductor layer 110 may be doped with impurities.

A gate insulating layer 120 including an insulating material is disposed on the semiconductor layer 110. The gate insulating layer 120 may include, but is not limited to, an inorganic insulating material such as silicon oxide ($SiO_x$, wherein $0 \le x \le 2$) or silicon nitride ($SiN_x$, wherein $0 \le x \le 2$).

A gate electrode 130 made of a conductive material such as a metal is disposed over the gate insulating layer 120 so as to correspond to a center of the semiconductor layer 110. While the gate insulating layer 120 is disposed over a whole area of the substrate 102 in FIG. 2, the gate insulating layer 120 may be patterned identically as the gate electrode 130.

An interlayer insulating layer 140 including an insulating material is disposed on the gate electrode 130 with covering over an entire surface of the substrate 102. The interlayer insulating layer 140 may include an inorganic insulating material such as silicon oxide ($SiO_x$) or silicon nitride ($SiN_x$), or an organic insulating material such as benzocyclobutene or photo-acryl.

The interlayer insulating layer 140 has first and second semiconductor layer contact holes 142 and 144 that expose both sides of the semiconductor layer 110. The first and second semiconductor layer contact holes 142 and 144 are disposed over opposite sides of the gate electrode 130 with spacing apart from the gate electrode 130. The first and second semiconductor layer contact holes 142 and 144 are formed within the gate insulating layer 120 in FIG. 2. Alternatively, the first and second semiconductor layer contact holes 142 and 144 are formed only within the interlayer insulating layer 140 when the gate insulating layer 120 is patterned identically as the gate electrode 130.

A source electrode 152 and a drain electrode 154, which are made of conductive material such as a metal, are disposed on the interlayer insulating layer 140. The source electrode 152 and the drain electrode 154 are spaced apart from each other with respect to the gate electrode 130, and contact both sides of the semiconductor layer 110 through the first and second semiconductor layer contact holes 142 and 144, respectively.

The semiconductor layer 110, the gate electrode 130, the source electrode 152 and the drain electrode 154 constitute the thin film transistor Tr, which acts as a driving element. The thin film transistor Tr in FIG. 2 has a coplanar structure in which the gate electrode 130, the source electrode 152 and the drain electrode 154 are disposed over the semiconductor layer 110. Alternatively, the thin film transistor Tr may have an inverted staggered structure in which a gate electrode is disposed under a semiconductor layer and a source and drain electrodes are disposed over the semiconductor layer. In this case, the semiconductor layer may include amorphous silicon.

Although not shown in FIG. 2, a gate line and a data line, which cross each other to define a pixel region, and a switching element, which is connected to the gate line and the data line, is may be further formed in the pixel region. The switching element is connected to the thin film transistor Tr, which is a driving element. In addition, a power line is spaced apart in parallel from the gate line or the data line, and the thin film transistor Tr may further include a storage capacitor configured to constantly keep a voltage of the gate electrode for one frame.

A passivation layer 160 is disposed on the source and drain electrodes 152 and 154 with covering the thin film transistor Tr over the whole substrate 102. The passivation layer 160 has a flat top surface and a drain contact hole 162 that exposes the drain electrode 154 of the thin film transistor Tr. While the drain contact hole 162 is disposed on the second semiconductor layer contact hole 144, it may be spaced apart from the second semiconductor layer contact hole 144.

The organic light emitting diode D (OLED D) includes a first electrode 210 that is disposed on the passivation layer 160 and connected to the drain electrode 154 of the thin film transistor Tr. The organic light emitting diode D further includes an emissive layer 230 and a second electrode 220 each of which is disposed sequentially on the first electrode 210.

The first electrode 210 is disposed in each pixel region. The first electrode 210 may be an anode and include conductive material having relatively high work function value. For example, the first electrode 210 may include, but is not limited to, a transparent conductive oxide (TCO) such as indium tin oxide (ITO), indium zinc oxide (IZO), indium tin zinc oxide (ITZO), SnO, ZnO, indium cerium oxide (ICO), aluminum doped zinc oxide (AZO), and the like.

In one exemplary aspect, when the organic light emitting display device 100 is a bottom-emission type, the first electrode 201 may have a single-layered structure of the TCO. Alternatively, when the organic light emitting display device 100 is a top-emission type, a reflective electrode or a reflective layer may be disposed under the first electrode 210. For example, the reflective electrode or the reflective layer may include, but are not limited to, silver (Ag) or aluminum-palladium-copper (APC) alloy. In the OLED D of the top-emission type, the first electrode 210 may have a triple-layered structure of ITO/Ag/ITO or ITO/APC/ITO.

In addition, a bank layer 164 is disposed on the passivation layer 160 in order to cover edges of the first electrode 210. The bank layer 164 exposes a center of the first electrode 210 corresponding to each pixel region. The bank layer 164 may be omitted.

An emissive layer 230 is disposed on the first electrode 210. In one exemplary aspect, the emissive layer 230 may have a single-layered structure of an emitting material layer (EML). Alternatively, the emissive layer 230 may have a multiple-layered structure of a hole injection layer (HIL), a hole transport layer (HTL), an electron blocking layer (EBL), an EML, a hole blocking layer (HBL), an electron transport layer (ETL) and/or an electron injection layer (EIL) (see, FIGS. 3, 5 and 6). In one aspect, the emissive layer 230 may have single emitting part. Alternatively, the emissive layer 230 may have multiple emitting parts to form a tandem structure.

The emissive layer 230 may comprise the organic metal compound having the structure of Formulae 1 to 6. The emissive layer 230 including the organic metal compound enables the OLED D and the organic light emitting device 100 to improve their luminous efficiency and luminous lifespan considerably.

The second electrode 220 is disposed over the substrate 102 above which the emissive layer 230 is disposed. The second electrode 220 may be disposed over a whole display area, and may include a conductive material with a relatively low work function value compared to the first electrode 210, and may be a cathode. For example, the second electrode 220 may include, but is not limited to, aluminum (Al), magnesium (Mg), calcium (Ca), silver (Ag), alloy thereof or combination thereof such as aluminum-magnesium alloy (Al—Mg). When the organic light emitting display device 100 is a top-emission type, the second electrode 220 is thin so as to have light-transmissive (semi-transmissive) property.

In addition, an encapsulation film 170 may be disposed over the second electrode 220 in order to prevent outer moisture from penetrating into the organic light emitting diode D. The encapsulation film 170 may have, but is not limited to, a laminated structure of a first inorganic insulating film 172, an organic insulating film 174 and a second inorganic insulating film 176. The encapsulation film 170 may be omitted.

A polarizing plate may be attached onto the encapsulation film to reduce reflection of external light. For example, the polarizing plate may be a circular polarizing plate. When the organic light emitting display device 100 is a bottom-emission type, the polarizer may be disposed under the substrate 100. Alternatively, when the organic light emitting display device 100 is a top-emission type, the polarizer may be disposed over the encapsulation film 170. In addition, a cover window may be attached to the encapsulation film 170 or the polarizer. In this case, the substrate 110 and the cover window may have a flexible property, thus the organic light emitting display device 100 may be a flexible display device.

Figure 3:
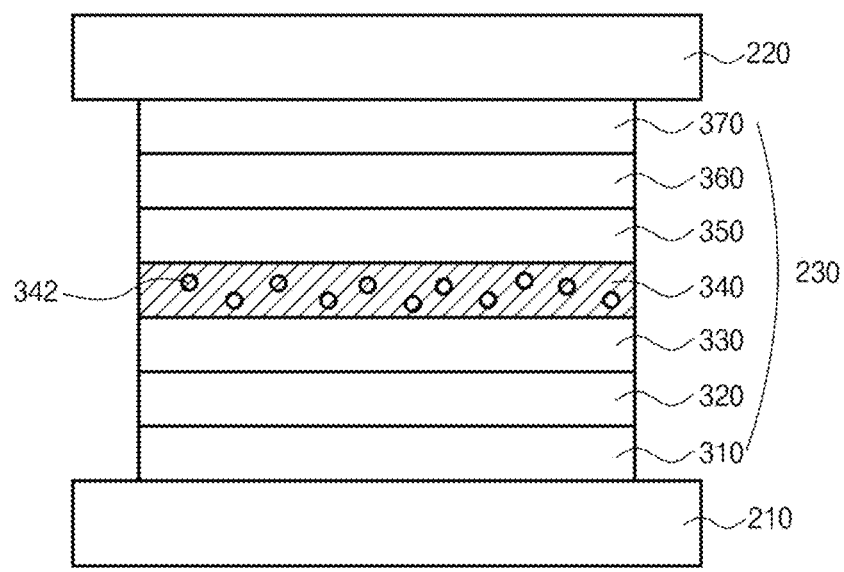
FIG. 3 is a cross-sectional view illustrating an organic light emitting diode having single emitting part in accordance with an exemplary aspect of the present disclosure.

Next, we will describe the OLED D including the organic metal compound in more detail. FIG. 3 is a schematic cross-sectional view illustrating an organic light emitting diode having a single emitting part in accordance with an exemplary embodiment of the present disclosure. As illustrated in FIG. 3, the organic light emitting diode D1 (OLED D1) in accordance with the present disclosure includes first and second electrodes 210 and 220 facing each other and an emissive layer 230 disposed between the first and second electrodes 210 and 220. The organic light emitting display device 100 includes a red pixel region, a green pixel region and a blue pixel region, and the OLED D1 may be disposed in the green pixel region.

In an exemplary embodiment, the emissive layer 230 includes an emitting material layer (EML) 340 disposed between the first and second electrodes 210 and 220. Also, the emissive layer 230 may comprise at least one of an HTL 320 disposed between the first electrode 210 and the EML 340 and an ETL 360 disposed between the second electrode 220 and the EML 340. In addition, the emissive layer 230 may further comprise at least one of an HIL 310 disposed between the first electrode 210 and the HTL 320 and an EIL 370 disposed between the second electrode 220 and the ETL 360. Alternatively, the emissive layer 320 may further comprise a first exciton blocking layer, i.e. an EBL 330 disposed between the HTL 320 and the EML 340 and/or a second exciton blocking layer, i.e. a HBL 350 disposed between the EML 340 and the ETL 360.

The first electrode 210 may be an anode that provides a hole into the EML 340. The first electrode 210 may include a conductive material having a relatively high work function value, for example, a transparent conductive oxide (TCO). In an exemplary embodiment, the first electrode 210 may include, but is not limited to, ITO, IZO, ITZO, SnO, ZnO, ICO, AZO, and the like.

The second electrode 220 may be a cathode that provides an electron into the EML 340. The second electrode 220 may include a conductive material having a relatively low work function values, i.e., a highly reflective material such as Al, Mg, Ca, Ag, alloy thereof or combination thereof such as Al—Mg.

The HIL 310 is disposed between the first electrode 210 and the HTL 320 and improves an interface property between the inorganic first electrode 210 and the organic HTL 320.

In one exemplary embodiment, the HIL 310 may include, but is not limited to, 4,4'4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino)triphenylamine (2T-NATA), Copper phthalocyanine (CuPc), Tris (4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl] benzene (TDAPB), poly(3,4-ethylenedioxythiophene)polystyrene sulfonate (PEDOT/PSS), 2,3,5,6-tetrafluoro-7,7,8,8-tetracyanoquinodimethane (F4TCNQ), N-(biphenyl-4-yl)-9,9-dimethyl-N-(4-(9-phenyl-9H-carbazol-3-yl)phenyl)-9H-fluoren-2-amine, N,N'-diphenyl-N,N'-di[4-(N,N'-diphenyl-amino)phenyl]benzidine (NPNPB) and combination thereof. The HIL 310 may be omitted in compliance of the OLED D1 property.

The HTL 320 is disposed adjacently to the EML 340 between the first electrode 210 and the EML 340. In one exemplary embodiment, the HTL 320 may include, but is not limited to, N,N'-Diphenyl-N,N'-bis(3-methylphenyl-1,1'-biphenyl-4,4'-diamine (TPD), N,N'-Di(1-naphthyl)-N,N'-diphenyl-(1,1'-biphenyl)-4,4'-diamine (NPB or NPD), N,N'-bis[4-[bis(3-methylphenyl)amino]phenyl]-N,N'-diphenyl-[1,1'-biphenyl]-4,4'-diamine (DNTPD), 4,4'-bis(N-carbazolyl)-1,1'-biphenyl (CBP), Poly[N,N'-bis(4-butylphenyl)-N,N'-bis(phenyl)-benzidine] (Poly-TPD), Poly[(9,9-dioctylfluorenyl-2,7-diyl)-co-(4,4'-(N-(4-sec-butylphenyl)diphenylamine))] (TFB), 1,1-bis(4-(N,N'-di(p-tolyl)amino)phenyl)cyclohexane (TAPC), 3,5-Di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenyl-9H-carbazol-3-yl)phenyl)-9H-fluoren-2-amine and combination thereof.

The EML 340 may comprise a host (first host) and a dopant (first dopant) 342 in which substantial emission is occurred. As an example, the EML 340 may emit green colors. For example, the organic metal compound having the structure of Formulae 1 to 6 may be used as the dopant 342 in the EML 340.

The ETL 360 and the EIL 370 may be laminated sequentially between the EML 340 and the second electrode 220. The ETL 360 includes a material having high electron mobility so as to provide electrons stably with the EML 340 by fast electron transportation.

In one exemplary aspect, the ETL 360 may comprise, but is not limited to, at least one of oxadiazole-based compounds, triazole-based compounds, phenanthroline-based compounds, benzoxazole-based compounds, benzothiazole-based compounds, benzimidazole-based compounds, triazine-based compounds, and the like.

As an example, the ETL 360 may comprise, but is not limited to, tris-(8-hydroxyquinoline aluminum ($Alq_3$), Bis (2-methyl-8-quinolinolato-N1,O8)-(1,1'-biphenyl-4-olato) aluminum (BAlq), lithium quinolate (Liq), 2-biphenyl-4-yl-5-(4-t-butylphenyl)-1,3,4-oxadiazole (PBD), spiro-PBD, 1,3,5-Tris(N-phenylbenzimidazol-2-yl)benzene (TPBi), 4,7-diphenyl-1,10-phenanthroline (Bphen), 2,9-Bis(naphthalene-2-yl) 4,7-diphenyl-1,10-phenanthroline (NBphen), 2,9-Dimethyl-4,7-diphenyl-1,10-phenaathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl) 1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr), tris(phenylquinoxaline) (TPQ), diphenyl-4-triphenylsilyl-phenylphosphine oxide (TSPO1), 2-[4-(9,10-di-2-naphthalen-2-yl-2-anthracen-2-yl)phenyl]1-phenyl-1H-benzimidazole (ZADN) and combination thereof.

The EIL 370 is disposed between the second electrode 220 and the ETL 360, and can improve physical properties of the second electrode 220 and therefore, can enhance the lifetime of the OLED D1. In one exemplary aspect, the EIL 370 may comprise, but is not limited to, an alkali metal halide or an alkaline earth metal halide such as LiF, CsF, NaF, $BaF_2$ and the like, and/or an organic metal compound such as Liq, lithium benzoate, sodium stearate, and the like. Alternatively, the EIL 370 may be omitted.

In an alternative aspect, the electron transport material and the electron injection material may be admixed to form a single ETL-EIL. The electron transport material and the electron injection material may be mixed with, but is not limited to, about 4:1 to about 1:4 by weight, for example, about 2:1 to about 1:2.

When holes are transferred to the second electrode 220 via the EML 340 and/or electrons are transferred to the first electrode 210 via the EML 340, the OLED D1 may have short lifetime and reduced luminous efficiency. In order to prevent these phenomena, the OLED D1 in accordance with this aspect of the present disclosure may have at least one exciton blocking layer adjacent to the EML 340.

For example, the OLED D1 may include the EBL 330 between the HTL 320 and the EML 340 so as to control and prevent electron transfers. In one exemplary aspect, the EBL 330 may comprise, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, 1,3-bis(carbazol-9-yl) benzene (mCP), 3,3'-bis(N-carbazolyl)-1,1'-biphenyl (mCBP), CuPc, N,N'-bis[4-(bis(3-methylphenyl)amino) phenyl]-N,N'-diphenyl-[1,1'-biphenyl]-4,4'-diamine (DNTPD), TDAPB, DCDPA, 2,8-bis(9-phenyl-9H-carbazol-3-yl)dibenzo[b,d]thiophene and combination thereof.

In addition, the OLED D1 may further include the HBL 350 as a second exciton blocking layer between the EML 340 and the ETL 360 so that holes cannot be transferred from the EML 340 to the ETL 360. In one exemplary aspect, the HBL 350 may comprise, but is not limited to, at least one of oxadiazole-based compounds, triazole-based compounds, phenanthroline-based compounds, benzoxazole-based compounds, benzothiazole-based compounds, benzimidazole-based compounds, and triazine-based compounds each of which can be used in the ETL 360.

For example, the HBL 350 may comprise a compound having a relatively low HOMO energy level compared to the luminescent materials in EML 340. The HBL 350 may comprise, but is not limited to, $Alq_3$, BAlq, Liq, PBD, spiro-PBD, BCP, Bis-4,5-(3,5-di-3-pyridylphenyl)-2-methylpyrimidine (B3PYMPM), bis[2-(diphenylphosphino)phenyl]ether oxide (DPEPO), 9-(6-(9H-carbazol-9-yl)pyridine-3-yl)-9H-3,9'-bicarbazole, Diphenyl[4-(triphenylsilyl) phenyl]phosphine oxide (TSPO1) and combination thereof.

As described above, the EML 340 may comprise the host and the dopant 342. The dopant 342 may comprise the organic metal compound having the structure of Formulae 1 to 6.

The host used with the dopant 342 may comprise, but is not limited to, 9-(3-(9H-carbazol-9-yl)phenyl)-9H-carbazole-3-carbonitrile (mCP-CN), CBP, mCBP, mCP, DPEPO, 2,8-bis(diphenlphosphoryl)dibenzothiphene (PPT), 1,3,5-Tri[(3-pyridyl)-phen-3-yl]benzene (TmPyPB), 2,6-Di(9H-carbazol-9-yl)pyridine (PYD-2Cz), 2,8-di(9H-carbazol-9-yl)dibenzothiophene (DCzDBT), 3',5'-Di(carbazol-9-yl)-[1,1'-bipheyl]-3,5-dicarbonitrile (DCzTPA), 4'-(9H-carbazol-9-yl)biphenyl-3,5-dicarbonitrile (4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), TSPO1, 9-(9-phenyl-9H-carbazol-6-yl)-9H-carbazole (CCP), 4-(3-(triphenylene-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl) pyridin-3-yl)-9H-3,9'-bicarbazole, 9,9'-Diphenyl-9H,9'H-3,3'-bicarbazole (BCzPh), 1,3,5-Tris(carbazole-9-yl)benzene (TCP), TCTA, 4,4'-Bis(carbazole-9-yl)-2,2'-dimethylbiphenyl (CDBP), 2,7-Bis(carbazole-9-yl)-9,9-dimethylfluorene (DMFL-CBP), 2,2',7,7'-Tetrakis(carbazole-9-yl)-9,9-spiorofluorene (Spiro-CBP), 3,6-Bis(carbazole-9-yl)-9-(2-ethyl-hexyl)-9H-carbazole (TCz1) and combination thereof. For example, the contents of the dopant 342 in the EML 340 may be between about 1 wt % to about 50 wt %, for example, about 1 wt % and about 30 wt %.

As described above, since the organic metal compound having the structure of Formulae 1 to 6 has a rigid chemical conformation, it can show excellent color purity and luminous lifespan with maintaining its stable chemical conformation in the luminous process. Changing the structure of the bidentate ligands and substituents to the ligand allows the organic metal compound to control its luminescent color. Accordingly, the OLED D1 can lower its driving voltage and improve its luminous efficiency and luminous lifespan.

In the above exemplary first aspect, the OLED and the organic light emitting display device include single emitting part emitting green color. Alternatively, the OLED may include multiple emitting parts (see, FIG. 5) each of which includes an emitting material layer having the organic metal compound having the structure of Formulae 1 to 6.

Figure 4:
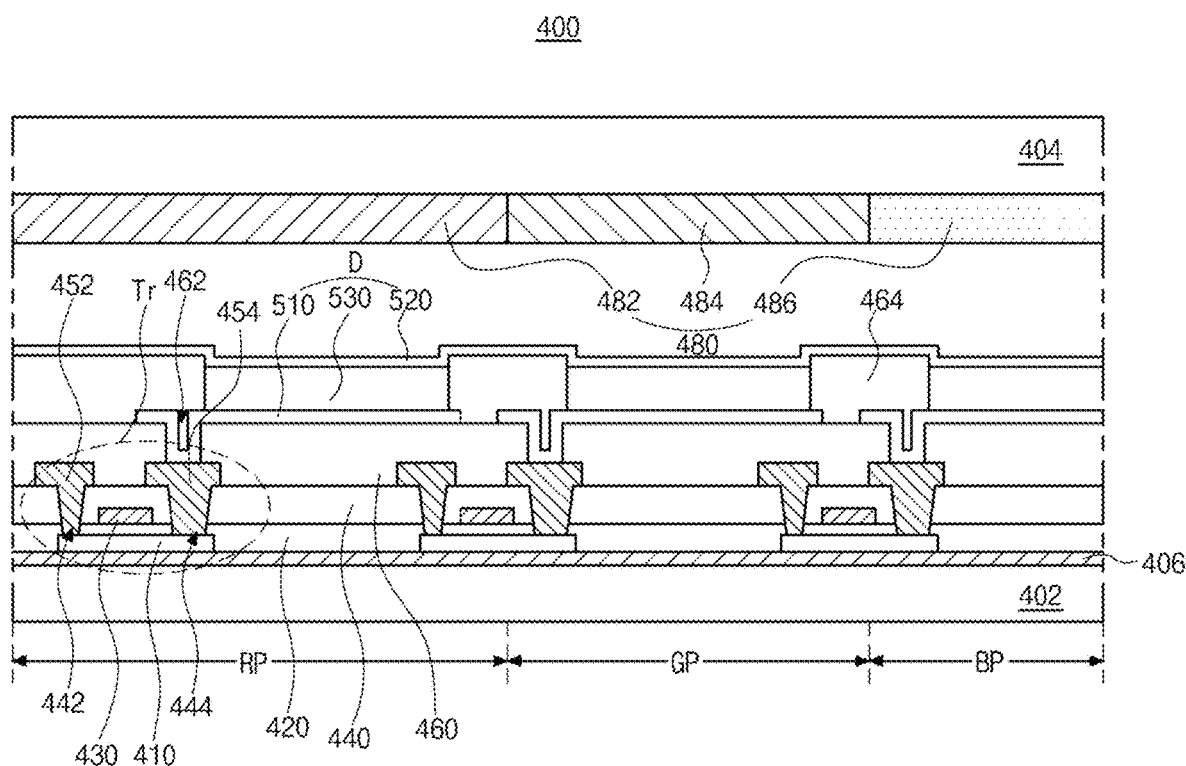
FIG. 4 is a cross-sectional view illustrating an organic light emitting display device in accordance with another exemplary aspect of the present disclosure.

In another exemplary aspect, an organic light emitting display device can implement full-color including white color. FIG. 4 is a schematic cross-sectional view illustrating an organic light emitting display device in accordance with another exemplary aspect of the present disclosure.

As illustrated in FIG. 4, the organic light emitting display device 400 comprises a first substrate 402 that defines each of a red pixel region RP, a green pixel region GP and a blue pixel region BP, a second substrate 404 facing the first substrate 402, a thin film transistor Tr over the first substrate 402, an organic light emitting diode D disposed between the first and second substrates 402 and 404 and emitting white (W) light and a color filter layer 480 disposed between the organic light emitting diode D and the second substrate 404.

Each of the first and second substrates 402 and 404 may include, but is not limited to, glass, flexible material and/or polymer plastics. For example, each of the first and second substrates 402 and 404 may be made of PI, PES, PEN, PET, PC and combination thereof. The first substrate 402, over which a thin film transistor Tr and an organic light emitting diode D are arranged, forms an array substrate.

A buffer layer 406 may be disposed over the first substrate 402, and the thin film transistor Tr is disposed over the buffer layer 406 correspondingly to each of the red pixel region RP, the green pixel region GP and the blue pixel region BP. The buffer layer 406 may be omitted.

A semiconductor layer 410 is disposed over the buffer layer 406. The semiconductor layer 410 may be made of oxide semiconductor material or polycrystalline silicon.

A gate insulating layer 420 including an insulating material, for example, inorganic insulating material such as silicon oxide ($SiO_x$, wherein $0 \le x \le 2$) or silicon nitride ($SiN_x$, wherein $0 \le x \le 2$) is disposed on the semiconductor layer 410.

A gate electrode 430 made of a conductive material such as a metal is disposed over the gate insulating layer 420 so as to correspond to a center of the semiconductor layer 410. An interlayer insulting layer 440 including an insulating material, for example, inorganic insulating material such as $SiO_x$ or $SiN_x$, or an organic insulating material such as benzocyclobutene or photo-acryl, is disposed on the gate electrode 430.

The interlayer insulating layer 440 has first and second semiconductor layer contact holes 442 and 444 that expose both sides of the semiconductor layer 410. The first and second semiconductor layer contact holes 442 and 444 are disposed over opposite sides of the gate electrode 430 with spacing apart from the gate electrode 430.

A source electrode 452 and a drain electrode 454, which are made of a conductive material such as a metal, are disposed on the interlayer insulating layer 440. The source electrode 452 and the drain electrode 454 are spaced apart from each other with respect to the gate electrode 430, and contact both sides of the semiconductor layer 410 through the first and second semiconductor layer contact holes 442 and 444, respectively.

The semiconductor layer 410, the gate electrode 430, the source electrode 452 and the drain electrode 454 constitute the thin film transistor Tr, which acts as a driving element.

Although not shown in FIG. 4, a gate line and a data line, which cross each other to define a pixel region, and a switching element, which is connected to the gate line and the data line, is may be further formed in the pixel region. The switching element is connected to the thin film transistor Tr, which is a driving element. In addition, a power line is spaced apart in parallel from the gate line or the data line, and the thin film transistor Tr may further include a storage capacitor configured to constantly keep a voltage of the gate electrode for one frame.

A passivation layer 460 is disposed on the source and drain electrodes 452 and 454 with covering the thin film transistor Tr over the whole first substrate 402. The passivation layer 460 has a drain contact hole 462 that exposes the drain electrode 454 of the thin film transistor Tr.

The OLED D is located over the passivation layer 460. The OLED D includes a first electrode 510 that is connected to the drain electrode 454 of the thin film transistor Tr, a second electrode 520 facing from the first electrode 510 and an emissive layer 530 disposed between the first and second electrodes 510 and 520.

The first electrode 510 formed for each pixel region may be an anode and may include a conductive material having relatively high work function value. For example, the first electrode 510 may include, ITO, IZO, ITZO, SnO, ZnO, ICO, AZO, and the like. Alternatively, a reflective electrode or a reflective layer may be disposed under the first electrode 510. For example, the reflective electrode or the reflective layer may include, but is not limited to, Ag or APC alloy.

A bank layer 464 is disposed on the passivation layer 460 in order to cover edges of the first electrode 510. The bank layer 464 exposes a center of the first electrode 510 corresponding to each of the red pixel RP, the green pixel GP and the blue pixel BP. The bank layer 464 may be omitted.

Figure 5:
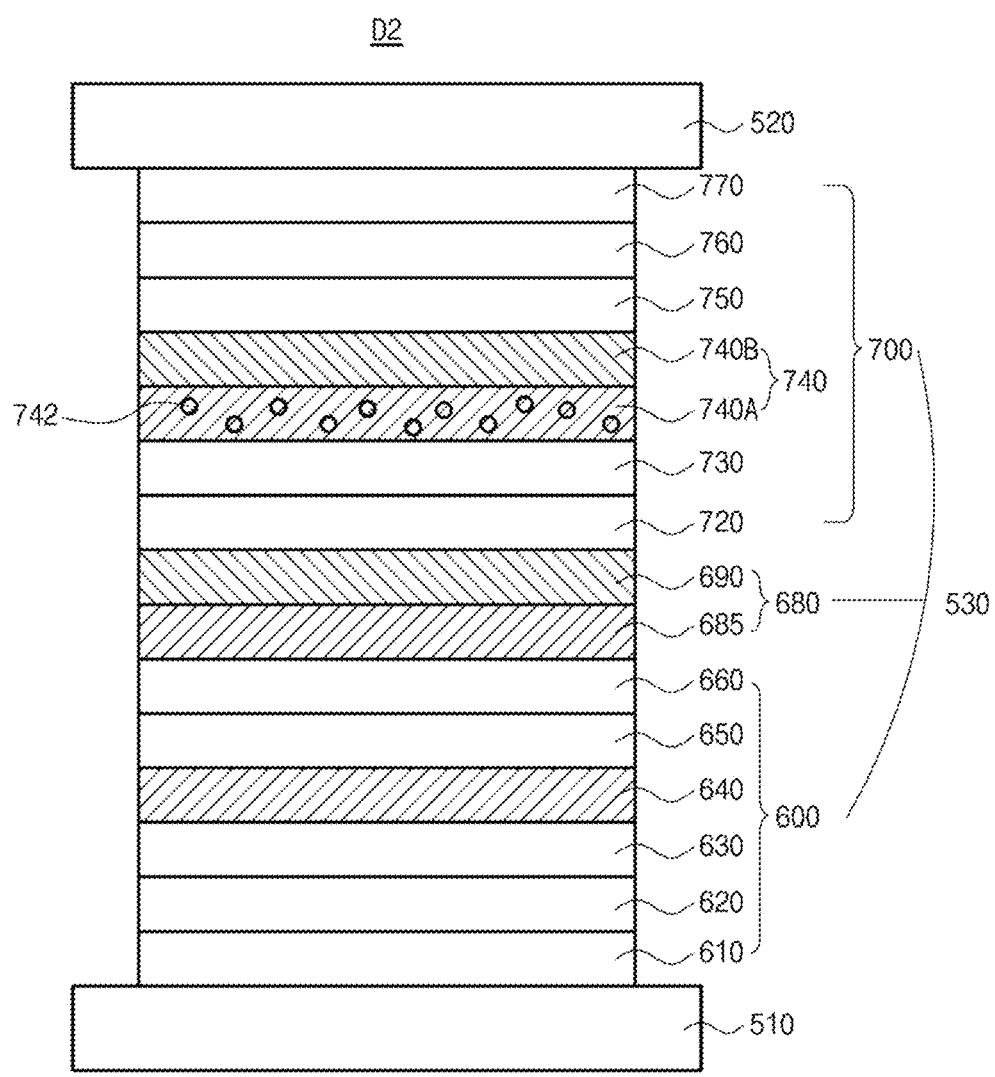
FIG. 5 is a cross-sectional view illustrating an organic light emitting diode having a double-stack structure in accordance with still another exemplary aspect of the present disclosure.
Figure 6:
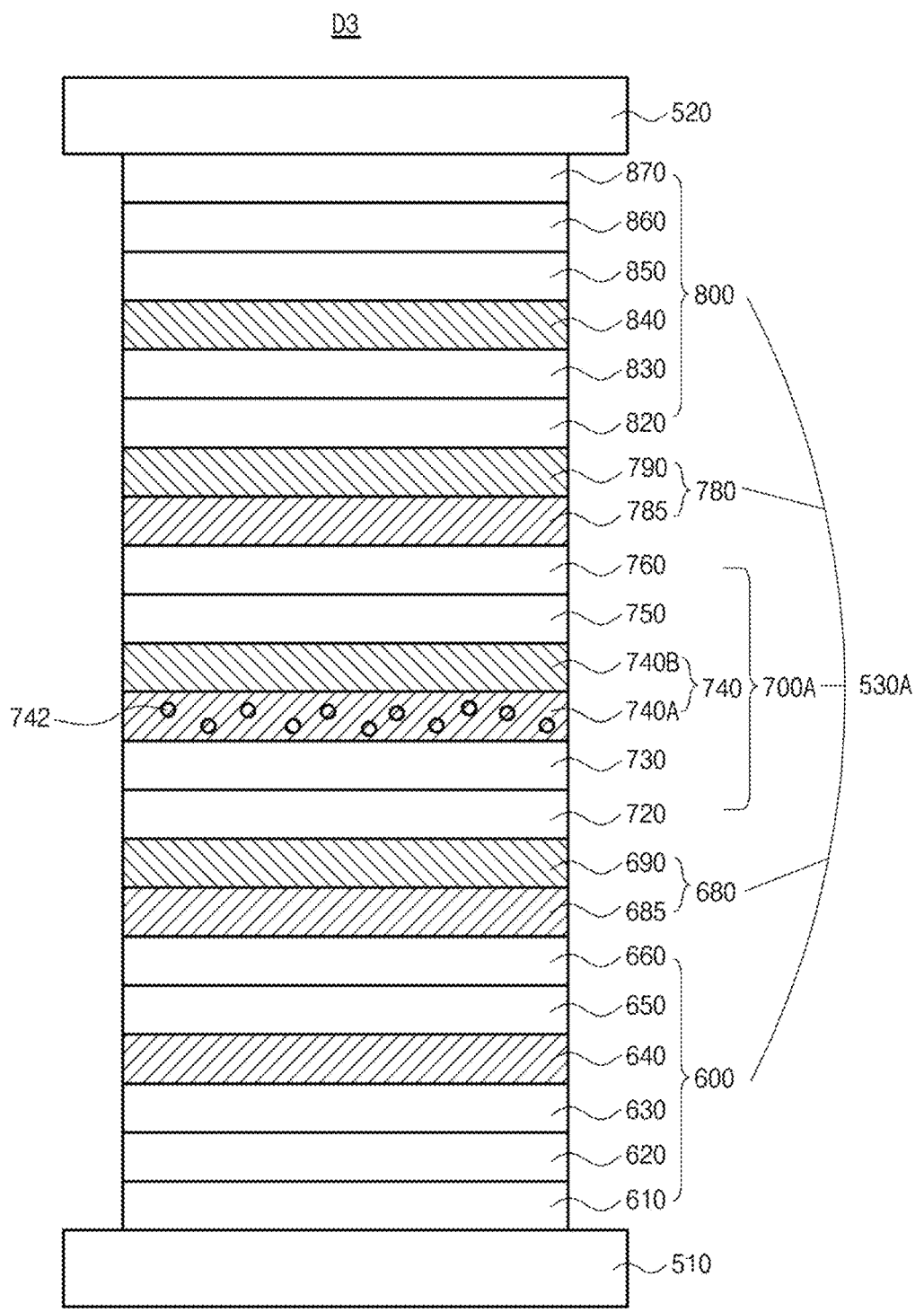
FIG. 6 is a cross-sectional view illustrating an organic light emitting diode having a triple-stack structure in accordance with still further another exemplary aspect of the present disclosure.

An emissive layer 530 that may include emitting parts is disposed on the first electrode 510. As illustrated in FIGS. 5 and 6, the emissive layer 530 may include multiple emitting parts 600, 700, 700A and 800 and at least one charge generation layer 680 and 780. Each of the emitting parts 600, 700, 700A and 800 includes at least one emitting material layer and may further include a hole injection layer, a hole transport layer, an electron blocking layer, a hole blocking layer, an electron transport layer and/or an electron injection layer.

The second electrode 520 is disposed over the first substrate 402 above which the emissive layer 530 is disposed. The second electrode 520 may be disposed over a whole display area, and may include a conductive material with a relatively low work function value compared to the first electrode 510, and may be a cathode. For example, the second electrode 520 may include, but is not limited to, Al, Mg, Ca, Ag, alloy thereof or combination thereof such as Al—Mg.

Since the light emitted from the emissive layer 530 is incident to the color filter layer 480 through the second electrode 520 in the organic light emitting display device 400 in accordance with the second embodiment of the present disclosure, the second electrode 520 has a thin thickness so that the light can be transmitted.

The color filter layer 480 is disposed over the OLED D and includes a red color filter 482, a green color filter 484 and a blue color filter 486 each of which is disposed correspondingly to the red pixel RP, the green pixel GP and the blue pixel BP, respectively. Although not shown in FIG. 4, the color filter layer 480 may be attached to the OLED D through an adhesive layer. Alternatively, the color filter layer 480 may be disposed directly on the OLED D.

In addition, an encapsulation film may be disposed over the second electrode 520 in order to prevent outer moisture from penetrating into the OLED D. The encapsulation film may have, but is not limited to, a laminated structure of a first inorganic insulating film, an organic insulating film and a second inorganic insulating film (see, 170 in FIG. 2). In addition, a polarizing plate may be attached onto the second substrate 404 to reduce reflection of external light. For example, the polarizing plate may be a circular polarizing plate.

In FIG. 4, the light emitted from the OLED D is transmitted through the second electrode 520 and the color filter layer 480 is disposed over the OLED D. Alternatively, the light emitted from the OLED D is transmitted through the first electrode 510 and the color filter layer 480 may be disposed between the OLED D and the first substrate 402. In addition, a color conversion layer may be formed between the OLED D and the color filter layer 480. The color conversion layer may include a red color conversion layer, a green color conversion layer and a blue color conversion layer each of which is disposed correspondingly to each pixel (RP, GP and BP), respectively, so as to covert the white (W) color light to each of a red, green and blue color lights, respectively. Alternatively, the organic light emitting display device 400 may comprise the color conversion film instead of the color filter layer 480.

As described above, the white (W) color light emitted from the OLED D is transmitted through the red color filter 482, the green color filter 484 and the blue color filter 486 each of which is disposed correspondingly to the red pixel region RP, the green pixel region GP and the blue pixel region BP, respectively, so that red, green and blue color lights are displayed in the red pixel region RP, the green pixel region GP and the blue pixel region BP.

FIG. 5 is a schematic cross-sectional view illustrating an organic light emitting diode having a tandem structure of two emitting parts. As illustrated in FIG. 5, the organic light emitting diode D2 (OLED D2) in accordance with the exemplary embodiment of includes first and second electrodes 510 and 520 and an emissive layer 530 disposed between the first and second electrodes 510 and 520. The emissive layer 530 includes a first emitting part 600 disposed between the first and second electrodes 510 and 520, a second emitting part 700 disposed between the first emitting part 600 and the second electrode 520 and a charge generation layer (CGL) 680 disposed between the first and second emitting parts 600 and 700.

The first electrode 510 may be an anode and may include a conductive material having relatively high work function value. For example, the first electrode 510 may include, ITO, IZO, ITZO, SnO, ZnO, ICO, AZO, and the like. The second electrode 520 may be a cathode and may include a conductive material with a relatively low work function value. For example, the second electrode 520 may include, but is not limited to, Al, Mg, Ca, Ag, alloy thereof or combination thereof such as Al—Mg.

The first emitting part 600 comprise a first EML (EML1) 640. The first emitting part 600 may further comprise at least one of an HIL 610 disposed between the first electrode 510 and the EML1 640, a first HTL (HTL1) 620 disposed between the HIL 610 and the EML1 640, a first ETL (ETL1) 660 disposed between the EML1 640 and the CGL 680. Alternatively, the first emitting part 600 may further comprise a first EBL (EBL1) 630 disposed between the HTL1 620 and the EML1 640 and/or a first HBL (HBL1) 650 disposed between the EML1 640 and the ETL1 660.

The second emitting part 700 comprise a second EML (EML2) 740. The second emitting part 700 may further comprise at least one of a second HTL (HTL2) 720 disposed between the CGL 680 and the EML2 740, a second ETL (ETL2) 760 disposed between the second electrode 520 and the EML2 740 and an EIL 770 disposed between the second electrode 520 and the ETL2 760. Alternatively, the second emitting part 700 may further comprise a second EBL (EBL2) 730 disposed between the HTL2 720 and the EML2 740 and/or a second HBL (HBL2) 750 disposed between the EML2 740 and the ETL2 760.

At least one of the EML1 640 and the EML2 740 may comprise the organic metal compound having the structure of Formulae 1 to 6 to emit green color. The other of the EML1 640 and the EML2 740 may emit a blue color so that the OLED D2 can realize white (W) emission. Hereinafter, the OLED D2 where the EML2 740 includes the organic metal compound having the structure of Formulae 1 to 6 will be described in detail.

The HIL 610 is disposed between the first electrode 510 and the HTL1 620 and improves an interface property between the inorganic first electrode 510 and the organic HTL1 620. In one exemplary embodiment, the HIL 610 may include, but is not limited to, MTDATA, NATA, IT-NATA, 2T-NATA, CuPc, TCTA, NPB (NPD), HAT-CN, TDAPB, PEDOT/PSS, F4TCNQ, N-(biphenyl-4-yl)-9,9-dimethyl-N-(4-(9-phenyl-9H-carbazol-3-yl)phenyl)-9H-fluoren-2-amine, NPNPB and combination thereof. The HIL 610 may be omitted in compliance of the OLED D2 property.

Each of the HTL1 620 and the HTL2 720 may comprise, but is not limited to, TPD, NPB (NPD), DNTPD, CBP, Poly-TPD, TFB, TAPC, DCDPA, N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenyl-9H-carbazol-3-yl)phenyl)-9H-fluoren-2-amine and combination thereof, respectively.

Each of the ETL1 660 and the ETL2 760 facilitates electron transportation in each of the first emitting part 600 and the second emitting part 700, respectively. As an example, each of the ETL1 660 and the ETL2 760 may independently comprise, but is not limited to, at least one of oxadiazole-based compounds, triazole-based compounds, phenanthroline-based compounds, benzoxazole-based compounds, benzothiazole-based compounds, benzimidazole-based compounds, triazine-based compounds, and the like. For example, each of the ETL1 660 and the ETL2 770 may comprise, but is not limited to, $Alq_3$, BAlq, Liq, PBD, spiro-PBD, TPBi, Bphen, NBphen, BCP, TAZ, NTAZ, TpPyPB, TmPPPyTz, PFNBr, TPQ, TSPO1, ZADN and combination thereof, respectively.

The EIL 770 is disposed between the second electrode 520 and the ETL2 760, and can improve physical properties of the second electrode 520 and therefore, can enhance the lifetime of the OLED D2. In one exemplary aspect, the EIL 770 may comprise, but is not limited to, an alkali metal halide or an alkaline earth metal halide such as LiF, CsF, NaF, $BaF_2$ and the like, and/or an organic metal compound such as Liq, lithium benzoate, sodium stearate, and the like.

Each of the EBL1 630 and the EBL2 730 may independently comprise, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, DNTPD, TDAPB, DCDPA, 2,8-bis(9-phenyl-9H-carbazol-3-yl)dibenzo[b,d]thiophene and combination thereof, respectively.

Each of the HBL1 650 and the HBL2 750 may comprise, but is not limited to, at least one of oxadiazole-based compounds, triazole-based compounds, phenanthroline-based compounds, benzoxazole-based compounds, benzothiazole-based compounds, benzimidazole-based compounds, and triazine-based compounds each of which can be used in the ETL1 660 and the ETL2 760. For example, each of the HBL1 650 and the HBL2 750 may independently comprise, but is not limited to, $Alq_3$, BAlq, Liq, PBD, spiro-PBD, BCP, B3PYMPM, DPEPO, 9-(6-(9H-carbazol-9-yl)pyridine-3-yl)-9H-3,9'-bicarbazole, TSPO1 and combination thereof, respectively.

The CGL 680 is disposed between the first emitting part 600 and the second emitting part 700. The CGL 680 includes an N-type CGL (N-CGL) 685 disposed adjacently to the first emitting part 600 and a P-type CGL (P-CGL) 690 disposed adjacently to the second emitting part 700. The N-CGL 685 transports electrons to the EML1 640 of the first emitting part 600 and the P-CGL 690 transport holes to the EML2 740 of the second emitting part 700.

The N-CGL 685 may be an organic layer doped with an alkali metal such as Li, Na, K and Cs and/or an alkaline earth metal such as Mg, Sr, Ba and Ra. The host in the N-CGL 685 may comprise, but is not limited to, Bphen and MTDATA. The contents of the alkali metal or the alkaline earth metal in the N-CGL 685 may be between about 0.01 wt % and about 30 wt %.

The P-CGL 690 may comprise, but is not limited to, inorganic material selected from the group consisting of $WO_x$, $MoO_x$, $V_2O_5$ and combination thereof and/or organic material selected from the group consisting of NPD, HAT-CN, F4TCNQ, TPD, N,N,N',N'-tetranaphthalenyl-benzidine (TNB), TCTA, N,N'-dioctyl-3,4,9,10-perylenedicarboximide (PTCDI-C8) and combination thereof.

The EML 640 may be a blue EML. In this case, the EML1 640 may be a blue EML, a sky-blue EML or a deep-blue EML. The EML1 640 may include a host and a blue dopant. The host may be identical to the first host and the blue dopant may comprise at least one of blue phosphorescent material, blue fluorescent material and blue delayed fluorescent material.

The EML2 740 may comprise a lower EML 740A disposed between the EBL2 730 and the HBL2 750 and an upper EML 740B disposed between the lower EML 740A and the HBL2 750. One of the lower EML 740A and the upper EML 740B may emit red color and the other of the lower EML 740A and the upper EML 740B may emit green color. Hereinafter, the EML2 740 where the lower EML 740A emits green color and the upper EML 740B emits red color will be described in detail.

The lower EML 740A includes a first host and a first dopant 742. The first host may comprise, but is not limited to, mCP-CN, CBP, mCBP, mCP, DPEPO, PPT, TmPyPB, PYD-2Cz, DCzDBT, DCzTPA, pCzB-2CN), mCzB-2CN, TSPO1, CCP, 4-(3-(triphenylene-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl) pyridin-3-yl)-9H-3,9'-bicarbazole, BCzPh, TCP, TCTA, CDBP, DMFL-CBP, Spiro-CBP, TCz1 and combination thereof. The first dopant 742 may include the organic metal compound having the structure of Formulae 1 to 6 to emit green color. For example, the contents of the first dopant 742 in the lower EML 740A may be between about 1 wt % to about 50 wt %, for example, about 1 wt % and about 30 wt %.

The upper EML 740B includes a host and a red dopant. The host may be identical to the first host and the red dopant may comprise at least one of red phosphorescent material, red florescent material and red delayed fluorescent material.

The OLED D2 in accordance with this aspect has a tandem structure and includes the organic metal compound having the structure of Formulae 1 to 6. The OLED D2 including the organic metal compound with excellent thermal property, a rigid chemical conformation and adjustable luminescent colors can lower its driving voltage and improve its luminous efficiency and luminous lifespan.

The OLED may have three or more emitting parts to form a tandem structure. FIG. 6 is a schematic cross-sectional view illustrating an organic light emitting diode in accordance with still another exemplary aspect of the present disclosure. As illustrated in FIG. 6, the organic light emitting diode D3 (OLED D3) includes first and second electrodes 510 and 520 facing each other and an emissive layer 530A disposed between the first and second electrodes 510 and 520. The emissive layer 530A includes a first emitting part 600 disposed between the first and second electrodes 510 and 520, a second emitting part 700A disposed between the first emitting part 600 and the second electrode 520, a third emitting part 800 disposed between the second emitting part 700A and the second electrode 520, a first charge generation layer (CGL1) 680 disposed between the first and second emitting parts 600 and 700A, and a second charge generation layer (CGL2) 780 disposed between the second and third emitting parts 700A and 800.

The first emitting part 600 comprise a first EML (EML1) 640. The first emitting part 600 may further comprise at least one of an HIL 610 disposed between the first electrode 510 and the EML1 640, a first HTL (HTL1) 620 disposed between the HIL 610 and the EML1 640, a first ETL (ETL1) 660 disposed between the EML1 640 and the CGL 680. Alternatively, the first emitting part 600 may further comprise a first EBL (EBL1) 630 disposed between the HTL1 620 and the EML1 640 and/or a first HBL (HBL1) 650 disposed between the EML1 640 and the ETL1 660.

The second emitting part 700A comprise a second EML (EML2) 740. The second emitting part 700A may further comprise at least one of a second HTL (HTL2) 720 disposed between the CGL1 680 and the EML2 740 and a second ETL (ETL2) 760 disposed between the second electrode 520 and the EML2 740. Alternatively, the second emitting part 700A may further comprise a second EBL (EBL2) 730 disposed between the HTL2 720 and the EML2 740 and/or a second HBL (HBL2) 750 disposed between the EML2 740 and the ETL2 760.

The third emitting part 800 comprise a third EML (EML3) 840. The third emitting part 800 may further comprise at least one of a third HTL (HTL3) 820 disposed between the CGL2 780 and the EML3 840, a third ETL (ETL3) 860 disposed between the second electrode 520 and the EML3 840 and an EIL 870 disposed between the second electrode 520 and the ETL3 860. Alternatively, the third emitting part 800 may further comprise a third EBL (EBL3) 830 disposed between the HTL3 820 and the EML3 840 and/or a third HBL (HBL3) 850 disposed between the EML3 840 and the ETL3 860.

At least one of the EML1 640, the EML2 740 and the EML3 840 may comprise the organic metal compound having the structure of Formulae 1 to 6. For example, one of the EML1 640, the EML2 740 and the EML3 840 may emit green color. In addition, another of the EML1 640, the EML2 740 and the EML3 840 emit a blue color so that the OLED D3 can realize white emission. Hereinafter, the OLED where the EML2 740 includes the organic metal compound having the structure of Formulae 1 to 6 to emit green color and each of the EML1 640 and the EML3 840 emits a blue light will be described in detail.

The CGL1 680 is disposed between the first emitting part 600 and the second emitting part 700A and the CGL2 780 is disposed between the second emitting part 700A and the third emitting part 800. The CGL1 680 includes a first N-type CGL (N-CGL1) 685 disposed adjacently to the first emitting part 600 and a first P-type CGL (P-CGL1) 690 disposed adjacently to the second emitting part 700A. The CGL2 780 includes a second N-type CGL (N-CGL2) 785 disposed adjacently to the second emitting part 700A and a second P-type CGL (P-CGL2) 790 disposed adjacently to the third emitting part 800. Each of the N-CGL1 685 and the N-CGL2 785 transports electrons to the EML1 640 of the first emitting part 600 and the EML2 740 of the second emitting part 700A, respectively, and each of the P-CGL1 690 and the P-CGL2 790 transport holes to the EML2 740 of the second emitting part 700A and the EML3 840 of the third emitting part 800, respectively.

Each of the EML1 640 and the EML3 840 may be independently a blue EML. In this case, the each of the EML1 640 and the EML3 840 may be independently a blue EML, a sky-blue EML or a deep-blue EML. Each of the EML1 640 and the EML3 840 may include independently a host and a blue dopant. The host may be identical to the first host and the blue dopant may comprise at least one of blue phosphorescent material, blue fluorescent material and blue delayed fluorescent material. In one exemplary aspect, the blue dopant in the EML1 640 may have different color and luminous efficiency from the blue dopant in the EML3 840.

The EML2 740 may comprise a lower EML 740A disposed between the EBL2 730 and the HBL2 750 and an upper EML 740B disposed between the lower EML 740A and the HBL2 750. One of the lower EML 740A and the upper EML 740B may emit red color and the other of the lower EML 740A and the upper EML 740B may emit green color. Hereinafter, the EML2 740 where the lower EML 740A emits green color and the upper EML 740B emits red color will be described in detail.

The lower EML 740A may include a first host and a first dopant 742. As an example, the first dopant 742 includes the organic metal compound having the structure of Formulae 1 to 6 to emit green color. For example, the contents of the dopant 742 in the upper EML 740A may be between about 1 wt % to about 50 wt %, for example, about 1 wt % and about 30 wt %.

The upper EML 740B includes a host and a red dopant. The host may be identical to the first host and the red dopant may include at least one of red phosphorescent material, red fluorescent material and red delayed fluorescent material.

The OLED D3 in accordance with this aspect includes the organic metal compound having the structure of Formulae 1 to 6 in at least one emitting material layer. The organic metal compound has can maintain its stable chemical conformations in the luminescent process. The OLED including the organic metal compound and having three emitting parts can realize white luminescence with improved luminous efficiency, color purity and luminous lifespan.

Synthesis Example 1: Synthesis of Compound 1

(1) Synthesis of Intermediate A-1

[Reaction Formula 1-1]

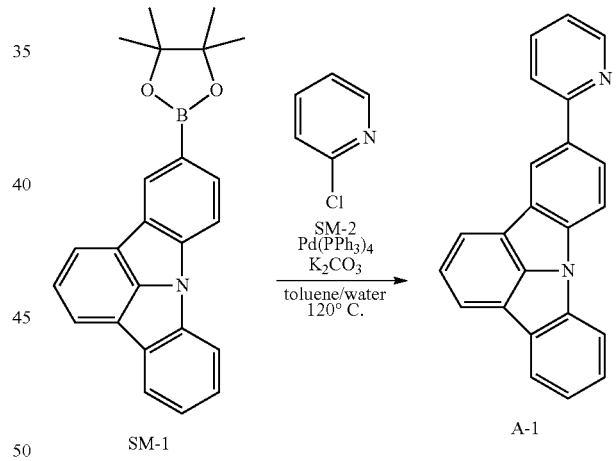

Compound SM-1 (7.34 g, 20 mmol), Compound SM-2 (2.27 g, 20 mmol), Tetrakis(triphenylphosphine)palladium (0) (Pd(PPh$_3$)$_4$, 1.2 g, 1 mmol), K$_2$CO$_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. An organic layer was extracted with chloroform and washed with water. Water was removed with anhydrous MgSO$_4$, the organic layer was filtered, the organic solvent was distilled under reduced pressure to be removed, and then a crude product was purified with column chromatography to give the Intermediate A-1 (6.05 g, yield: 95%).

(2) Synthesis of Intermediate I-1

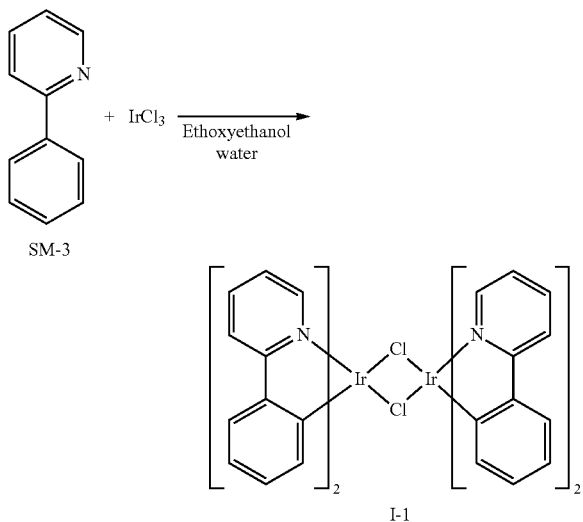

Compound SM-3 (3.10 g, 20 mmol), IrCl₃ (2.39 g, 8.0 mmol) and a mixed solvent of ethoxyethanol (90 mL) and water (30 mL) were put into a 250 mL round bottom flask, and then the solution was stirred at 130° C. for 16 hours. After the reaction was complete, the solution was cooled to room temperature, methanol was added into the solution to filter the produced solid under reduced pressure and to give the Intermediate I-1 of solid (9.56 g, yield: 89%).

(3) Synthesis of Intermediate I-2

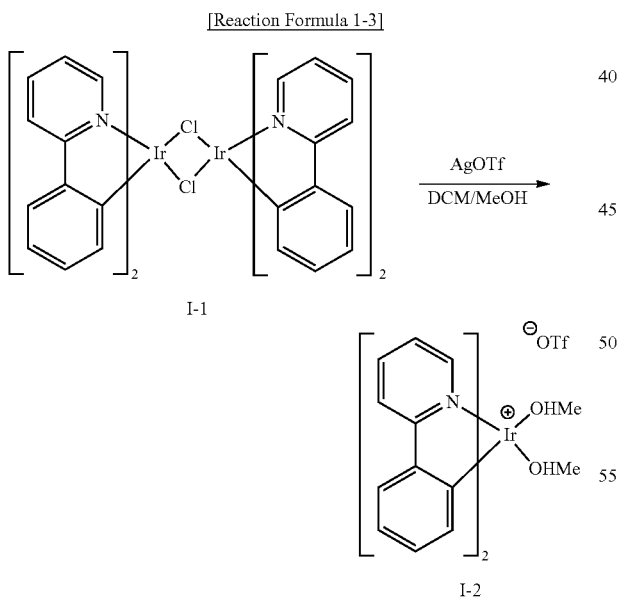

The Intermediate I-1 (5.16 g, 4.8 mmol), silver trifluoromethanesulfonate (AgOTf, 3.6 g, 14.3 mmol) and dichloromethane were put into a 1000 mL round bottom flask, and then the solution was stirred at room temperature for 16 hours. After the reaction was complete, the solution was filtered with celite to remove solid. The solvent was removed by distillation under reduced pressure to give the Intermediate I-2 of solid (6.03 g, yield: 88%).

(4) Synthesis of Compound 1

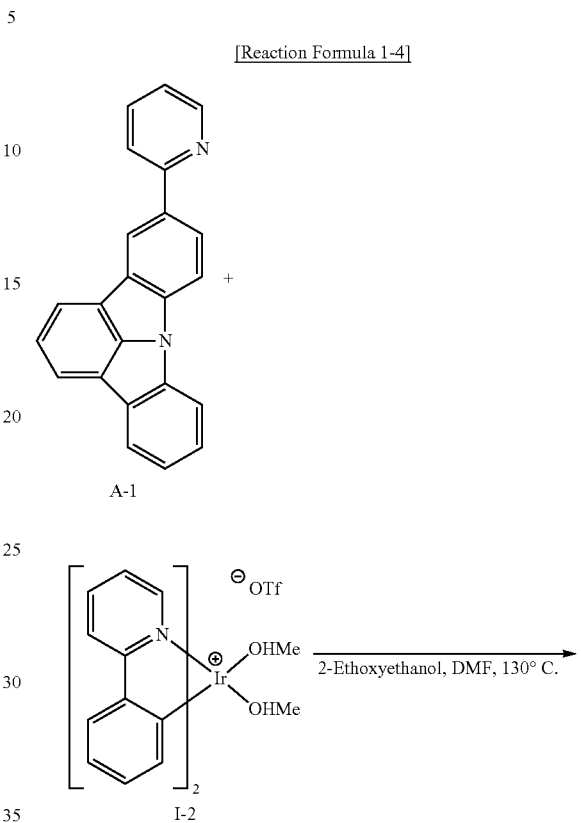

The Intermediate A-1 (1.11 g, 3.5 mmol), the Intermediate I-2 (2.15 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 1 (2.01 g, yield: 82%).

Synthesis Example 2: Synthesis of Compound 2

(1) Synthesis of Intermediate B-1

[Reaction Formula 2-1]

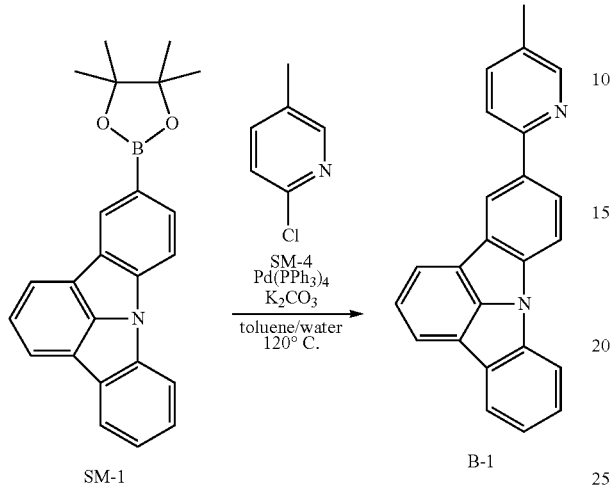

Compound SM-1 (7.34 g, 20 mmol), Compound SM-4 (2.54 g, 20 mmol), Pd(PPh$_3$)$_4$ (1.2 g, 1 mmol), K$_2$CO$_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. An organic layer was extracted with chloroform and washed with water. Water was removed with anhydrous MgSO$_4$, the organic layer was filtered, the organic solvent was distilled under reduced pressure to be removed, and then a crude product was purified with column chromatography to give the Intermediate B-1 (6.17 g, yield: 93%).

(2) Synthesis of Compound 2

[Reaction Formula 2-2]

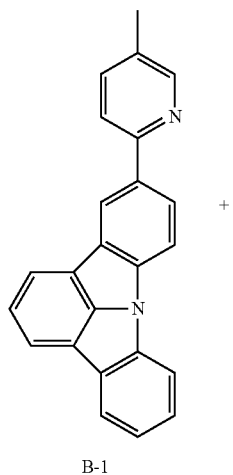

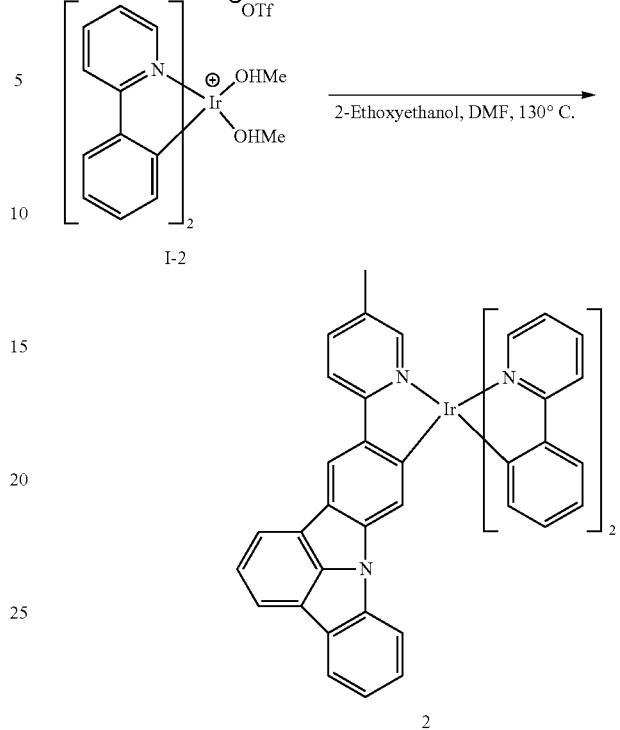

The Intermediate B-1 (1.16 g, 3.5 mmol), the Intermediate I-2 (2.15 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 2 (2.02 g, yield: 81%).

Synthesis Example 3: Synthesis of Compound 16

(1) Synthesis of Intermediate C-1

[Reaction Formula 3-1]

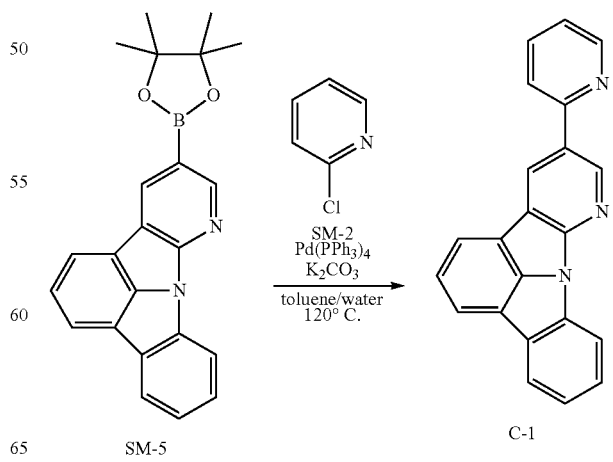

Compound SM-5 (7.34 g, 20 mmol), Compound SM-2 (2.27 g, 20 mmol), Pd(PPh$_3$)$_4$ (1.2 g, 1 mmol), K$_2$CO$_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. An organic layer was extracted with chloroform and washed with water. Water was removed with anhydrous MgSO$_4$, the organic layer was filtered, the organic solvent was distilled under reduced pressure to be removed, and then a crude product was purified with column chromatography to give the Intermediate C-1 (5.66 g, yield: 93%)

(2) Synthesis of Compound 16

[Reaction Formula 3-2]

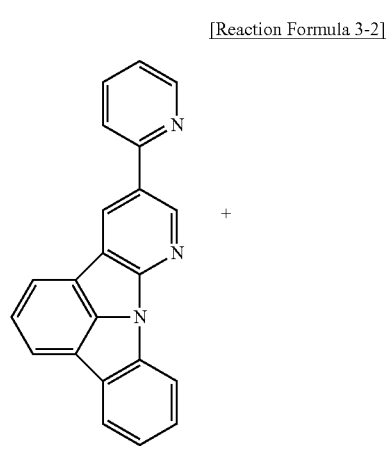

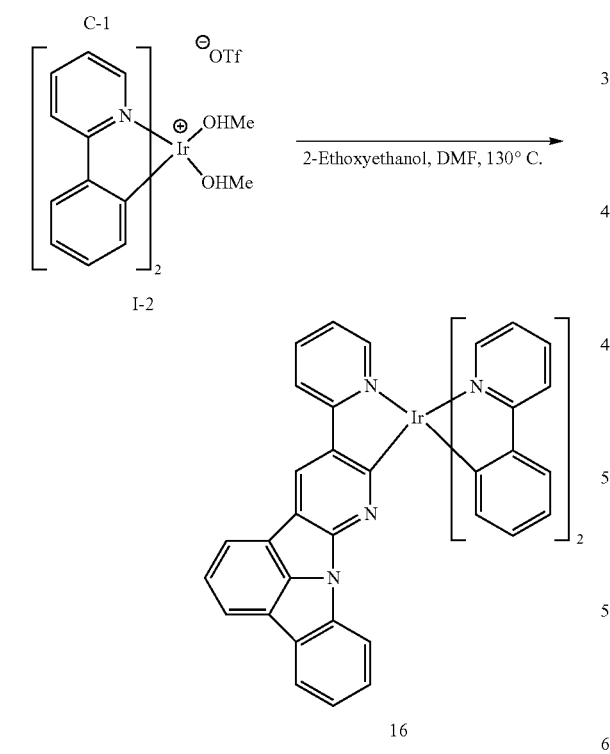

The Intermediate C-1 (1.12 g, 3.5 mmol), the Intermediate I-2 (2.15 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 16 (2.02 g, yield: 81%).

Synthesis Example 4: Synthesis of Compound 17

(1) Synthesis of Intermediate D-1

[Reaction Formula 4-1]

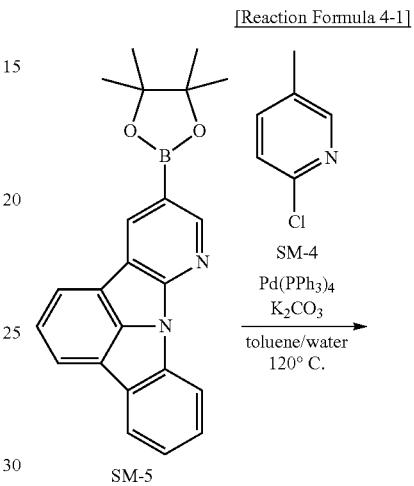

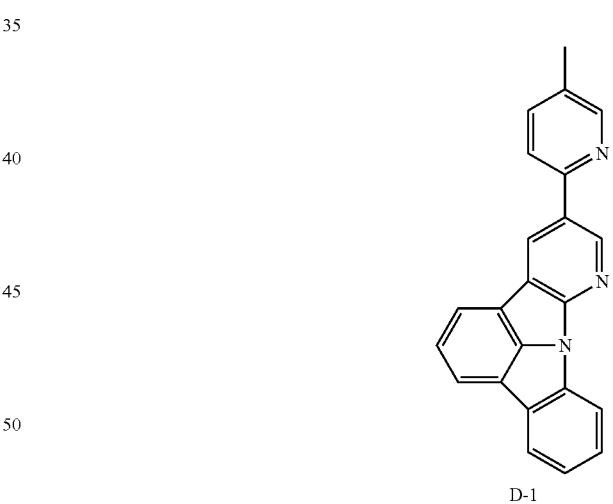

Compound SM-5 (7.34 g, 20 mmol), Compound SM-4 (2.54 g, 20 mmol), Pd(PPh$_3$)$_4$ (1.2 g, 1 mmol), K$_2$CO$_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. An organic layer was extracted with chloroform and washed with water. Water was removed with anhydrous MgSO$_4$, the organic layer was filtered, the organic solvent was distilled under reduced pressure to be removed, and then a crude product was purified with column chromatography to give the Intermediate D-1 (5.86 g, yield: 88%).

117

(2) Synthesis of Compound 17

[Reaction Formula 4-2]

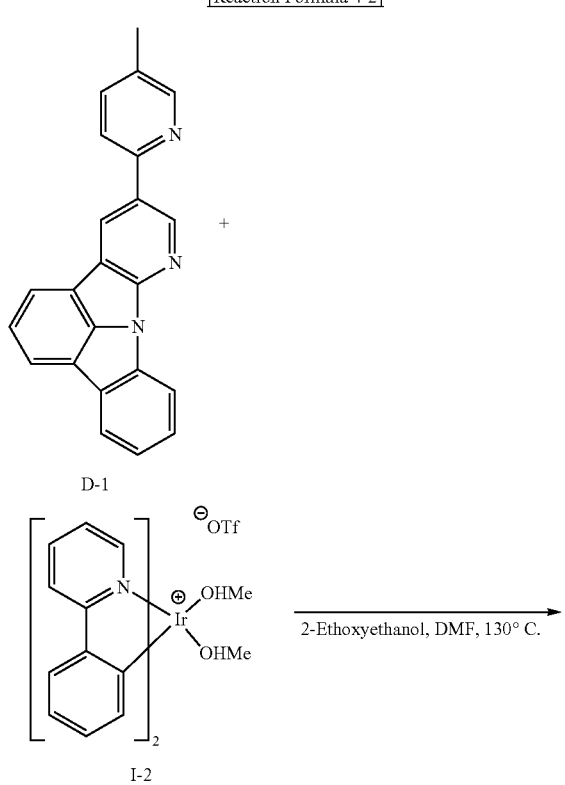

The Intermediate D-1 (1.17 g, 3.5 mmol), the Intermediate I-2 (2.15 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 17 (2.25 g, yield: 90%).

118

Synthesis Example 5: Synthesis of Compound 27

(1) Synthesis of Intermediate E-1

[Reaction Formula 5-1]

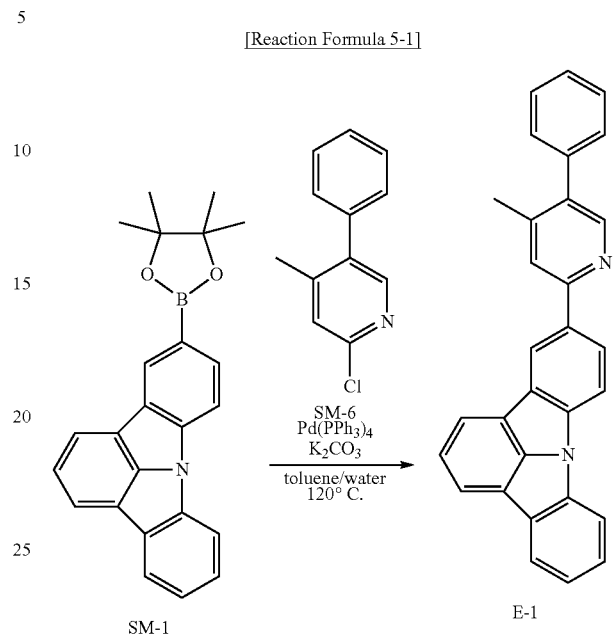

Compound SM-1 (7.34 g, 20 mmol), Compound SM-6 (4.08 g, 20 mmol), Pd(PPh$_3$)$_4$ (1.2 g, 1 mmol), K$_2$CO$_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. An organic layer was extracted with chloroform and washed with water. Water was removed with anhydrous MgSO$_4$, the organic layer was filtered, the organic solvent was distilled under reduced pressure to be removed, and then a crude product was purified with column chromatography to give the Intermediate E-1 (7.34 g, yield: 90%)

(2) Synthesis of Compound 27

[Reaction Formula 5-2]

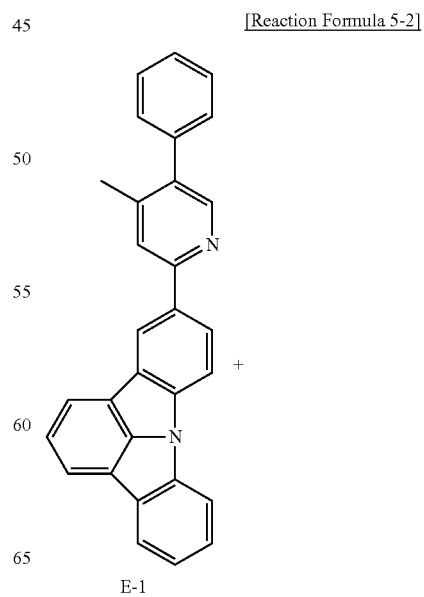

119
-continued

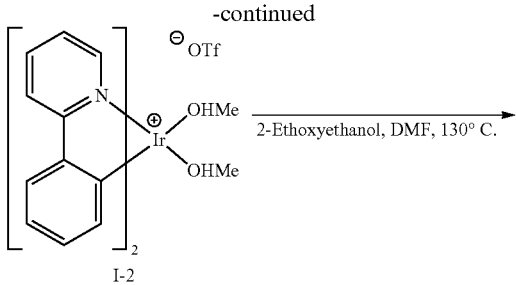

I-2

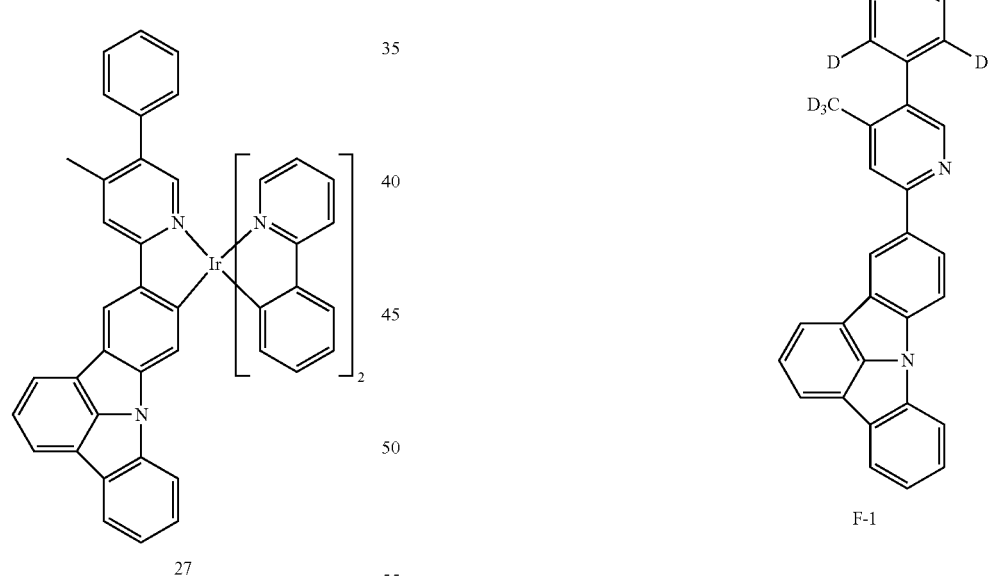

27

The Intermediate E-1 (1.43 g, 3.5 mmol), the Intermediate I-2 (2.15 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 27 (2.45 g, yield: 90%).

120

Synthesis Example 6: Synthesis of Compound 32

(1) Synthesis of Intermediate F-1

[Reaction Formula 6-1]

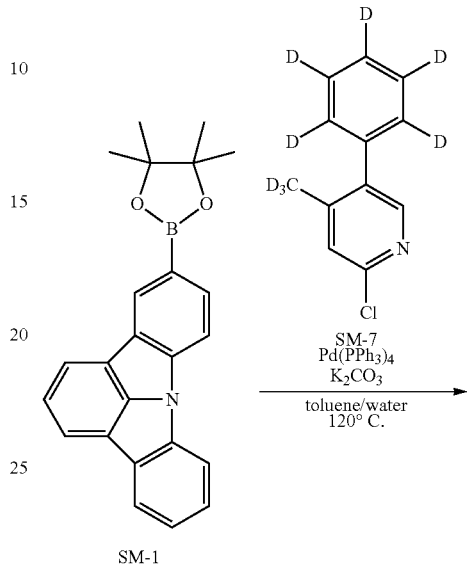

F-1

Compound SM-1 (7.34 g, 20 mmol), Compound SM-7 (4.24 g, 20 mmol), Pd(PPh$_3$)$_4$ (1.2 g, 1 mmol), K$_2$CO$_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. An organic layer was extracted with chloroform and washed with water. Water was removed with anhydrous MgSO$_4$, the organic layer was filtered, the organic solvent was distilled under reduced pressure to be removed, and then a crude product was purified with column chromatography to give the Intermediate F-1 (7.67 g, yield: 92%).

121

(2) Synthesis of Intermediate J-1

[Reaction Formula 6-2]

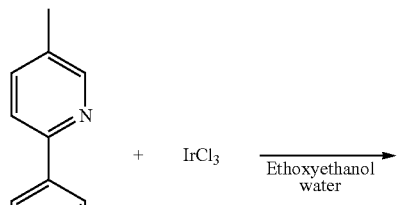

SM-8

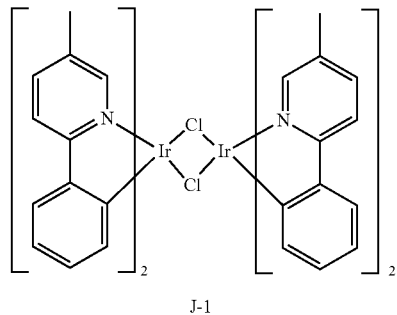

J-1

Compound SM-8 (3.38 g, 20 mmol), IrCl$_3$ (2.39 g, 8.0 mmol) and a mixed solvent of ethoxyethanol (90 mL) and water (30 mL) were put into a 250 mL round bottom flask, and then the solution was stirred at 130° C. for 16 hours. After the reaction was complete, the solution was cooled to room temperature, methanol was added into the solution to filter the produced solid under reduced pressure and to give the Intermediate J-1 of solid (4.07 g, yield: 90%).

(3) Synthesis of Intermediate J-2

[Reaction Formula 6-3]

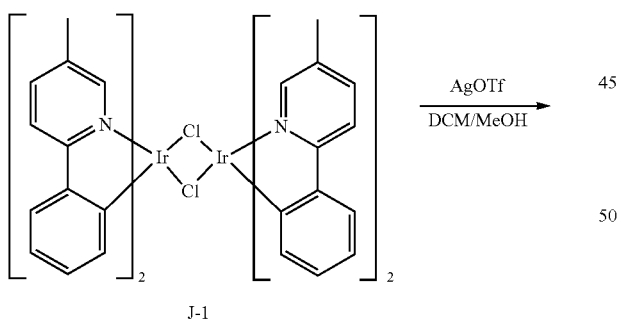

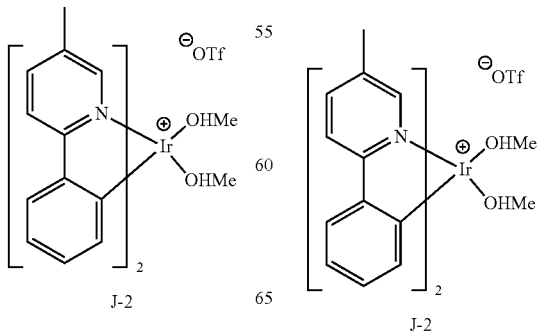

122

The Intermediate J-1 (5.16 g, 4.8 mmol), silver trifluoromethanesulfonate (AgOTf, 3.6 g, 14.3 mmol) and dichloromethane were put into a 1000 mL round bottom flask, and then the solution was stirred at room temperature for 16 hours. After the reaction was complete, the solution was filtered with celite to remove solid. The solvent was removed by distillation under reduced pressure to give the Intermediate J-2 of solid (6.03 g, yield: 88%).

(4) Synthesis of Compound 32

[Reaction Formula 6-4]

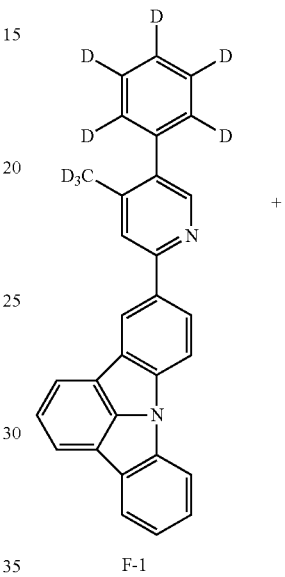

F-1

+

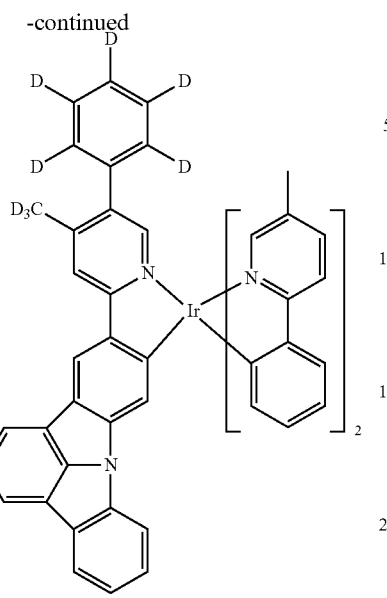

32

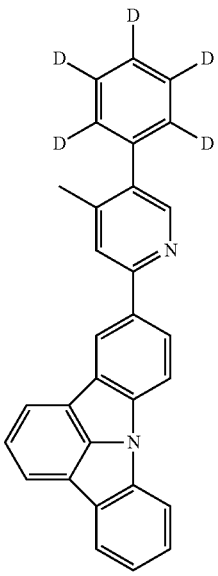

The Intermediate F-1 (1.46 g, 3.5 mmol), the Intermediate J-2 (2.23 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 32 (2.47 g, yield: 87%).

Synthesis Example 7: Synthesis of Compound 34

(1) Synthesis of Intermediate G-1

Compound SM-1 (7.34 g, 20 mmol), Compound SM-9 (4.24 g, 20 mmol), Pd(PPh$_3$)$_4$ (1.2 g, 1 mmol), K$_2$CO$_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. An organic layer was extracted with chloroform and washed with water. Water was removed with anhydrous MgSO$_4$, the organic layer was filtered, the organic solvent was distilled under reduced pressure to be removed, and then a crude product was purified with column chromatography to give the Intermediate G-1 (7.53 g, yield: 91%).

(2) Synthesis of Compound 34

[Reaction Formula 7-1]

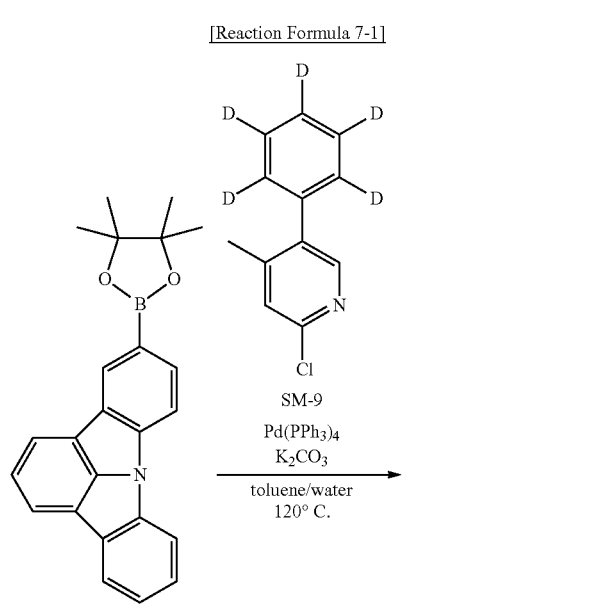

[Reaction Formula 7-2]

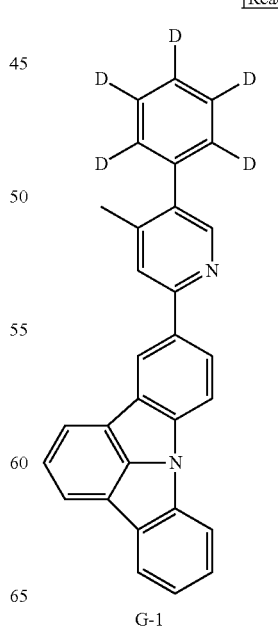

+

G-1

-continued

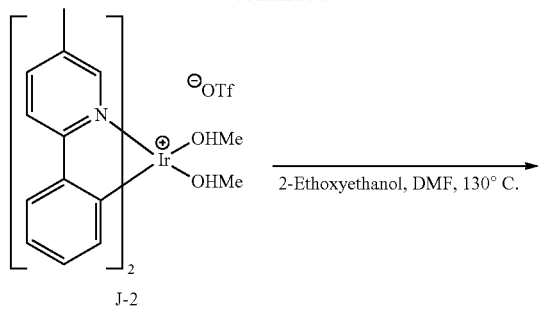

J-2

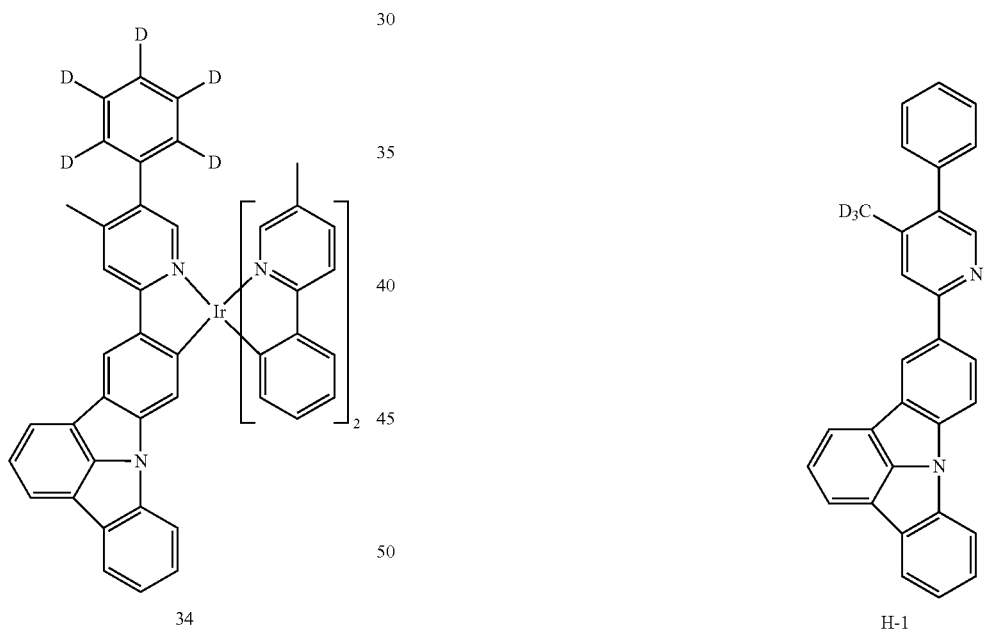

34

Synthesis Example 8: Synthesis of Compound 35

(1) Synthesis of Intermediate H-1

[Reaction Formula 8-1]

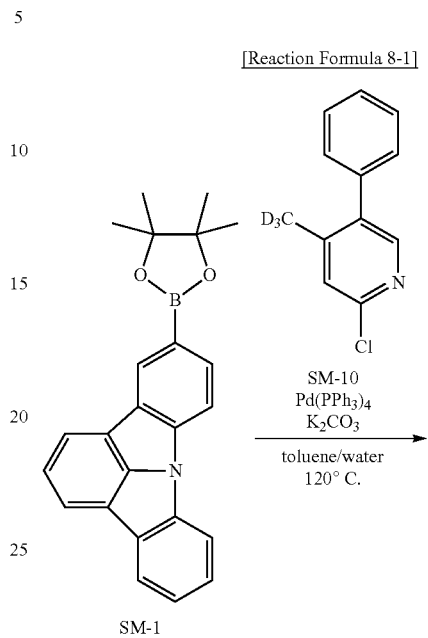

The Intermediate G-1 (1.45 g, 3.5 mmol), the Intermediate J-2 (2.23 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 34 (2.26 g, yield: 80%).

Compound SM-1 (7.34 g, 20 mmol), Compound SM-10 (4.14 g, 20 mmol), Pd(PPh$_3$)$_4$ (1.2 g, 1 mmol), K$_2$CO$_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. An organic layer was extracted with chloroform and washed with water. Water was removed with anhydrous MgSO$_4$, the organic layer was filtered, the organic solvent was distilled under reduced pressure to be removed, and then a crude product was purified with column chromatography to give the Intermediate H-1 (7.83 g, yield: 95%).

(2) Synthesis of Compound 35

[Reaction Formula 8-2]

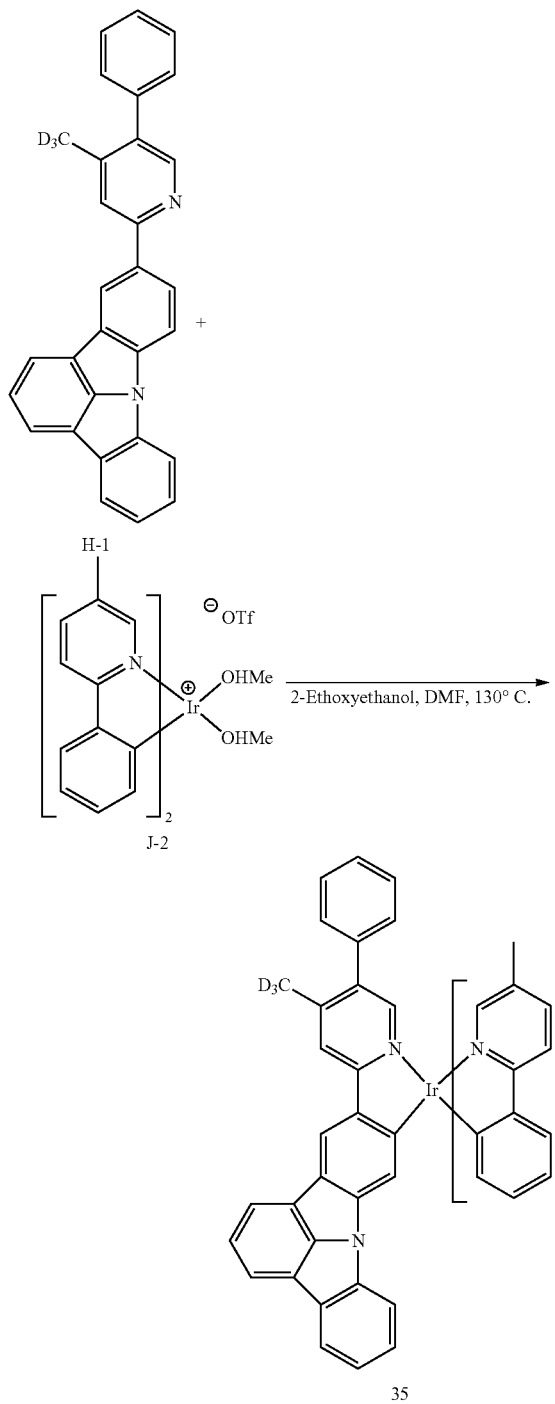

Synthesis Example 9: Synthesis of Compound 136

(1) Synthesis of Intermediate A-2

[Reaction Formula 9-1]

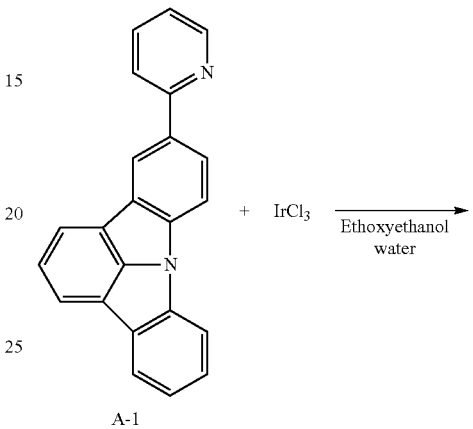

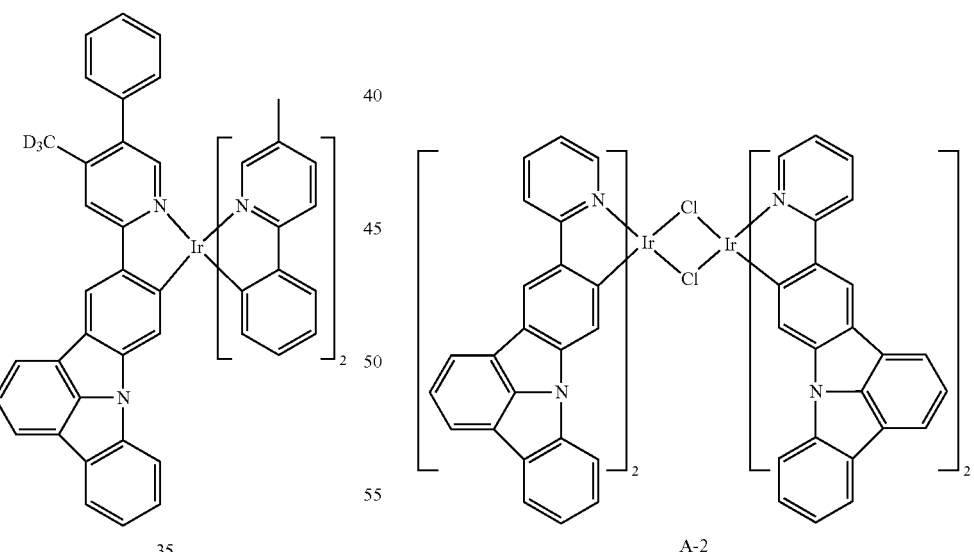

The Intermediate H-1 (1.44 g, 3.5 mmol), the Intermediate J-2 (2.23 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 35 (2.28 g, yield: 81%).

The Intermediate A-1 (6.36 g, 20 mmol), IrCl$_3$ (2.39 g, 8.0 mmol) and a mixed solvent of ethoxyethanol (90 mL) and water (30 mL) were put into a 250 mL round bottom flask, and then the solution was stirred at 130° C. for 16 hours. After the reaction was complete, the solution was cooled to room temperature, methanol was added into the solution to filter the produced solid under reduced pressure and to give the Intermediate A-2 of solid (5.53 g, yield: 80%).

(2) Synthesis of Intermediate A-3

[Reaction Formula 9-2]

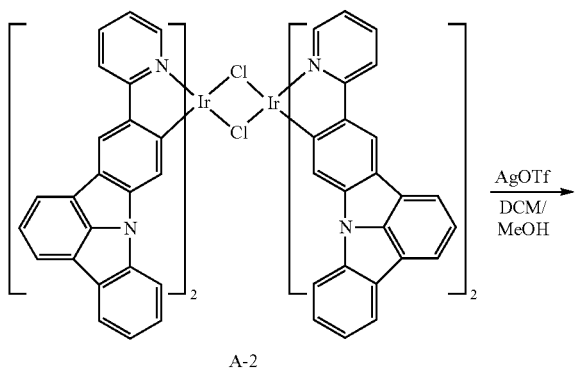

A-2

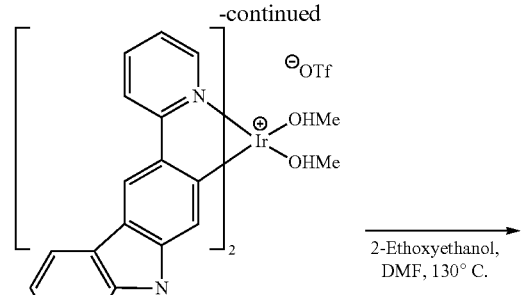

A-3

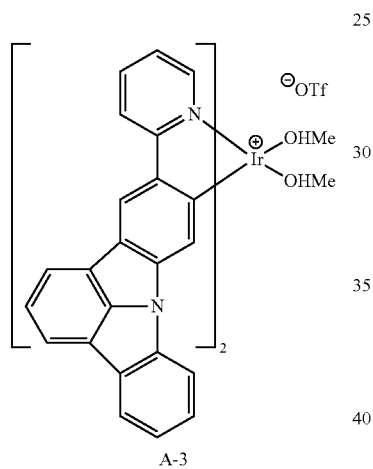

A-3

The Intermediate A-2 (8.29 g, 4.8 mmol), silver trifluoromethanesulfonate (AgOTf, 3.6 g, 14.3 mmol) and dichloromethane were put into a 1000 mL round bottom flask, and then the solution was stirred at room temperature for 16 hours. After the reaction was complete, the solution was filtered with celite to remove solid. The solvent was removed by distillation under reduced pressure to give the Intermediate A-3 of solid (7.99 g, yield: 80%).

(3) Synthesis of Compound 136

[Reaction Formula 9-3]

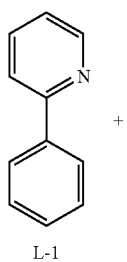

L-1

+

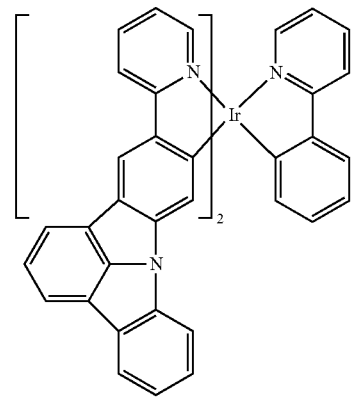

136

Compound L-1 (0.54 g, 3.5 mmol), the Intermediate A-3 (3.12 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 136 (2.46 g, yield: 80%).

Synthesis Example 10: Synthesis of Compound 137

[Reaction Formula 10]

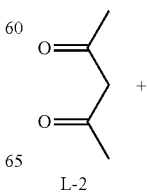

L-2

+

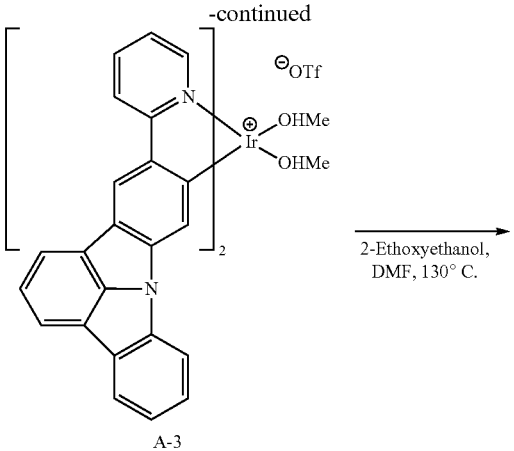

A-3

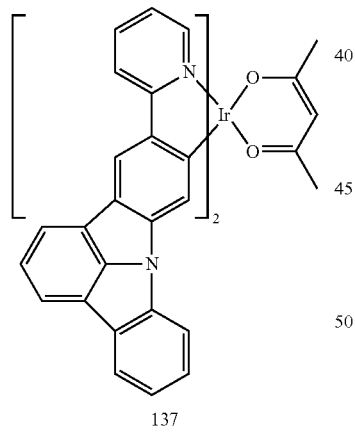

137

Compound L-2 (0.35 g, 3.5 mmol), the Intermediate A-3 (3.12 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 137 (2.22 g, yield: 80%).

Synthesis Example 11: Synthesis of Compound 141

(1) Synthesis of Intermediate C-2

[Reaction Formula 11-1]

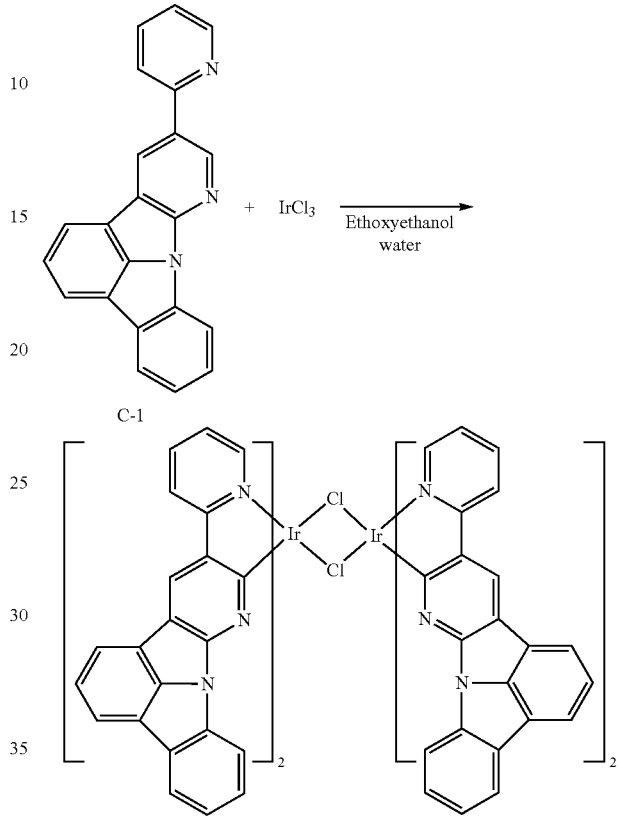

The Intermediate C-1 (6.36 g, 20 mmol), $IrCl_3$ (2.39 g, 8.0 mmol) and a mixed solvent of ethoxyethanol (90 mL) and water (30 mL) were put into a 250 mL round bottom flask, and then the solution was stirred at 130° C. for 16 hours. After the reaction was complete, the solution was cooled to room temperature, methanol was added into the solution to filter the produced solid under reduced pressure and to give the Intermediate C-2 of solid (5.32 g, yield: 77%).

(2) Synthesis of Intermediate C-3

[Reaction Formula 11-2]

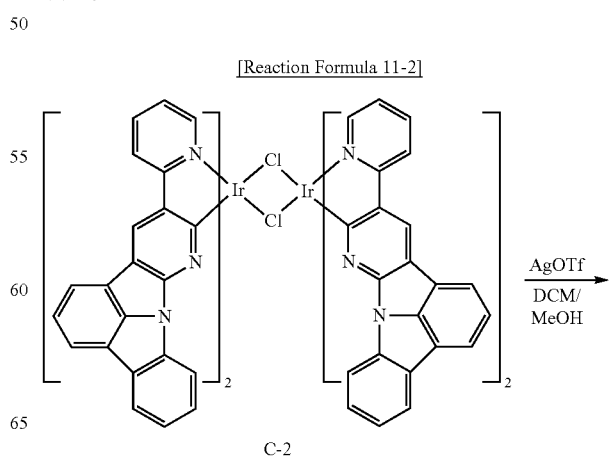

C-2

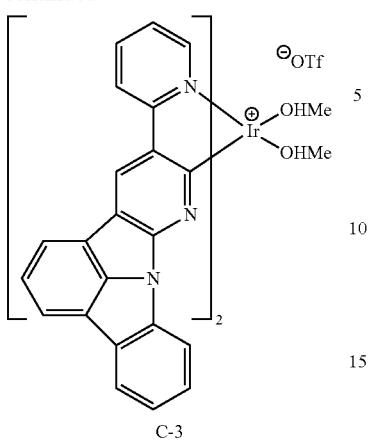

C-3

The Intermediate C-2 (8.29 g, 4.8 mmol), silver trifluoromethanesulfonate (AgOTf, 3.6 g, 14.3 mmol) and dichloromethane were put into a 1000 mL round bottom flask, and then the solution was stirred at room temperature for 16 hours. After the reaction was complete, the solution was filtered with celite to remove solid. The solvent was removed by distillation under reduced pressure to give the Intermediate C-3 of solid (7.29 g, yield: 72%).

(3) Synthesis of Compound 141

[Reaction Formula 11-3]

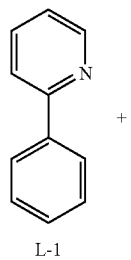

L-1

+

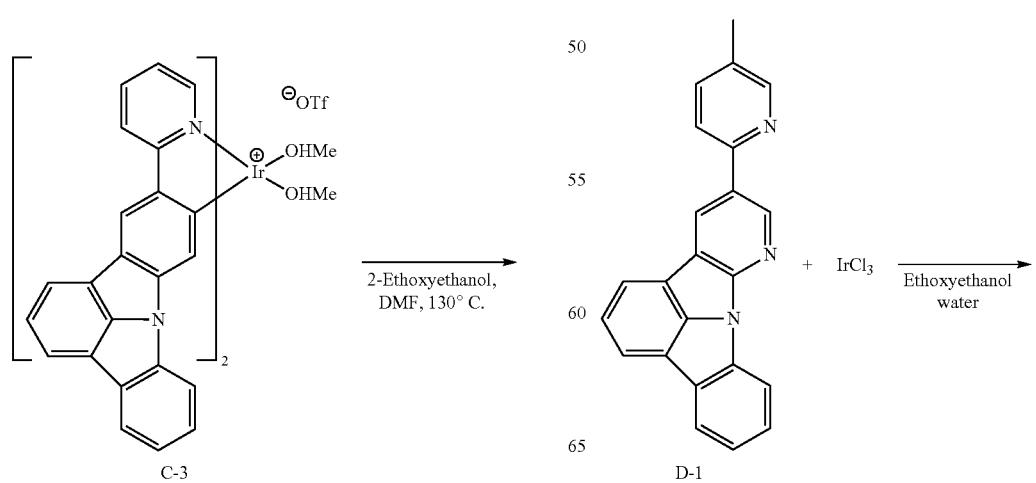

C-3

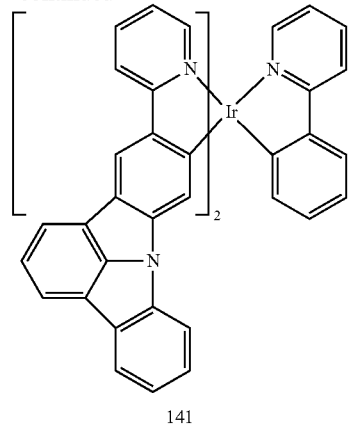

141

Compound L-1 (0.54 g, 3.5 mmol), the Intermediate C-3 (3.13 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 141 (2.45 g, yield: 83%).

Synthesis Example 12: Synthesis of Compound 142

(1) Synthesis of Intermediate D-2

[Reaction Formula 12-1]

D-1

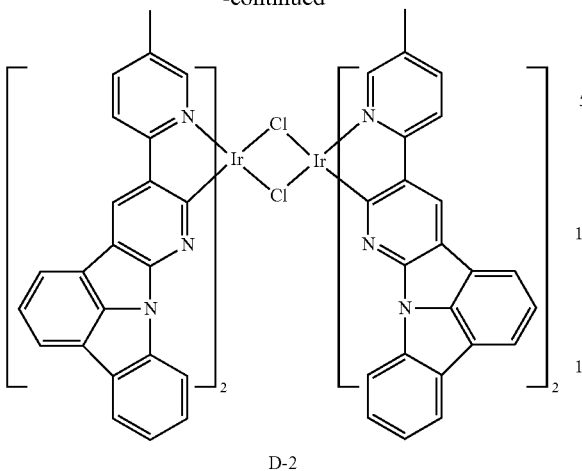

D-2

The Intermediate D-1 (6.64 g, 20 mmol), IrCl₃ (2.39 g, 8.0 mmol) and a mixed solvent of ethoxyethanol (90 mL) and water (30 mL) were put into a 250 mL round bottom flask, and then the solution was stirred at 130° C. for 16 hours. After the reaction was complete, the solution was cooled to room temperature, methanol was added into the solution to filter the produced solid under reduced pressure and to give the Intermediate D-2 of solid (5.71 g, yield: 80%).

(2) Synthesis of Intermediate D-3

[Reaction Formula 12-2]

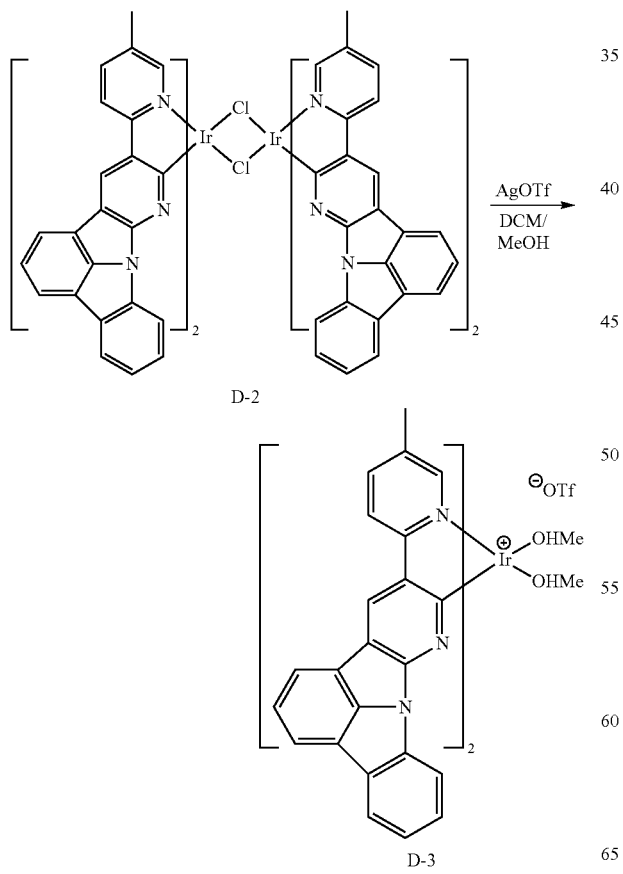

The Intermediate D-2 (8.58 g, 4.8 mmol), silver trifluoromethanesulfonate (AgOTf, 3.6 g, 14.3 mmol) and dichloromethane were put into a 1000 mL round bottom flask, and then the solution was stirred at room temperature for 16 hours. After the reaction was complete, the solution was filtered with celite to remove solid. The solvent was removed by distillation under reduced pressure to give the Intermediate D-3 of solid (7.09 g, yield: 69%).

(3) Synthesis of Compound 142

[Reaction Formula 12-3]

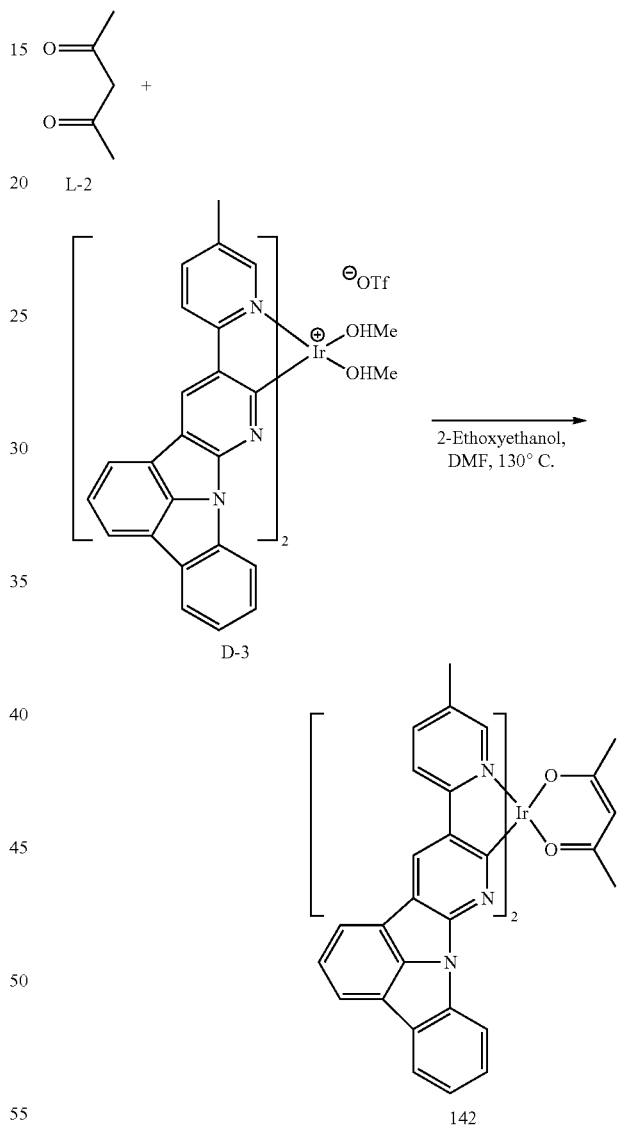

Compound L-2 (0.35 g, 3.5 mmol), the Intermediate D-3 (3.21 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 142 (2.12 g, yield: 74%).

Synthesis Example 13: Synthesis of Compound 147

(1) Synthesis of Intermediate E-2

[Reaction Formula 13-1]

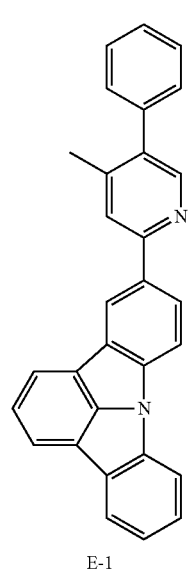

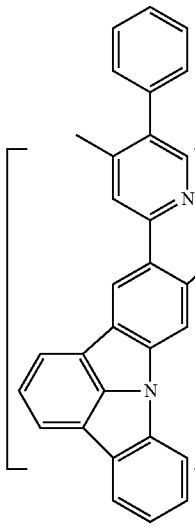

The Intermediate E-1 (8.16 g, 20 mmol), $IrCl_3$ (2.39 g, 8.0 mmol) and a mixed solvent of ethoxyethanol (90 mL) and water (30 mL) were put into a 250 mL round bottom flask, and then the solution was stirred at 130° C. for 16 hours. After the reaction was complete, the solution was cooled to room temperature, methanol was added into the solution to filter the produced solid under reduced pressure and to give the Intermediate E-2 of solid (7.26 g, yield: 87%).

(2) Synthesis of Intermediate E-3

[Reaction Formula 13-2]

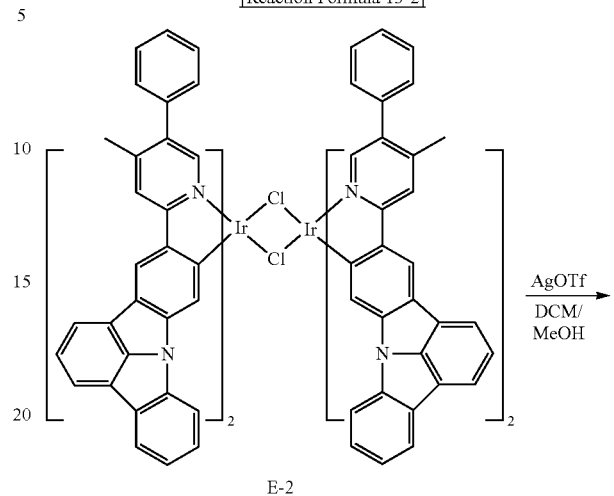

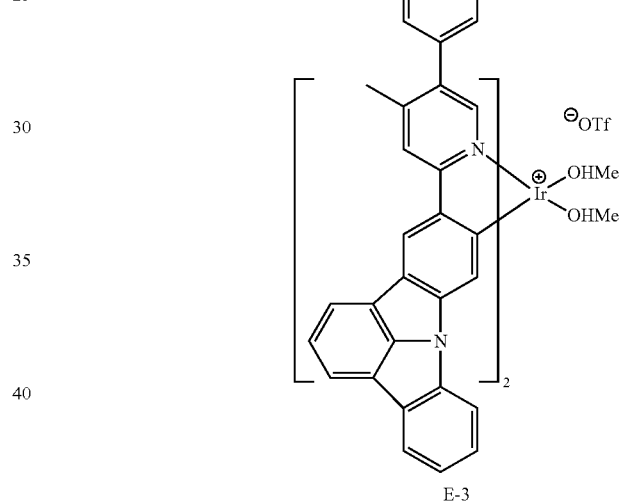

The Intermediate E-2 (10.0 g, 4.8 mmol), silver trifluoromethanesulfonate (AgOTf, 3.6 g, 14.3 mmol) and dichloromethane were put into a 1000 mL round bottom flask, and then the solution was stirred at room temperature for 16 hours. After the reaction was complete, the solution was filtered with celite to remove solid. The solvent was removed by distillation under reduced pressure to give the Intermediate E-3 of solid (8.91 g, yield: 76%).

(3) Synthesis of Compound 147

[Reaction Formula 13-3]

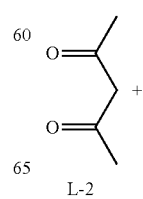

L-2

139
-continued

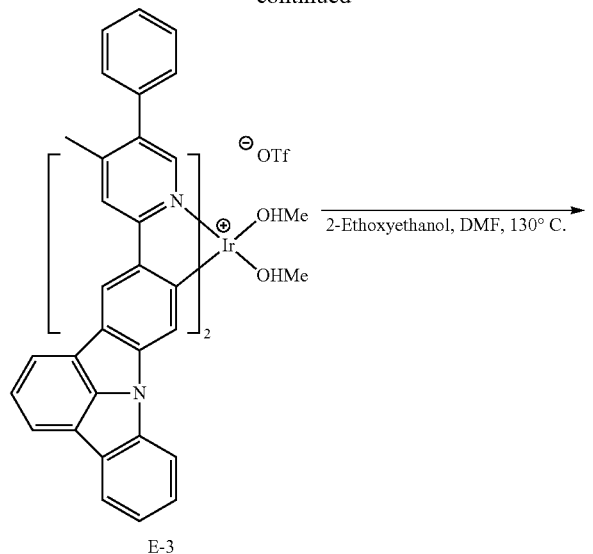

E-3

140

Synthesis Example 14: Synthesis of Compound 148

[Reaction Formula 14]

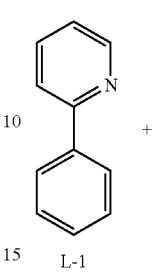

L-1

+

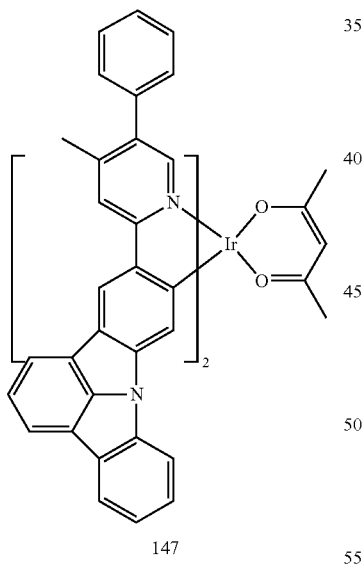

147

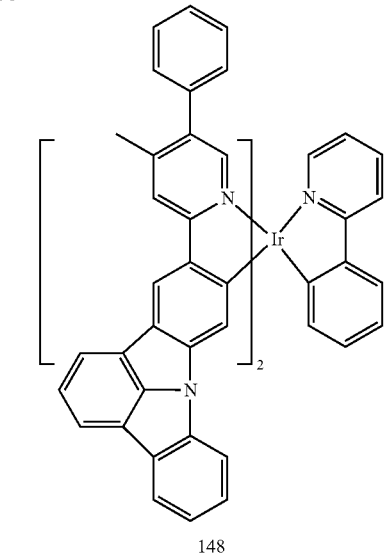

148

Compound L-2 (0.35 g, 3.5 mmol), the Intermediate E-3 (3.36 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 147 (2.59 g, yield: 78%).

Compound L-1 (0.54 g, 3.5 mmol), the Intermediate E-3 (3.36 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 148 (2.96 g, yield: 85%).

Example 1 (Ex. 1): Fabrication of OLED

An organic light emitting diode was fabricated applying Compound 1 obtained in Synthesis Example 1 as dopant into an emitting material layer (EML). A glass substrate onto which ITO (100 nm) was coated as a thin film was washed and ultrasonically cleaned by solvent such as isopropyl alcohol, acetone and dried at 100° C. oven. The substrate was transferred to a vacuum chamber for depositing emissive layer. Subsequently, an emissive layer and a cathode were deposited by evaporation from a heating boat under about 5-7 $10^{-7}$ Torr with setting deposition rate of 1 Å/s as the following order:

A hole injection layer (HIL) (following HI-1 (NPNPB), 60 nm thickness); a hole transport layer (HTL) (NPB, 80 nm thickness), an EML (Host (CBP, 95 wt %), Dopant (Compound 1, 5 wt %), 30 nm); an ETL-EIL (following ET-1 (2-[4-(9,10-Di-2-naphthalenyl-2-anthracenyl)phenyl]-1-phenyl-1H-benzimidazole, ZADN, 50 wt %), Liq (50 wt %), 30 nm); and a cathode (Al, 100 nm thickness).

And then, capping layer (CPL) was deposited over the cathode and the device was encapsulated by glass. After deposition of emissive layer and the cathode, the OLED was transferred from the deposition chamber to a dry box for film formation, followed by encapsulation using UV-curable epoxy and moisture getter. The HIL material (HI-1), the HTL material (NPB), the Host in the EML and the ETL material (CBP and ET-1, respectively) are Illustrated in the following:

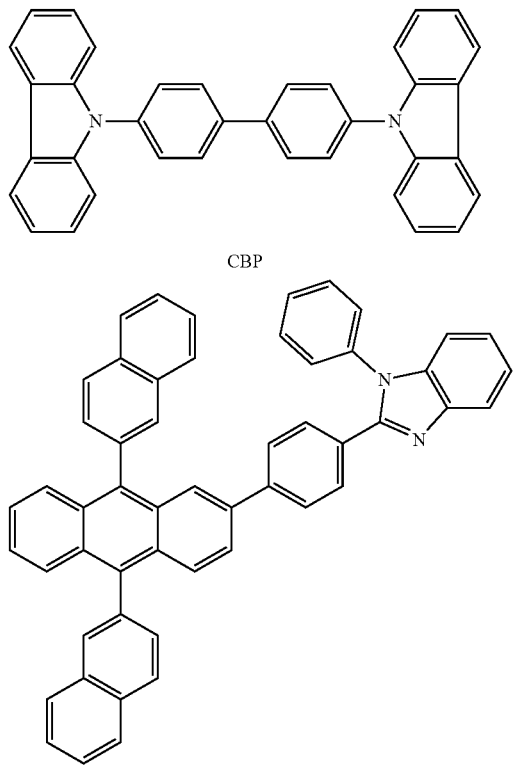

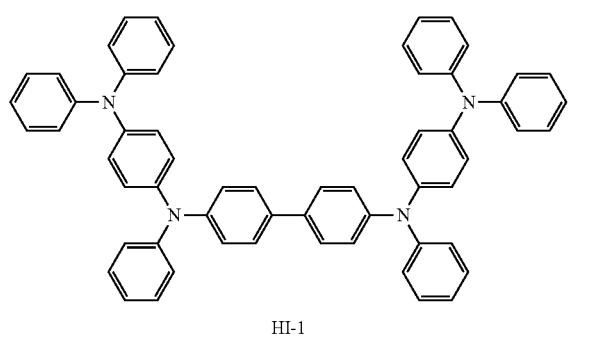

HI-1

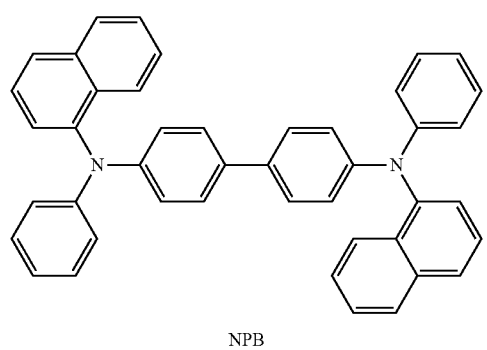

NPB

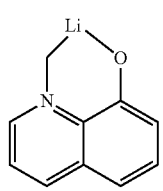

Liq

Examples 2-12 (Ex. 2-12): Fabrication of OLEDs

An OLED was fabricated using the same procedure and the same material as in Example 1, except that Compound 2 (Ex. 2), Compound 16 (Ex. 3), Compound 17 (Ex. 4), Compound 27 (Ex. 5), Compound 32 (Ex. 6), Compound 34 (Ex. 7) and Compound 35 (Ex. 8), respectively, were used as the dopant in the EML instead of Compound 1.

Comparative Example 1-7 (Ref. 1-7): Fabrication of OLEDs

An OLED was fabricated using the same procedure and the same material as in Example 1, except that the following Ref-1 (Ref. 1), Ref-2 (Ref. 2), Ref-3 (Ref. 3), Ref-4 (Ref. 4), Ref-5 (Ref. 5), Ref-6 (Ref. 6) and Ref. 7 (Ref. 7), respectively, were used as the dopant in the EML instead of Compound 1.

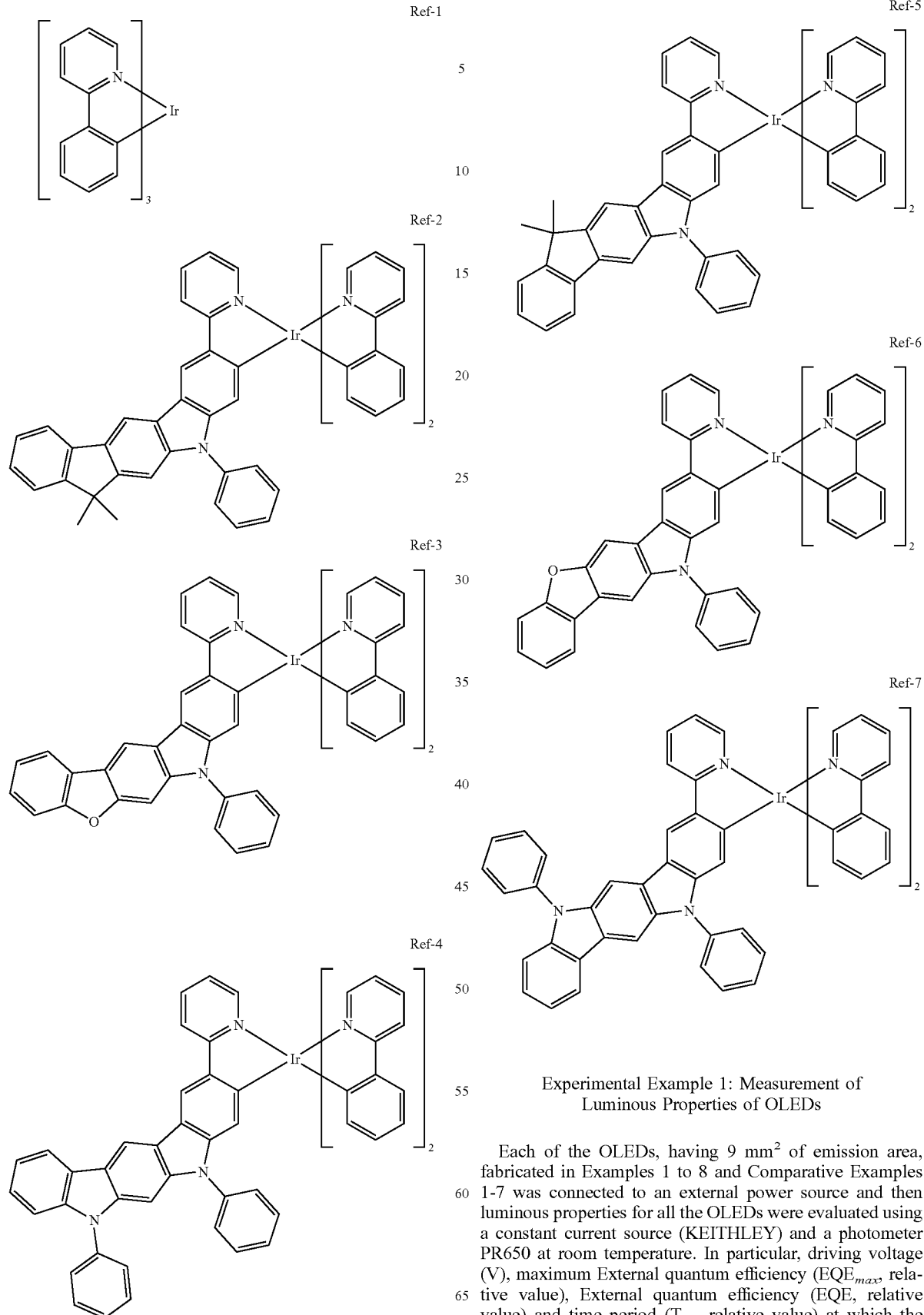

Experimental Example 1: Measurement of Luminous Properties of OLEDs

Each of the OLEDs, having 9 mm² of emission area, fabricated in Examples 1 to 8 and Comparative Examples 1-7 was connected to an external power source and then luminous properties for all the OLEDs were evaluated using a constant current source (KEITHLEY) and a photometer PR650 at room temperature. In particular, driving voltage (V), maximum External quantum efficiency ($EQE_{max}$, relative value), External quantum efficiency (EQE, relative value) and time period ($T_{95}$, relative value) at which the luminance was reduced to 95% from initial luminance was measured at a current density 10 mA/cm². The measurement results are indicated in the following Table 1.

TABLE 1

Luminous Properties of OLED

| Sample | Dopant | Voltage (V) | $EQE_{max}$ (%, relative) | EQE (%, relative) | $T_{95}$ (%, relative) |
|---|---|---|---|---|---|
| Ref. 1 | Ref-1 | 4.25 | 100 | 100 | 100 |
| Ref. 2 | Ref-2 | 4.42 | 105 | 103 | 98 |
| Ref. 3 | Ref-3 | 4.49 | 106 | 108 | 91 |
| Ref. 4 | Ref-4 | 4.44 | 109 | 108 | 91 |
| Ref. 5 | Ref-5 | 4.45 | 101 | 100 | 97 |
| Ref. 6 | Ref-6 | 4.54 | 108 | 101 | 95 |
| Ref. 7 | Ref-7 | 4.48 | 111 | 107 | 86 |
| Ex. 1 | 1 | 4.26 | 122 | 110 | 132 |
| Ex. 2 | 2 | 4.23 | 123 | 111 | 125 |
| Ex. 3 | 16 | 4.22 | 115 | 105 | 122 |
| Ex. 4 | 17 | 4.25 | 127 | 116 | 134 |
| Ex. 5 | 27 | 4.21 | 129 | 116 | 126 |
| Ex. 6 | 32 | 4.28 | 121 | 110 | 116 |
| Ex. 7 | 34 | 4.26 | 116 | 108 | 125 |
| Ex. 8 | 35 | 4.25 | 122 | 114 | 122 |

As indicated in Table 1, the OLED fabricated in Comparative Examples, the OLED into which the organic metal compound in accordance with the present disclosure as the dopant showed identical or a little bit reduced driving voltage, and improved its $EQE_{max}$, EQE and $T_{95}$ significantly.

Examples 9-14 (Ex. 9-14): Fabrication of OLEDs

An OLED was fabricated using the same procedure and the same material as in Example 1, except that Compound 136 (Ex. 9), Compound 137 (Ex. 10), Compound 141 (Ex. 11), Compound 142 (Ex. 12), Compound 147 (Ex. 13) and Compound 148 (Ex. 14), respectively, were used as the dopant in the EML instead of Compound 1.

Comparative Example 8-11 (Ref. 8-11): Fabrication of OLEDs

An OLED was fabricated using the same procedure and the same material as in Example 1, except that the following Ref-8 (Ref. 8), Ref-9 (Ref. 9), Ref-10 (Ref. 10) and Ref. 11 (Ref. 11), respectively, were used as the dopant in the EML instead of Compound 1.

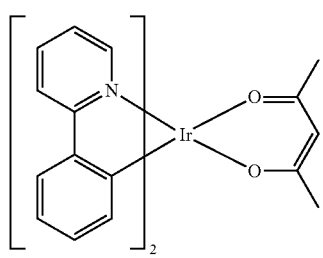

Ref-8

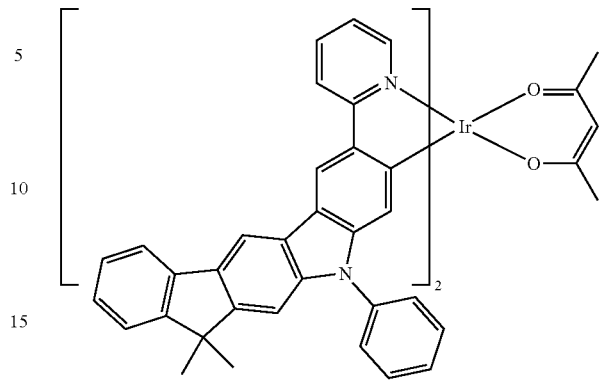

Ref-9

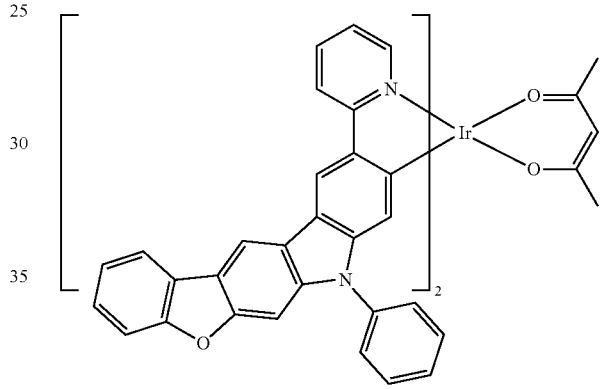

Ref-10

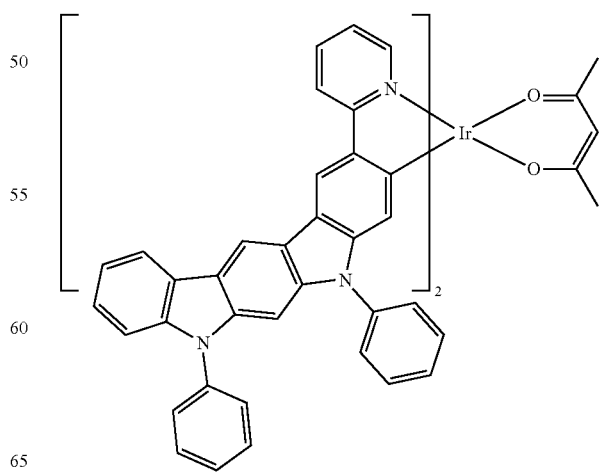

Ref-11

Experimental Example 2: Measurement of Luminous Properties of OLEDs

Luminous properties for each of the OLEDs fabricated in Examples 9 to 12 and Comparative Examples 8-11 were measured using the same procedure as Experimental Example 1. The measurement results are indicated in the following Table 2.

TABLE 2

| | | | Luminous Properties of OLED | | |
|---|---|---|---|---|---|
| Sample | Dopant | Voltage (V) | $EQE_{max}$ (%, relative) | EQE (%, relative) | $T_{95}$ (%, relative) |
| Ref. 8 | Ref-8 | 4.25 | 100 | 100 | 100 |
| Ref. 9 | Ref-9 | 4.54 | 108 | 107 | 80 |
| Ref. 10 | Ref-10 | 4.55 | 103 | 100 | 84 |
| Ref. 11 | Ref-11 | 4.55 | 104 | 105 | 79 |
| Ex. 9 | 136 | 4.25 | 106 | 105 | 135 |
| Ex. 10 | 137 | 4.26 | 123 | 111 | 125 |
| Ex. 11 | 141 | 4.25 | 111 | 110 | 133 |
| Ex. 12 | 142 | 4.23 | 125 | 115 | 135 |
| Ex. 13 | 147 | 4.24 | 116 | 109 | 139 |
| Ex. 14 | 148 | 4.28 | 109 | 108 | 128 |

As indicated in Table 2, the OLED fabricated in Comparative Examples, the OLED into which the organic metal compound in accordance with the present disclosure as the dopant showed identical or a little bit reduced driving voltage, and improved its $EQE_{max}$, EQE and $T_{95}$ significantly.

Taking the results in Tables 1 and 2 into account, it is possible to realize an OLED with lower driving voltage as well as excellent luminous efficiency and luminous lifespan by introducing the organic metal compound into an emissive layer.

It will be apparent to those skilled in the art that various modifications and variations can be made in the present disclosure without departing from the scope of the invention. Thus, it is intended that the present disclosure cover the modifications and variations of the present disclosure provided they come within the scope of the appended claims.

What is claimed is:

1. An organic light emitting device comprising:
a substrate; and
a light emitting diode on the substrate and comprising:
a first electrode;
a second electrode facing the first electrode; and
an emissive layer disposed between the first and second electrodes and including at least one emitting material layer,
wherein the at least one emitting material layer includes an organic metal compound of compound 147 below:

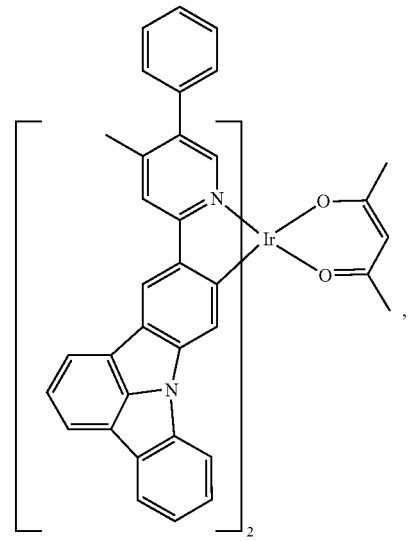

wherein the at least one emitting material layer includes a host and a dopant, and wherein the dopant includes the organic metal compound, and
wherein the host is selected from 4,4'-bis(N-carbazolyl)-1,1'-biphenyl (CBP), 3,3'-bis(N-carbazolyl)-1,1'-biphenyl (mCBP), 1,3-bis(carbazol-9-yl)benzene (mCP), and 4,4'-Bis(carbazole-9-yl)-2,2'-dimethylbiphenyl (CDBP).

2. The organic light emitting device of claim 1, wherein the at least one emitting material layer includes a first emitting material layer and a second emitting material layer;
the emissive layer includes:
a first emitting part disposed between the first and second electrodes and including the first emitting material layer; and
a second emitting part disposed between the first emitting part and the second electrode and including the second emitting material layer; and
a first charge generation layer disposed between the first and second emitting parts, and
at least one of the first emitting material layer or the second emitting material layers includes the organic metal compound.

3. The organic light emitting device of claim 2, wherein the second emitting material layer includes:
a lower emitting material layer disposed between the first charge generation layer and the second electrode; and
an upper emitting material layer disposed between the lower emitting material layer and the second electrode, and
wherein one of the lower emitting material layer or the upper emitting material layer includes the organic metal compound.

4. The organic light emitting device of claim 2, wherein the emissive layer further includes:
a third emitting part disposed between the second emitting part and the second electrode, and including a third emitting material layer; and
a second charge generation layer disposed between the second and third emitting parts.

5. The organic light emitting device of claim 1, wherein the host is selected from 4,4'-bis(N-carbazolyl)-1,1'-biphenyl (CBP), 3,3'-bis(N-carbazolyl)-1,1'-biphenyl (mCBP) and 4,4'-Bis(carbazole-9-yl)-2,2'-dimethylbiphenyl (CDBP).

6. The organic light emitting device of claim 1, wherein the host comprises 4,4'-bis(N-carbazolyl)-1,1'-biphenyl (CBP).

* * * * *